(12) United States Patent
Humpston

(10) Patent No.: US 7,129,576 B2
(45) Date of Patent: Oct. 31, 2006

(54) STRUCTURE AND METHOD OF MAKING CAPPED CHIPS INCLUDING VERTICAL INTERCONNECTS HAVING STUD BUMPS ENGAGED TO SURFACES OF SAID CAPS

(75) Inventor: Giles Humpston, San Jose, CA (US)

(73) Assignee: Tessera, Inc., San Jose, CA (US)

(*) Notice: Subject to any disclaimer, the term of this patent is extended or adjusted under 35 U.S.C. 154(b) by 0 days.

(21) Appl. No.: 10/949,693

(22) Filed: Sep. 24, 2004

(65) Prior Publication Data

US 2005/0067688 A1 Mar. 31, 2005

Related U.S. Application Data

(63) Continuation-in-part of application No. 10/928,839, filed on Aug. 27, 2004.

(60) Provisional application No. 60/574,523, filed on May 26, 2004, provisional application No. 60/568,041, filed on May 4, 2004, provisional application No. 60/532,341, filed on Dec. 23, 2003, provisional application No. 60/515,615, filed on Oct. 29, 2003, provisional application No. 60/506,500, filed on Sep. 26, 2003.

(51) Int. Cl.
*H01L 23/12* (2006.01)

(52) U.S. Cl. ............................. 257/704; 257/E23.129

(58) Field of Classification Search ................ 257/698, 257/701, 704, 702, 735–738, 774, 784, 791, 257/788–789, E23.129, 690–693, 775, 779; 438/125

See application file for complete search history.

(56) References Cited

U.S. PATENT DOCUMENTS

| | | | |
|---|---|---|---|
| 4,825,284 A | 4/1989 | Soga et al. | |
| 4,984,358 A | 1/1991 | Nelson | |
| 5,070,297 A | 12/1991 | Kwon et al. | |
| 5,072,520 A | 12/1991 | Nelson | |
| 5,347,159 A | 9/1994 | Khandros et al. | |
| 5,448,014 A | 9/1995 | Kong et al. | |
| 5,504,035 A | 4/1996 | Rostoker et al. | |
| 5,578,874 A | 11/1996 | Kurogi et al. | |
| 5,610,431 A | 3/1997 | Martin | |

(Continued)

FOREIGN PATENT DOCUMENTS

EP 1 071 126 A 1/2001

(Continued)

OTHER PUBLICATIONS

U.S. Appl. No. 10/077,388, filed Feb. 15, 2002, assigned to Tessera, Inc.

*Primary Examiner*—B. William Baumeister
*Assistant Examiner*—Dana Farahani
(74) *Attorney, Agent, or Firm*—Lerner,David,Littenberg,Krumholz & Mentlik, LLP

(57) ABSTRACT

A capped chip is provided which includes a chip and a cap member, the chip having a front surface and a plurality of bond pads exposed at the front surface, the cap member having a bottom surface facing the front surface of the chip and having a top surface opposite the front surface. A plurality of through holes extend from the bottom surface of the cap member to the top surface. The capped chip assembly further includes a plurality of metallic interconnects extending from the bond pads at least partially through the through holes, the metallic interconnects including stud bumps joined to the bond pads, the stud bumps contacting and engaging at least one of (i) the top surface of the cap member surrounding the through holes and (ii) inner surfaces of the through holes.

10 Claims, 40 Drawing Sheets

U.S. PATENT DOCUMENTS

| | | | |
|---|---|---|---|
| 5,705,858 A | 1/1998 | Tsukamoto | |
| 5,872,697 A * | 2/1999 | Christensen et al. | 361/313 |
| 5,952,712 A | 9/1999 | Ikuina et al. | |
| 5,965,933 A | 10/1999 | Young et al. | |
| 6,121,676 A | 9/2000 | Solberg | |
| 6,140,144 A | 10/2000 | Najafi et al. | |
| 6,225,688 B1 | 5/2001 | Kim et al. | |
| 6,261,945 B1 | 7/2001 | Nye, III et al. | |
| 6,279,227 B1 | 8/2001 | Khandros et al. | |
| 6,326,697 B1 | 12/2001 | Farnworth | |
| 6,342,406 B1 | 1/2002 | Glenn et al. | |
| 6,373,130 B1 | 4/2002 | Salaville | |
| 6,376,279 B1 | 4/2002 | Kwon et al. | |
| 6,396,470 B1 * | 5/2002 | Zhang et al. | 345/87 |
| 6,420,208 B1 | 7/2002 | Pozder et al. | |
| 6,429,511 B1 | 8/2002 | Ruby et al. | |
| 6,498,381 B1 | 12/2002 | Halahan et al. | |
| 6,583,444 B1 | 6/2003 | Fjelstad | |
| 6,596,634 B1 * | 7/2003 | Umetsu et al. | 438/666 |
| 6,627,864 B1 | 9/2003 | Glenn et al. | |
| 6,627,985 B1 | 9/2003 | Huppenthal et al. | |
| 6,627,998 B1 | 9/2003 | Caletka et al. | |
| 6,646,289 B1 | 11/2003 | Badehi | |
| 6,674,159 B1 | 1/2004 | Peterson et al. | |
| 6,693,361 B1 | 2/2004 | Siniaguine et al. | |
| 6,699,730 B1 | 3/2004 | Kim et al. | |
| 6,717,254 B1 | 4/2004 | Siniaguine | |
| 6,753,205 B1 | 6/2004 | Halahan | |
| 6,787,916 B1 | 9/2004 | Halahan | |
| 6,849,916 B1 | 2/2005 | Glenn et al. | |
| 2002/0089835 A1 | 7/2002 | Simmons | |
| 2002/0090803 A1 | 7/2002 | Salaville | |
| 2002/0102004 A1 | 8/2002 | Minervini | |
| 2003/0025204 A1 | 2/2003 | Sakai | |
| 2003/0052404 A1 | 3/2003 | Thomas | |
| 2003/0067073 A1 | 4/2003 | Akram et al. | |
| 2003/0133588 A1 | 7/2003 | Pedersen | |
| 2003/0151139 A1 | 8/2003 | Kimura | |
| 2003/0159276 A1 | 8/2003 | Wakefield | |
| 2003/0168725 A1 | 9/2003 | Warner et al. | |
| 2004/0007774 A1 | 1/2004 | Crane, Jr. et al. | |
| 2004/0099938 A1 | 5/2004 | Kang et al. | |
| 2004/0104261 A1 | 6/2004 | Sterrett et al. | |
| 2004/0104470 A1 | 6/2004 | Bang et al. | |
| 2004/0115866 A1 | 6/2004 | Bang et al. | |
| 2004/0145054 A1 | 7/2004 | Bang et al. | |
| 2004/0238931 A1 | 12/2004 | Haba et al. | |
| 2004/0238934 A1 | 12/2004 | Warner et al. | |
| 2005/0017348 A1 | 1/2005 | Haba et al. | |
| 2005/0067681 A1 | 3/2005 | DeVilleneuve et al. | |
| 2005/0067688 A1 | 3/2005 | Humpston | |
| 2005/0082653 A1 | 4/2005 | McWilliams et al. | |
| 2005/0082654 A1 | 4/2005 | Humpston et al. | |
| 2005/0085016 A1 | 4/2005 | McWilliams et al. | |
| 2005/0087861 A1 | 4/2005 | Burtzlaff et al. | |
| 2005/0095835 A1 | 5/2005 | Humpston et al. | |
| 2005/0116344 A1 | 6/2005 | Humpston | |

FOREIGN PATENT DOCUMENTS

| | | |
|---|---|---|
| JP | 08-213874 A | 8/1996 |
| WO | WO-02/058233 A | 7/2002 |
| WO | WO-04/017399 | 2/2004 |
| WO | WO-04/023546 | 3/2004 |
| WO | WO-04/025699 | 3/2004 |

* cited by examiner

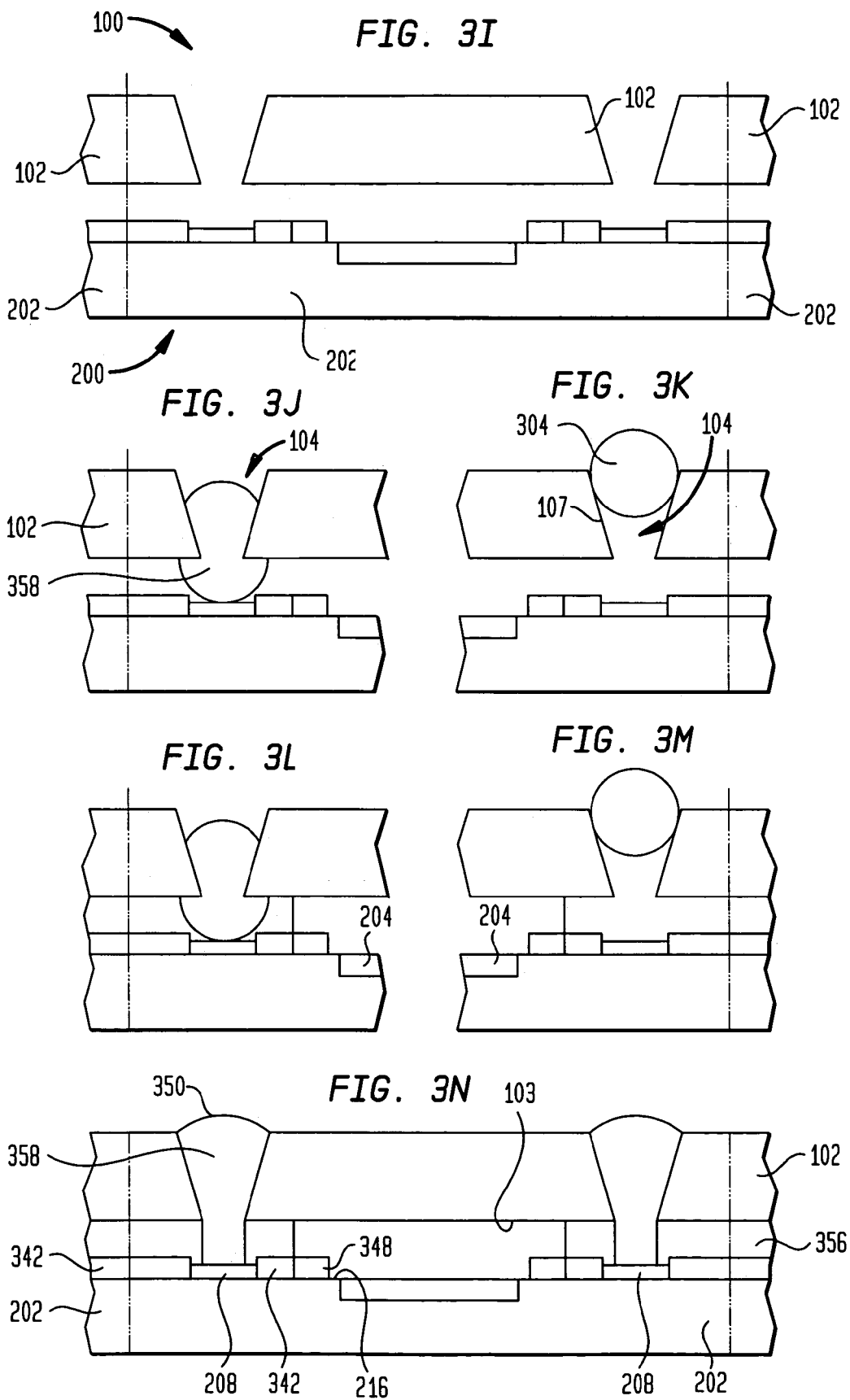

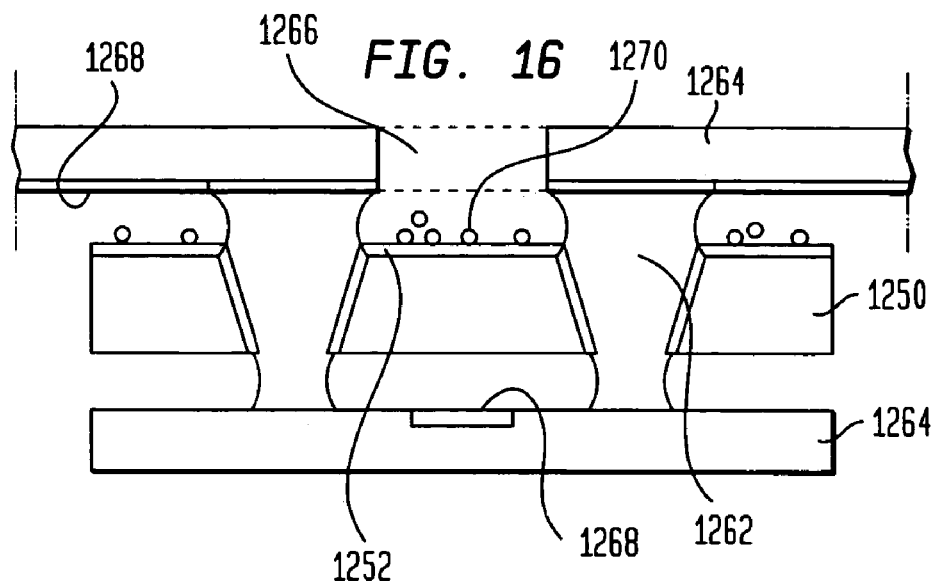
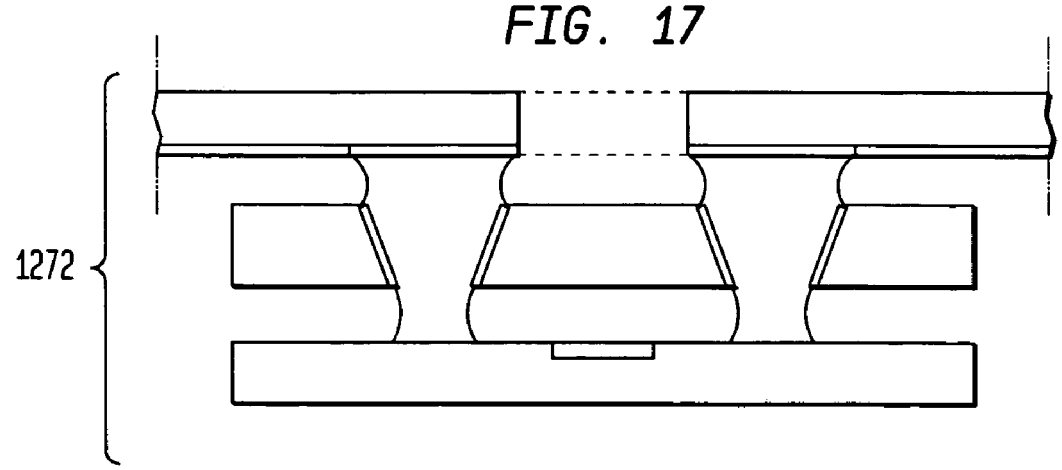

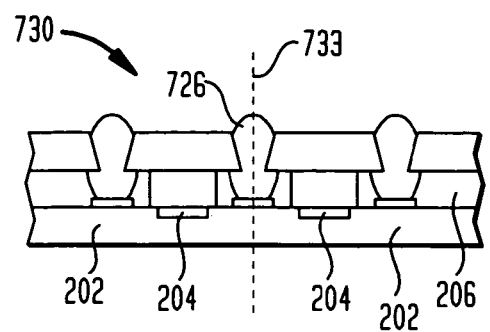
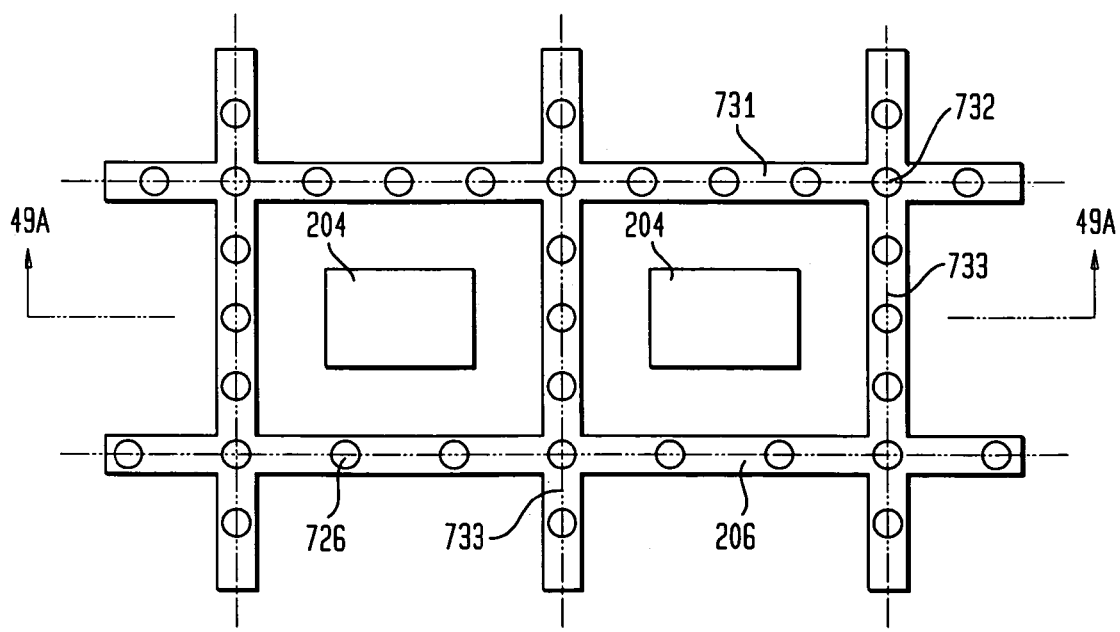

STRUCTURE AND METHOD OF MAKING CAPPED CHIPS INCLUDING VERTICAL INTERCONNECTS HAVING STUD BUMPS ENGAGED TO SURFACES OF SAID CAPS

This application claims the benefit of the filing dates of U.S. Provisional Patent Application Nos. 60/506,500 filed Sep. 26, 2003, 60/515,615 filed Oct. 29, 2003, 60/532,341 filed Dec. 23, 2003, 60/568,041 filed May 4, 2004, 60/574,523 filed May 26, 2004, and is a continuation-in-part of U.S. patent application Ser. No. 10/928,839, filed Aug. 27, 2004 entitled PACKAGE HAVING INTEGRAL LENS AND WAFER SCALE FABRICATION METHOD THEREFOR, on which Catherine De Villeneuve, Giles Humpston, and David B. Tuckerman are named inventors, the disclosures of all such applications being hereby incorporated herein by reference.

BACKGROUND OF THE INVENTION

The present invention relates to microelectronic packaging. Microelectronic chips typically are thin, flat bodies with oppositely facing, generally planar front and rear surfaces and with edges extending between these surfaces. Chips generally have contacts on the front surface, which are electrically connected to the circuits within the chip. Certain chips require a protective element, referred to herein as a cap or lid, over all or part of the front surface. For example, chips referred to as surface acoustic wave or "SAW" chips incorporate acoustically-active regions on their front surfaces, which must be protected from physical and chemical damage by a cap. Microelectromechanical or "MEMS" chips include microscopic electromechanical devices, e.g., acoustic transducers such as microphones, which must be covered by a cap. The caps used for MEMS and SAW chips must be spaced from the front surface of the chip to an open gas-filled or vacuum void beneath the cap in the active-area, so that the cap does not touch the acoustical or mechanical elements. Certain electro-optical chips such as optical sensing chips and light-emitting chips have photosensitive elements which also must be protected by a lid. Voltage controlled oscillators (VCOs) sometimes also require a cap to be placed over the active area.

Miniature SAW devices can be made in the form of a wafer formed from or incorporating an acoustically active material such as lithium niobate or lithium tantalate material. The wafer is treated to form a large number of SAW devices, and typically also is provided with electrically conductive contacts used to make electrical connections between the SAW device and other circuit elements. After such treatment, the wafer is severed to provide individual devices. SAW devices fabricated in wafer form can be provided with caps while still in wafer form, prior to severing. For example, as disclosed in U.S. Pat. No. 6,429,511 a cover wafer formed from a material such as silicon can be treated to form a large number of hollow projections and then bonded to the top surface of the active material wafer, with the hollow projections facing toward the active wafer. After bonding, the cover wafer is polished to remove the material of the cover wafer down to the projections. This leaves the projections in place as caps on the active material wafer, and thus forms a composite wafer with the active region of each SAW device covered by a cap.

Such a composite wafer can be severed to form individual units. The units obtained by severing such a wafer can be mounted on a substrate such as a chip carrier or circuit panel and electrically connected to conductors on the substrate by wire-bonding to the contacts on the active wafer after mounting, but this requires that the caps have holes of a size sufficient to accommodate the wire bonding process. This increases the area of the active wafer required to form each unit, requires additional operations and results in an assembly considerably larger than the unit itself.

In another alternative disclosed by the '511 patent, terminals can be formed on the top surfaces of the caps and electrically connected to the contacts on the active wafer prior to severance as, for example, by metallic vias formed in the cover wafer prior to assembly. However, formation of terminals on the caps and vias for-connecting the terminals to the contacts on the active wafer requires a relatively complex series of steps.

Similar problems occur in providing terminals for MEMS devices. For these and other reasons, further improvements in processes and structures for packaging SAW, MEMS, electro-optical and other capped devices would be desirable.

SUMMARY OF THE INVENTION

As used herein in relation to a cap and cap wafer and a lid and lid wafer, the term "top surface" refers to an outer surface of the cap, and the term "bottom surface" refers to an inner surface of the cap, the inner and outer surfaces of the cap relating to the form in which the cap is joined to the chip. Stated another way, the outer surface of the cap faces away from the front, i.e., the contact-bearing surface of the chip, while the inner surface of the cap faces towards the front or contact-bearing surface of the chip. The outer surface of the cap is referred to as the top surface, and the inner surface of the cap is referred to as the bottom surface, even if the capped chip structure including both chip and cap is turned over and mounted, such that the top surface faces downwardly and is joined to another article, such as a printed circuit panel.

According to an aspect of the invention, a capped chip is provided which includes a chip having an upwardly facing front surface and a plurality of bond pads exposed in a bond pad region at the front surface. A cap member having a top surface, a bottom surface opposite the top surface, and a plurality of through holes extending between the top and bottom surfaces, is mounted to the chip such that the bottom surface faces the front surface of the chip and is spaced therefrom to define a void. A plurality of solid electrically conductive interconnects extend from the bond pads at least partially through the through holes to form seals extending across the through holes.

An assembly including a capped chip according to a preferred aspect of the invention further includes a circuit panel having a plurality of terminals, wherein the interconnects are joined to the terminals of the circuit panel.

According to a particular preferred aspect of the invention, the interconnects may include a fusible conductive material joined to the bond pads. Wettable regions are desirably provided on sidewalls of the through holes, the fusible material contacting the wettable regions. The fusible conductive material may include at least one of a solder, tin, or eutectic composition, and the through holes have a substantially frusto-conical shape.

According to a particular preferred aspect of the invention, a seal disposed between the bottom surface of the cap member and a portion of the front surface of the chip, the seal at least substantially enclosing the bond pad region and the void. The chip preferably includes an active area and the through holes are disposed between the seal and the active area such that the seal and the interconnects seal the active area within the void. In one embodiment, the interconnects include a fusible material and an attach temperature of a sealing material of the seal coincides with a reflowing temperature for the fusible material.

In an embodiment, the bottom surface of the cap member includes a stop, the stop being engaged with the front surface of the active chip to control a spacing between the cap member and the chip. A sealing material of the seal is preferably disposed in contact with the stop and with the front surface of the chip such that the cap member is sealed to the chip at the stop. Illustratively, the stop includes a knife-edge and the seal includes a material such as a thermoplastic, adhesive, low melting point glass, solder or eutectic composition. In one embodiment, the seal is diffusion bonded to at least one of the chip and the cap member.

In a particular embodiment, the seal includes spacing elements, such that the front surface of the chip and the bottom surface of the cap member are spaced by no less than a width of the spacing elements. The cap member preferably includes at least one material selected from the group consisting of ceramics, metals, glasses, and semiconductor materials. In a highly preferred embodiment, the cap member consists essentially of a material having a coefficient of thermal expansion (CTE) closely matched to a CTE of the chip. Such chip may include a surface acoustic wave (SAW) device exposed at the front surface and the cap member includes a material having a CTE, which is closely matched to a CTE of the SAW device. In a specific embodiment, the SAW device includes a component consisting essentially of lithium tantalate, and the cap member includes a layer of aluminum and a layer of aluminum oxide overlying the layer of aluminum. In such embodiment, the cap member may include a metal layer and an oxide layer overlying the metal layer, the oxide layer including an oxide of a metal of the metal layer, wherein the oxide layer lines the through holes. The material of the cap member may further include one or more nickel alloys.

Preferably, through holes of the cap are metallized with two or more layers of metal disposed on sidewalls thereof. The layers of metal desirably include a layer consisting essentially of titanium contacting the sidewall of the through hole, a layer consisting essentially of platinum contacting the titanium layer, and an exposed layer consisting essentially of gold contacting the platinum layer. Such metallization is a preferred example of a broader class of metallization schemes colloquially referred to as "under bump metallizations" ("UBMs"), a UBM typically being applied to form a bondable surface on a larger surface, prior to applying a molten fusible conductive material thereto, such as a solder mass.

According to another preferred aspect of the invention, the chip includes a rear surface opposite the front surface and peripheral edges extending between the front and rear surfaces, and the cap member includes peripheral edges disposed between the bottom surface and the top surface, wherein the chip further comprises an additional seal sealing at least the peripheral edges of the cap member to the peripheral edges of the chip.

According to yet another preferred aspect, the cap member includes a dielectric layer having an inner surface and an outer surface, a ground layer disposed on at least the inner outer surface and at least one trace extending along the outer surface from the interconnect.

In a particular embodiment, the interconnects of the capped chip include stud bumps in conductive communication with the bond pads, and the stud bumps extend at least partially through the through holes. Contacts at the top surface of the cap member are disposed in conductive communication with the stud bumps.

In one embodiment, some of the stud bumps have shoulders abutting the bottom surface of the cap member, whereby the spacing between the bottom surface and the cap member is determined by the shoulders.

In another particular embodiment of the invention, the through holes are tapered, becoming smaller in a direction from the top surface towards the bottom surface.

In a preferred embodiment, the interconnects include at least one conductive trace extending horizontally along the top surface of the cap member. The interconnects may further include one or more contacts in conductive communication with the at least one conductive trace.

According to another aspect of the invention, a capped chip is provided which includes a chip having a front surface, and a plurality of bond pads exposed at the front surface. The cap member has a top surface, a bottom surface opposite the top surface, and a plurality of through holes which extend between the top and bottom surfaces. The cap member is mounted to the chip such that the bottom surface faces the chip and is spaced therefrom to define a void. In such capped chip, a plurality of electrically conductive interconnects extend from the bond pads at least partially through the through holes. The interconnects including a flowable conductive material that extends at least partially through the through holes.

Preferably, the flowable conductive material extends from the bond pads through the holes. As in the above aspect of the invention, a seal preferably extends between the chip and the cap member, the seal surrounding at least some or all of the interconnects, and the flowable conductive material sealing the through holes. In one embodiment, the seal includes a flowable conductive material of the same composition as the interconnects.

According to a preferred aspect of the invention, the flowable conductive material wets portions of the cap member surrounding the through holes. In a particular embodiment, the cap member defines walls extending from the top surface to the bottom surface, the walls surrounding each of the through holes and the flowable conductive material wets the walls. When the cap member includes a structural material not wettable by the flowable conductive material, the cap may include liners formed from a material wettable by the flowable conductive material covering the walls. In a preferred embodiment, the flowable conductive material is a solder.

According to yet another aspect of the invention, a method of forming capped chips is provided which includes assembling a lid member to a chip member so that a bottom surface of the lid member faces downwardly toward a front surface of the chip member and a top surface of the lid member faces upwardly away from the chip member. Through-holes extending between the top and bottom surfaces of the lid member are aligned with electrically conductive features of the chip member and so that the bottom surface of the lid member is spaced apart from the front surface of the chip member in at least some regions including the aligned through holes and conductive features. Electrical connections are formed which extend from the conductive features at least partially through the through holes. This is performed by providing a flowable conductive material at the through holes and causing the flowable conductive material to flow in the through holes.

According to particular aspect of the invention, the step of providing a flowable conductive material includes introducing the flowable conductive material into the through holes from the top surface of the lid member. The step of causing the flowable conductive material to flow may include causing the flowable conductive material to flow downwardly in the through holes into contact with the electrically conductive features of the chip member. The electrically conductive features include features projecting upwardly from the front surface of the chip member into the through holes. The electrically conductive features can be spaced, for example, below the bottom surface of the lid member and the step of causing the flowable conductive material to flow includes forming menisci projecting downwardly from the bottom surfaces at the through holes so that the menisci contact the conductive features. In one embodiment, the step of causing the flowable material to flow includes causing the flowable material to wet walls bounding the through holes.

According to another aspect of the invention, a method of forming a capped chip having a plurality of metallic interconnects at least partially extending through a cap member is provided which includes aligning (i) a chip having a front surface and a plurality of bond pads exposed at the front surface; with (ii) a cap member having a horizontally extending top surface, a horizontally extending bottom surface, and a plurality of through holes extending between the top surface and the bottom surface, so that the through holes are aligned to the bond pads. The method further includes forming solder-wettable metallizations are formed on the cap member at least where the through holes meet the top surface and simultaneously forming solder-wettable metallizations overlying the bond pads of the chip, the solder-wettable metallizations overlying the bond pads, being formed in the self-aligned manner to the through holes. The solder-wettable metallizations of the through holes are bonded to the solder-wettable metallizations on the chip to form metallic interconnects extending from the bond pads at least partially through the through holes.

Preferably, the solder-wettable metallizations are formed by deposition, the aligned cap member functioning as an in situ mask during the deposition of the solder-wettable metallizations on the chip. Specifically, the chip may include a surface acoustic wave (SAW) device, wherein the bond pads are not wettable by solder prior to the solder-wettable metallizations being formed, e.g., such as when the bond pads of the chip have at least a surface film of aluminum. In one embodiment, the bonding step includes disposing solder balls on the solder-wettable metallizations of the cap member and heating the aligned cap member and the chip to cause solder of the solder balls to bond the solder-wettable metallizations of the cap member to the solder-wettable metallizations of the chip. In a particular embodiment, the bonding step is performed fluxlessly, i.e., without using a flux, such as may be performed in a nitrogen atmosphere.

According to an aspect of the invention, a method of making a chip assembly includes the steps of assembling (i) a capped chip including a chip, a cap overlying a front surface of the chip and a sacrificial layer overlying the cap with (ii) one or more further components. After the assembling step, the sacrificial layer is removed from the capped chip. Preferably, the assembling step includes bonding electrically-conductive features of the capped chip to at least one of the further components using an electrically-conductive bonding material.

Preferably, the electrically-conductive features of the capped chip include interconnections extending through the lid element. When that is the case, the method preferably further includes the steps of patterning the sacrificial layer and forming at least portions of the interconnections using the patterned sacrificial layer as a mask.

In another preferred embodiment, the method further includes a step of forming the capped chip by assembling a lid member and a chip member including a plurality of chips and then severing the lid member and chip member, the sacrificial layer being present on the cap member during the severing step.

According to another preferred aspect of the invention, a method is provided for making a plurality of capped chip assemblies. The method includes the steps of: (a) assembling a lid member and a chip member including a plurality of chips to one another so that the lid member overlies the chip member and a top surface of the lid member faces away from the chip member; (b) severing the lid member and chip member to form a plurality of individual units each including one or more of the chips and a portion of the lid member; (c) providing a sacrificial layer overlying the top surface of the lid member prior to the severing step; and (d) removing the sacrificial layer after the severing step.

In a preferred aspect of the invention, the cap includes a region which is at least partially optically transmissive. The sacrificial layer desirably includes a developed photoresist layer. The chip preferably includes at least one first bonding area, and the cap includes at least one second bonding area including a wettable region. Preferably, in such case, the assembling step includes bonding the first bonding area of the chip member to the second bonding area of the cap by a fusible material.

According to another aspect of the invention, a capped chip is provided which includes a chip having a front surface and a plurality of bond pads exposed at the front surface. A cap member having a bottom surface faces the front surface of the chip and has a top surface opposite the front surface. The cap member further has a plurality of through holes extending from the bottom surface to the top surface. In this aspect of the invention, at least portions of the through holes are tapered, becoming smaller in a direction from the bottom surface toward the top surface. A plurality of electrically conductive interconnects extend from the bond pads at least partially through the through holes.

According to a preferred aspect of the invention, the interconnects include fusible material joined to the bond pads. The fusible material may includes solder, tin and/or a eutectic composition, for example, or such other suitable fusible material. In a preferred embodiment, the through holes have substantially frusto-conical shapes. A sealing material is desirably disposed between the bottom surface of the cap member and a portion of the front surface of the chip. Preferably, an attach temperature of the sealing material coincides with a temperature for bonding the fusible material.

In one preferred aspect of the invention, a bottom surface of the cap member includes a downwardly protruding feature such as a knife edge. The sealing material is preferably disposed in contact with the protruding feature and with the front surface of the chip to seal the cap member to the chip. In particular embodiments, the sealing material includes a thermoplastic, an adhesive, a low melting point glass, a solder, and a eutectic composition. In a preferred embodiment, the sealing material is diffusion bonded to at least one of the chip and the cap member.

Preferably, the sealing material includes spacing elements, such that the front surface of the chip and the cap member are spaced by no less than a width of the spacing elements. In one embodiment, the bond pads are exposed at a bond pad region of the front surface, and the capped chip further includes a sealing material sealing the front surface to the bottom surface of the cap member, such that the sealing material at least substantially encloses the bond pad region.

In a particular embodiment, the cap member consists essentially of at least one material selected from the group consisting of ceramics, metals, glasses, and semiconductor materials. Preferably, the through holes of the cap are lined with two or more layers of metal disposed on the sidewalls. The layers of metal include, for example, a layer consisting essentially of titanium contacting the sidewalls of the through holes, a layer consisting essentially of platinum contacting the titanium layer, and an exposed layer consisting essentially of gold contacting the platinum layer.

In one embodiment, the chip has a rear surface opposite the front surface and peripheral edges extending between the front and rear surfaces. The cap member has peripheral edges disposed between the bottom surface and the top surface. In such embodiment, the chip preferably includes an additional seal sealing at least the peripheral edges of the cap member to the peripheral edges of the chip.

According to a particular aspect of the invention, an assembly is provided which further includes a circuit panel having a plurality of terminals, wherein the interconnects are joined to the terminals of the circuit panel.

According to another aspect of the invention, a capped chip is provided which includes a chip having a front surface, a cap member having a bottom surface facing the front surface of the chip and having a top surface opposite the front surface. The cap member further includes a plurality of through holes extending from the bottom surface to the top surface. A plurality of metallic interconnects including stud bumps are electrically connected to the chip and project upwardly from the front surface at least partially through the through holes.

According to such preferred aspect, the chip has bond pads exposed at the front surface and the stud bumps are joined to the bond pads and electrically connected to the chip through the bond pads. The stud bumps preferably extend at least to the top surface. The metallic interconnects may include annular solderable metallizations which surround the through holes on the top surface of the cap member and the capped chip preferably includes, solder masses joining the solderable metallizations to the stud bumps.

In a preferred embodiment, the stud bumps are sealed to the cap member.

In one embodiment, the through holes do not have solderable metallizations. In such case, in a particular embodiment, the stud bumps may be sealed by a conductive organic material. For instance, the stud bumps may be sealed by a nonconductive material and the stud bumps protrude through the nonconductive material, which is preferably an organic material. In a highly preferred aspect of such embodiment, masses of an electrically conductive bonding material can be joined to the stud bumps at positions external to the top surface.

In a particular embodiment, an assembly is provided including a capped chip and further including an interconnection element. The interconnection element includes pressure contacts pressed against the stud bumps to electrically interconnect the interconnection element to the capped chip.

In a particular embodiment, the metallic interconnects are coplanar with the top surface.

In one embodiment, the stud bumps are sealed to the through holes of the capped chip by the nonconductive material. The sidewalls of the through holes may be oriented at an angle of about 90 degrees to the top surface.

Alternatively, the through holes can be tapered, becoming smaller in a direction from the bottom surface towards a midpoint of a thickness of the cap member and becoming smaller in a direction from the top surface towards the midpoint of the thickness.

In other embodiments, the through holes are tapered and become smaller in a direction from the bottom surface towards the top surface; or alternatively, become smaller in a direction from the top surface towards the bottom surface.

Preferably, a sealing material is disposed between the bottom surface of the cap member and a portion of the front surface of the chip.

In one embodiment, an assembly is provided which includes a capped chip and further includes a circuit panel having a plurality of terminals, wherein the metallic interconnects are joined to the terminals of the circuit panel.

In a particular embodiment, the stud bumps include at least one metal selected from the group consisting of aluminum, gold, silver, platinum, and copper.

According to another aspect of the invention, a method is provided of making a capped chip assembly. Such method includes the steps of: (a) aligning a cap member with a chip member including one or more chips so that electrically conductive elements projecting from a front surface of the chip member extend into through-holes in the lid member and at least partially control location of the lid member relative to the chip member in one or more horizontal directions parallel to the front surface; and (b) forming interconnections extending through the lid member so that the interconnections include the conductive elements.

According to a particular aspect, the chip member includes contact pads and the electrically conductive elements include stud bumps projecting from the contact pads. The step of forming the stud bumps may be performed by wire bonding to the contact pads before the aligning step.

In another preferred embodiment, the chip member includes contact pads and the electrically conductive elements include balls. In such embodiment, the balls may be bonded to the contact pads before the aligning step.

In one embodiment, the electrically conductive elements hold the lid member above the chip member during the forming step so that there is a space between the lid member and the chip member at the conclusion of the forming step.

In a preferred embodiment, the chip member is a unitary wafer member including a plurality of chips, and the method further includes severing the lid member and the wafer member after the forming step so as to provide a plurality of individual units, each unit including one or more of the chips, a lid and one or more of the interconnections. In such case, the method may further include a step of forming a plurality of ring seals extending between the wafer member and the lid member so that each the ring seal surrounds one or more of the interconnections. In that case, the severing step is performed so that each the unit includes one or more of the ring seals.

According to another aspect of the invention, a method is provided of forming a capped chip having a plurality of metallic interconnects at least partially extending through a cap member, comprising: providing a chip having a front surface and a plurality of bond pads on the front surface; providing conductive balls on the bond pads; providing a cap member having a horizontally extending bottom surface, a horizontally extending top surface, and a plurality of metallized through holes extending from the bottom surface to the top surface; aligning the cap member and the chip such that the bottom surface faces the chip and the metallized through holes are aligned to the conductive balls; and bonding the conductive balls to the metallized through holes to form the metallic interconnects.

In a preferred embodiment, the conductive balls include a low melting point material, such that the conductive balls are reflowed when the conductive balls are bonded to the metallized through holes.

In some embodiments, at least some of the through holes are tapered, having a dimension which becomes smaller from the bottom surface toward the top surface. In one embodiment, the metallized through holes preferably have substantially frusto-conical shape and the conductive balls have substantially spherical faces, such that the aligning self-locates the substantially metallized through holes onto the substantially spherical faces of the conductive balls.

Preferably, the aligning self-locates the metallized through holes onto the conductive balls for variations in position having six degrees of freedom including first and second horizontal axes, a vertical axis, and rotation, pitch, and roll.

In a preferred, embodiment, the method further includes sealing the bottom surface of the cap member to the front surface of the chip. Preferably, such sealing is performed simultaneously with the reflowing. In a preferred aspect, the sealing includes depositing a sealing material onto at least one of the bottom surface of the cap member and the front surface of the chip, wherein the reflowing draws the cap member and the chip toward each other to complete the sealing. Preferably, an attach temperature of the sealing material coincides with a reflowing temperature of the conductive balls.

In one embodiment, the sealing is performed after the step of bonding.

In a preferred embodiment, the bottom surface of the cap member includes a downwardly protruding feature such as a knife edge, wherein a sealing material is disposed in contact with the feature and with the front surface of the chip to seal the cap member to the chip. In such case, a sealing material is preferably disposed in contact with the feature and with the front surface of the chip to seal the cap member to the chip.

In another preferred aspect of the invention, the conductive balls are placed on the bond pads in a fluxless manner, and the method further comprises joining the conductive balls to the bond pads prior to the step of bonding the conductive balls. In such case, the conductive balls preferably include solder balls.

In a preferred aspect, the chip includes a rear surface opposite the front surface and peripheral edges extending between the front and rear surfaces, and the cap member includes a top surface opposite the bottom surface and peripheral edges disposed between the bottom and top surfaces, the method further comprising depositing an additional sealing material onto the peripheral edges of the cap member and onto the sealing material.

In a preferred embodiment, the above method used for forming a capped chip can be further augmented include steps of aligning and joining the metallic interconnects to terminals disposed on a circuit panel to form an assembly.

According to another aspect of the invention, a method is provided of forming a plurality of capped chips each having a plurality of chip interconnections at least partially extending through a cap member of the capped chip. Such method includes:

providing an array of chips each having a front surface and a plurality of bond pads on the front surface, and providing conductive balls on the bond pads. A cap member is provided which includes a horizontally extending bottom surface, a horizontally extending top surface, and a plurality of metallized through holes extending from the bottom surface to the top surface. At least some of the through holes are tapered, becoming smaller in a direction from the bottom surface towards the top surface. The cap member and the array of chips are aligned such that the bottom surface faces the front surfaces of the chips and the metallized through holes are aligned to the conductive balls. The cap member is joined to the chips by bonding the conductive balls to the metallized through holes, wherein the bonded conductive balls form at least part of the chip interconnections.

In a preferred embodiment, the conductive balls include a low melting point material, and the bonding is performed by reflowing the conductive balls. Preferably, each of the chips of the array of chips is attached to at least one other of the chips, and the method further includes severing the joined chips.

According to another aspect of the invention, a capped chip is provided which includes: a chip having a front surface and a plurality of bond pads exposed at the front surface; a cap member having a bottom surface facing the front surface of the chip and having a top surface opposite the front surface, the cap member further having a plurality of through holes extending from the bottom surface to the top surface; and a plurality of metallic interconnects extending from the bond pads at least partially through the through holes, the metallic interconnects including stud bumps joined to the bond pads, the stud bumps contacting and engaging at least one of (i) the top surface of the cap member surrounding the through holes and (ii) inner surfaces of the through holes.

According to such aspect, in one embodiment, the through holes of the capped chip do not have solderable metallizations. In such case, the stud bumps are preferably sealed to the cap member, such as by a conductive organic material.

An assembly including a capped chip according to such aspect of the invention may further include an interconnection element, in which the interconnection element includes pressure contacts that are pressed against the stud bumps to electrically interconnect the interconnection element to the capped chip. Preferably, in such embodiment, the metallic interconnects are coplanar with the top surface.

In a particular embodiment, the sidewalls of the through holes are oriented at an angle of about 90 degrees to the top surface.

An assembly including a capped chip according to such embodiment may further include a circuit panel having a plurality of terminals, wherein the metallic interconnects are joined to the terminals of the circuit panel.

In a particular embodiment, the stud bumps consist essentially of at least one metal selected from the group consisting of gold and copper.

According to yet another aspect of the invention, a method of making a capped chip is provided which includes the steps of:

(a) assembling at least one chip with at least one cap so that stud bumps project from, the chip at least partially through through-holes in the cap; and (b) deforming the stud bumps into engagement with at least one of (i) a top surface of the cap surrounding the through-holes and (ii) walls of the through holes.

According to a preferred aspect, the deforming step is performed so that the stud bumps sealingly engage the through holes. In a preferred aspect, the method further includes a step of forming a metallurgical bond between the stud bumps and a metallic layer on the top surface or the walls.

According to yet another embodiment of the invention, a capped chip is provided, which includes: a chip having a front surface, one or more devices at the front surface, and a first annular solder-wettable metallization enclosing the one or more devices. The capped chip further includes a cap member having a top surface, a bottom surface opposite the top surface, one or more through holes extending between the top and bottom surfaces and a second annular solder-wettable metallization at the bottom surface in registration with the one or more through holes and the first annular solder-wettable metallization. A sealing medium including a fusible material is bonded to the first and second solder-wettable metallizations.

According to a preferred aspect of the invention, the sealing medium includes at least one material selected from the group consisting of solder, eutectic composition, and tin.

In one embodiment, the one or more through holes is sized to permit a flow of the sealing medium from the through hole onto the first and second annular solder-wettable metallizations. In such case, the one or more through holes is preferably tapered to become smaller in a direction from the top surface of the cap member towards the bottom surface. In one embodiment, the chip may further include a plurality of bond pads on the front surface enclosed by the first annular solder-wettable metallization, and a plurality of metallic interconnects extending from the bond pads at least partially through the cap member.

According to another aspect of the invention, a chip includes: (a) a body defining a front surface and one or more circuit elements on or within the body; (b) one or more bond pads exposed at the front surface in a bond pad region; and (c) a metallic ring exposed at the front surface, the ring substantially surrounding the bond pad region. In a preferred aspect of the invention, a unitary wafer includes a plurality of such chips.

According to yet another aspect of the invention, a method of making a-plurality of sealed assemblies is provided. Such method includes: (a) assembling a first element to a second element so that a bottom surface of the first element faces downwardly toward a front surface of the second element and a top surface of the first element faces upwardly away from the second element; and (b) forming ring seals surrounding regions of the front surface of the second element by introducing flowable material between the first element and the second-element from the top surface of the first element through openings in the first element.

According to yet another aspect of the invention, another method of making a plurality of capped chips is provided. Such method includes: (a) assembling a lid member to a chip member so that a bottom surface of the lid member faces downwardly toward a front surface of the chip member and a top surface of the lid member faces upwardly away from the chip member; and (b) forming ring seals surrounding regions of the front surface of the chip member by introducing flowable material between the lid member and the cap member from the top surface of the lid member through openings in the lid member.

In a preferred aspect of such method, at least one of the bottom surface of the lid member and the front surface of the chip member has one or more wettable regions forming at least a portion of one or more rings and one or more non-wettable regions enclosed by the one or more rings, and the step of forming the ring seals includes contacting the flowable material with the wettable regions.

According to such aspect of the invention, preferably the bottom surface of the lid member and the front surface of the chip member have the wettable and non-wettable regions, and the assembling step is performed so as to at least partially align the wettable regions with one another.

The method preferably includes an additional step of forming electrically conductive interconnections extending from the regions of the chip member surrounded by the ring seals through the lid member.

In a preferred embodiment, the flowable material is an electrically conductive material and the step of forming conductive interconnections includes forming the conductive interconnections using the same electrically conductive material.

In a particular preferred aspect, the method includes maintaining the lid member spaced above the chip member at least in the regions during the step of forming the ring seals.

According to another aspect of the invention, a packaged microelectronic device is provided, which includes: (a) a unit having a chip with an upwardly-facing front surface and a downwardly-facing rear surface, and a lid overlying at least a portion of the front surface of the chip, the lid having a top surface facing upwardly away from the chip and unit connections exposed at the top surface of the lid. At least some of the unit connections are electrically connected to the chip. The device further includes (b) a package structure including structure defining package terminals, of which at least some of the package terminals are electrically connected to the chip, such that the package structure, the unit or both define a downwardly-facing bottom surface of the package, the terminals of the package-structure being exposed at the bottom surface.

According to a preferred aspect of the invention, the rear surface of the chip defines a bottom plane and the package terminals have exposed surfaces disposed at or below the bottom plane.

Preferably, in one embodiment, at least some of the package terminals are disposed beneath the unit. In a particular embodiment, all of the package terminals are disposed beneath the unit.

According to a particular aspect, the unit connections have a unit connection pitch and the package terminals have a package terminal pitch greater than the unit connection pitch.

In a particular embodiment, the unit connections have a first layout in plan and the package terminals have a second layout in plan different from the first layout.

In one embodiment, the unit includes vertical interconnect structures extending from the chip to the unit connections, at least some of the package terminals being electrically connected to at least some of the vertical interconnect structures.

In a particular embodiment, at least some of the package terminals are electrically connected to at least some of the unit connections.

In one embodiment, the package structure includes an interposer extending outwardly beyond the unit, and having a downwardly-facing bottom surface, the terminals being exposed at the bottom surface of the interposer.

According to a particular preferred aspect, the device may further include traces on the interposer electrically connected to the unit connections and the terminals.

In a particular embodiment, the device includes masses including an electrically conductive bonding material, such as solder balls, connected to the terminals and projecting downwardly from the terminals.

According to one embodiment of the invention, the terminals of the device include posts projecting downwardly from the interposer. Preferably, such posts are integral with the traces.

In a preferred aspect of the invention, the structure includes a bottom dielectric element extending at or below the bottom plane, and the package terminals are carried on the bottom dielectric element.

In one embodiment, the structure further includes lead portions connected to the unit connections and extending downwardly from the unit connections to the bottom dielectric element.

In a particular embodiment, the structure includes a dielectric element having a bottom run extending at or below the bottom plane and having at least some of the package terminals thereon. Such dielectric element has a fold portion extending upwardly from the bottom run. Electrically conductive traces are connected to at least some of the package terminals and extend along the bottom run and the fold portion.

In one preferred aspect of the invention, the dielectric element includes a top run extending from the fold portion over the top face of the unit, and the traces extending along the top run.

In a particular embodiment of the invention, the package structure includes a lead frame, and the lead frame includes leads which extend to or below the bottom plane and define the package terminals. In such embodiment, the lead frame is preferably resiliently engaged with the unit.

In a particular embodiment, the package structure includes a vertically-extensive spacer and one or more conductive vias extending through the spacer. In such embodiment, the spacer can be such as to define a cavity and the unit is disposed within the cavity. The spacer preferably includes a plurality of dielectric layers superposed on one another, wherein the conductive vias extend through the dielectric layers so as to form vertically-extensive interconnects extending through the spacer.

An assembly including a packaged device according to a preferred aspect of the invention includes a mounting element having contact pads thereon, and an electrically conductive bonding material connecting the package terminals to the contact pads. In such assembly, at least one of the package structure and the bonding material provide mechanical compliance between the contact pads and the unit.

According to another aspect of the invention, a microelectronic unit is provided which includes: (a) a chip with an upwardly-facing front surface and a downwardly-facing rear surface. The chip has contacts exposed at the front surface and has bottom unit connections exposed at the rear surface. The microelectronic unit further includes (b) a lid overlying at least a portion of the front surface of the chip. The lid has a top surface facing upwardly away from the chip and top unit connections exposed at the top surface of the lid. At least some of the bottom unit connections of the chip are electrically connected to at least some of the top unit connections.

According to a preferred aspect of the invention, the chip includes vertically-extensive conductive elements which extend through the chip and interconnect at least some of the bottom unit connections with at least some of the contacts. The unit preferably further includes vertical interconnect structures which extend through the lid and connect at least some of the contacts with at least some of the top unit connections. In such manner, at least some of the bottom unit connections are electrically connected to at least some of the top unit connections by the conductive elements and the vertical interconnect structures.

In one embodiment according to this aspect of the invention, the chip and the lid each define vertically-extensive edges, and the unit includes traces which extend along at least one of the edges. At least some of the top and bottom unit connections are interconnected with one another by the traces.

In a particular embodiment, at least some of the traces include trace portions which extend between the chip and the lid. Preferably, the lid is sealed to the chip.

In one embodiment, at least a part of the bottom surface of the lid is spaced from the front surface of the chip so that the lid and the chip cooperatively define an interior space within the unit. In such case, the chip preferably includes one or more elements selected from the group consisting of microelectromechanical elements, acoustically active elements and optoelectronic elements.

According to another aspect of the invention, a microelectronic chip is provided which has front and rear surfaces, and an active element selected from the group consisting of microelectromechanical elements, electroacoustical elements and optoelectronic elements. In such aspect, the active element is exposed at the front surface, and bottom contacts are exposed at the rear surface.

A particular microelectronic unit according to a preferred aspect of the invention includes a chip and a lid covering the active element.

According to a particular preferred aspect of the invention, an assembly is provided which includes a microelectronic unit and a circuit panel having contact pads thereon, the unit being mounted on the circuit panel with the front surface facing upwardly away from the circuit panel and with the bottom contacts electrically connected to the contact pads.

According to yet another aspect of the invention, a microelectronic unit is provided, which includes (a) a chip having an upwardly-facing front surface, a downwardly-facing rear surface and one or more edges extending between the front and rear surfaces. Such chip further includes (b) a lid overlying at least a portion of the front surface of the chip, the lid having a top surface facing upwardly away from the chip, a bottom surface facing toward the chip and edges extending between the top and bottom surfaces. The unit also includes (c) edge unit connections exposed at one or more of the edges.

The microelectronic unit preferably includes vertical interconnect structures which are electrically connected to the chip and extend upwardly through the lid, of which at least some of the vertical interconnect structures are exposed at the one or more of the edges of the lid so that the exposed vertical interconnect structures define the edge unit connections.

In a preferred embodiment, the lid is sealed to the chip.

In one embodiment, at least a part of the bottom surface of the lid is spaced from the front surface of the chip so that the lid and the chip cooperatively define an interior space within the unit. In such case, the chip may include one or more elements selected from the group consisting of microelectromechanical elements, acoustically active elements and optoelectronic elements.

According to another aspect of the invention, a method is provided for making a microelectronic unit. Such method includes: (a) assembling a lid element with a wafer element including a plurality of chips so that a bottom surface of the lid element faces toward a front surface of the wafer element bearing contacts electrically connected to the chips. Such method further includes (b) providing vertical interconnect structures extending from the contacts upwardly through the lid element; and (c) severing the lid element and the wafer element along lines of severance so as to form individual units. At least some of the lines of severance extend through at least some of the vertical interconnect structures so that the at least some of the vertical interconnect structures are exposed at edges of at least some of the units.

According to yet another aspect of the invention, a method is provided for making a microelectronic unit. Such method includes: assembling a lid element with a wafer element including a plurality of chips so that a bottom surface of the lid element faces toward a front surface of the wafer element bearing contacts electrically connected to the chips. Vertical interconnect structures are provided which extend from the contacts upwardly through the lid element. Vertically-extensive vias are provided which extend at least partially through the lid element. Electrically conductive material in the vias is electrically connected to the vertical interconnect structures. Such method further includes severing the lid element and the wafer element along lines of severance so as to form individual units, wherein at least some of the lines of severance extend through at least some of the vias so that the conductive material in at least some of the vias is exposed at edges of at least some of the units.

According to another aspect of the invention, a method of making sealed microelectronic units is provided which includes providing a wafer element including a plurality of chips, wherein the chips of the wafer element includes device areas at the front surface. The method further includes aligning a lid element to the wafer element so that a bottom surface of the cap member faces toward a front surface of the wafer element. The lid element is bonded to the wafer element to provide a lidded wafer element. The lidded wafer element is then partially severed along lines of severance to at least partially define edges of individual microelectronic units. Thereafter, edges of the microelectronic units are sealed with an impermeable medium. The lidded element can thereafter be severed into the individual microelectronic units.

According to a preferred aspect of the invention, the chips of the wafer element include bond pads at the front surface and the impermeable medium is electrically conductive. In such aspect, the method further includes forming metallic interconnects extending from the bond pads to the top surface of the lid element. Lands are formed on the top surface in conductive communication with the metallic interconnects, the lands having at least portions including the impermeable medium, the portions being formed when the edges are sealed.

According a highly preferred aspect of the invention, the lands are preferably formed and the edges are sealed by forming a patterned photoresist layer over the top surface and the partially defined edges of the lidded wafer element. In such aspect, the impermeable medium is deposited to overlie the lidded wafer element and to overlie the patterned photoresist layer over the lidded wafer element. The patterned photoresist layer is thereafter removed, such that the deposited impermeable medium remains only where the impermeable medium does not overlie the patterned photoresist layer.

BRIEF DESCRIPTION OF THE DRAWINGS

FIGS. 12–17 are sectional views illustrating stages in a method of patterning and using a sacrificial coating on a cap element to provide a capped chip.

FIGS. 44–49B are sectional views illustrating methods of fabricating microelectronic units having lidded or capped chips, which have edge connections, and methods of mounting the units to circuit panels or other elements.

DETAILED DESCRIPTION

Figure 2A:
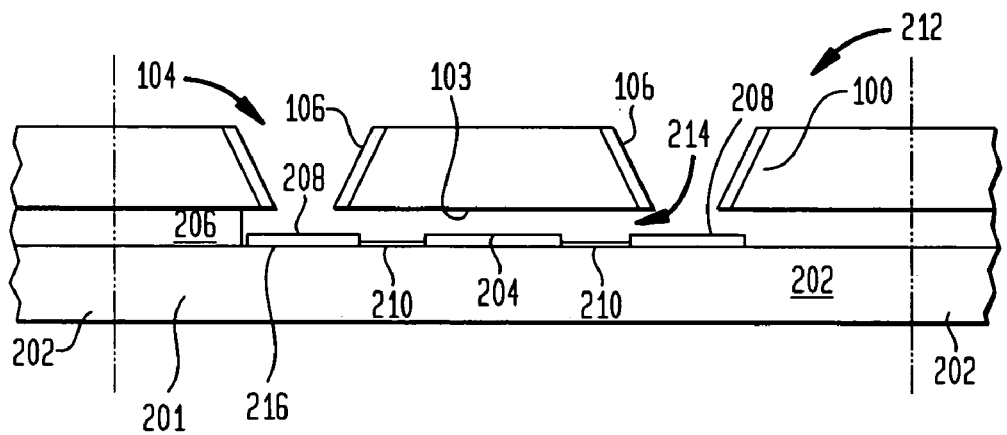
Figure 2B:
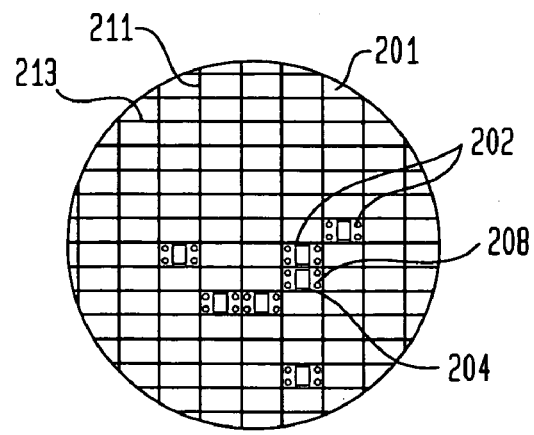
Figure 3A:
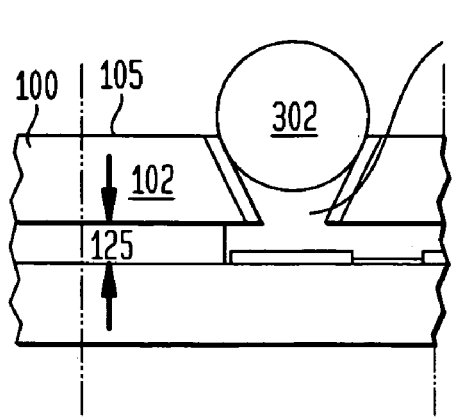
FIGS. 3E–3F are a sectional view and a plan view illustrating a capped chip according to another embodiment of the invention.
FIGS. 3G–3H are sectional views illustrating a method of forming a capped chip according to the embodiment shown in FIGS. 3E–3F.
FIGS. 3I–3N are sectional views illustrating a method of forming capped chip according to a variation of the embodiment shown in FIGS. 3G–3H.
FIGS. 3O–3R are sectional views illustrating capped chips according to still other embodiments of the invention.
FIGS. 3S–3V are views illustrating a method of severing capped chips according to another embodiment of the invention.
Figure 3B:
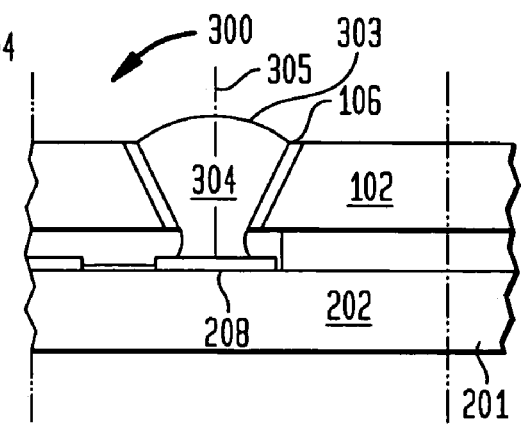
Figure 3C:
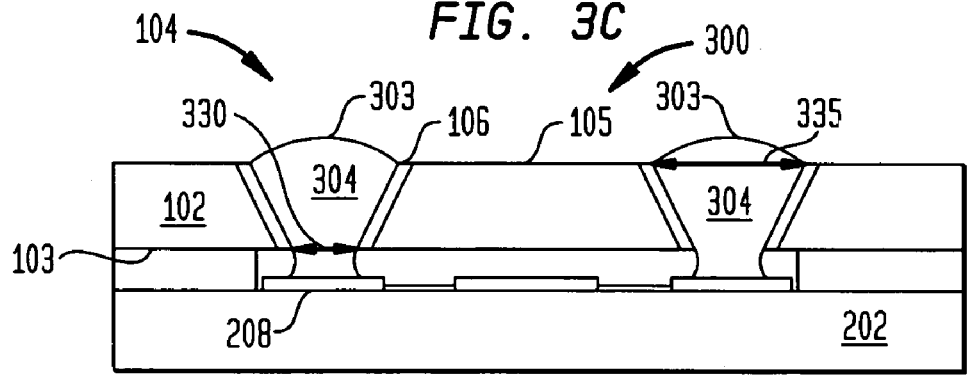
Figure 3D:
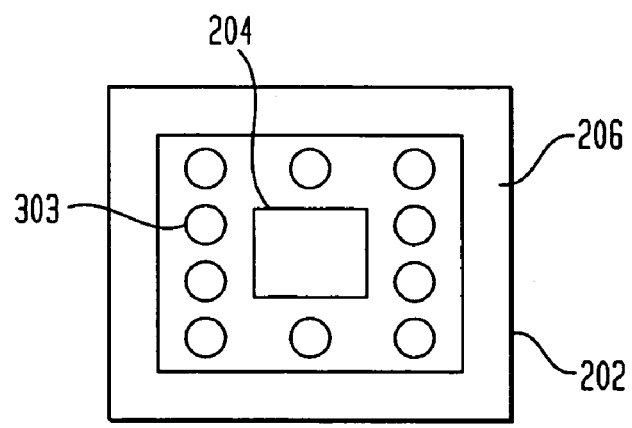

FIGS. 1–3D illustrate a capped chip and stages in a method for fabricating a capped chip according to an embodiment of the invention. In particular, FIG. 3C is a sectional view illustrating a capped chip 200 and FIG. 3D is a plan view illustrating the interconnects and the seal provided on the surface of a chip included in the capped chip.

Particular types of devices, such as SAW devices and MEMs need to be sealed hermetically in order to function appropriately over the life of the device. For many silicon semiconductor devices, a package is considered to be hermitic if it has a leak rate of helium below $1\times10^{-8}$ Pa m$^3$/sec. Other devices such as electro-optical devices do not require hermeticity, but nevertheless are best packaged under a protective lid, e.g., one that is optically transmissive, as a way of preventing particles from reaching a surface of the electro-optic device.

Figure 1:
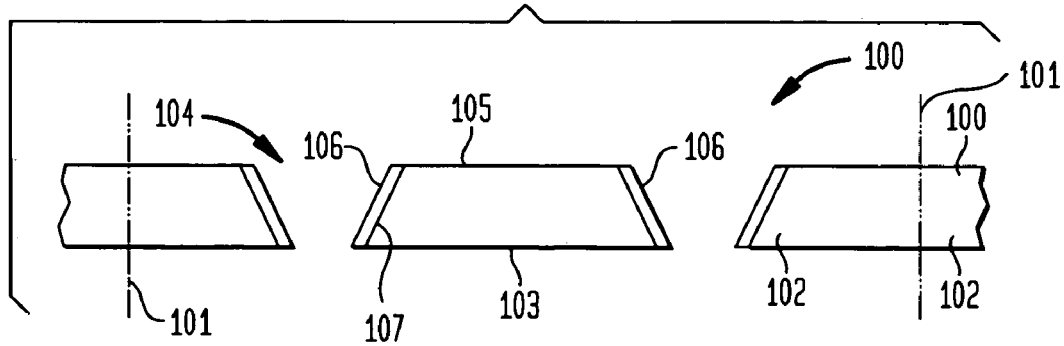
FIGS. 1–3D are views illustrating a method of forming a capped chip according to an embodiment of the invention.

In a method of forming the capped chips, a plurality of caps 102, e.g., as contained in a multiple cap-containing element 100 or wafer, are simultaneously mounted to a plurality of chips, e.g., a wafer containing the chips, and then the chips are severed to form units 300, as best seen in FIG. 3C. In such method, as shown in FIG. 1, the cap element 100 includes a plurality of caps 102, joined at boundaries 101. The cap element 100 can be either rigid or somewhat flexible, and a variety of materials are available for its construction. In one embodiment, when the area of the cap element 100 and the chips to be joined are fairly large, the cap element 100 consists essentially of one or more materials or a composition of materials which has a coefficient of thermal expansion (hereinafter "CTE") similar to that of the chips that are to be capped. For example, the cap element 100 may include or consist of one or more materials such as ceramics, metals, glasses and semiconductor materials. When the chips are provided on a silicon wafer or other such semiconductor wafer having a relatively low CTE, the cap element 100 can consist of a CTE-matched material such as silicon or other semiconductor, aluminum, nickel alloys, including those having especially low CTEs such as alloys of nickel and iron and alloys of, nickel and cobalt. Other CTE-matched metals include molybdenum.

When the device region 208 includes a SAW device, the cap element is desirably constructed of a material having a CTE which is matched to that of the SAW device. When such SAW devices are fabricated in lithium tantalate wafers, a preferred choice for the cap element is aluminum, because aluminum has a CTE which is similar to that of SAW devices, and a low modulus of elasticity, and aluminum can be oxidized to form aluminum oxide, which is an insulator, by processes such as "anodizing". In such manner, insulating layers are formed on the top surface, bottom surface, and through holes with which to isolate respective ones of the subsequently formed electrical interconnects from each other.

As further shown in FIG. 1, the cap element 100 and, each cap 102 thereof has a top surface 105 and a bottom surface 103. In one embodiment as shown, the top and bottom surfaces define respective planes. Through holes 104 are provided in the cap element 100, the cap element 100 generally having one or more through holes per chip. Through holes are provided by any technique suited for the particular material or materials of which the cap element is made. For example, when the cap element 100 is composed predominantly of silicon, metal, ceramics and glasses, the through holes can be provided by a subtractive process such as etching or drilling. Alternatively, when the cap element 100 includes a polymer, the through holes are more desirably provided through a molding process. In the embodiment shown in FIG. 1, the cap element 100 consists predominantly of a dielectric or semiconductor material such as a glass, ceramic or a silicon wafer. Typical etching methods applied to wafers of such materials result in through holes which are tapered as shown to grow smaller from one surface towards the other surface, such that they have a substantially frusto-conical shape. In this embodiment shown in FIG. 1, the through holes are tapered to become smaller in a direction from the top surface towards the bottom surface. In the embodiment shown in FIG. 1, bonding layers, e.g., regions 106 which are wettable, illustratively, by a fusible medium such as solder, tin, or a eutectic composition, are provided on the sidewalls 107 of the through holes 104. The tapered profile of the through holes generally assists in permitting the wettable regions to be formed on the sidewalls 107 of the through holes 104 by deposition. Suitable bonding layers will vary with the material of the cap element and the fusible material which is used to form the bond. The particular fusible medium may affect the impedance characteristics of the bond that is formed. For use with a fusible medium such as a low-melting point tin-based solder and a semiconductor, ceramic or glass cap element 100, one exemplary bonding layer includes a 0.1 μm thick layer of titanium overlying the sidewalls of the through holes 104, an additional 0.1 μm thick layer of platinum overlying the titanium layer, and a 0.1 μm thick exposed layer of gold overlying the platinum layer.

As shown in FIG. 2A, the cap element 100 is aligned to a plurality of attached chips 202, such as contained in a wafer 201 or portion of a wafer and is sealed to the water by a sealing medium 206. The sealing medium 206 includes, illustratively, an adhesive, a glass, especially those which have a low-melting point, a fusible material such as solder, or another material which forms a diffusion bond to elements, e.g., the sealing medium may be such as to form a bond to a bonding ring, as will be shown and described below with reference to FIGS. 33–36B. The sealing material preferably includes a material such as any one or more of the following: a thermoplastic, an adhesive, and a low melting point glass, which typically will bond the bottom surface 502 of the cap directly to the front surface 601 of the chip, without requiring intervening metallizations. Otherwise, bonding may be performed by solder, eutectic composition or one or more metals capable of forming a diffusion bond with a metallization provided on the front surface 601 of the chip, e.g., a sealing ring 802, and a corresponding metallization 804 provided therefor on the bottom surface of the cap 500. When the sealing material has an attach temperature that is coincident with the solder flow temperature, the seal forms as the abutting bottom surface of the cap and the front surface of the chip are drawn together by the decreasing height of the solder.

The wafer 201 is also shown in plan view in FIG. 2B. Illustratively, the wafer is one of many available types of wafers which include at least a layer of semiconductor material, including but not limited to silicon, alloys of silicon, other group IV semiconductors, III–V semiconductors and II–VI semiconductors. Each chip 202 includes a semiconductor device region 204 provided in the semiconductor device layer, which contains, for example, one or more active or passive devices formed integrally to the semiconductor material of the chip. Examples of such device include, but are not limited to a microelectronic or micro-electromechanical device such as a SAW device, MEMS device, VCO, etc., and an electro-optic device. When such device is present, the bottom surface 103 is spaced from the front surface 216 of the chip 202 so as to define a gas-filled void or vacuum void 214 between the cap element 100 and the chip 202. The device region 204 of each chip 202 is conductively connected by wiring 210 to bond pads 208 disposed in a bond pad region at the front surface 216 of each chip. In some types of chips, the bond pads 208 include solder-wettable regions which are exposed at the front surface. In one embodiment, the device region 204 includes a SAW device, and the sealing medium is disposed in an annular or ring-like pattern in a way that surrounds the bond pads 208 and the device region 204 to hermetically seal each cap 102 to each chip 202.

FIGS. 3A–3C are further sectional views illustrating further stages in which electrically conductive interconnects 303 are formed which extend from the bond pads 208 of each chip 202 into through holes 104. As shown in FIG. 3A, a mass, e.g. a ball of a flowable conductive medium 302 is provided at the through hole 104 at the top surface 105 of the cap element 100. Illustratively, the ball 302 includes a fusible conductive material such as, solder, tin or a eutectic composition. The mass of fusible material 302 may be placed on the cap element 100 so as to rest somewhat inside the through hole 104, as shown. When the fusible material 302 is a solder ball or ball of other fusible material, the balls can be placed at or in the through holes of the cap element by placing and aligning a screen containing holes over the cap element and allowing the balls to drop through the holes of the screen into the through holes 104 until one such ball rests in each through hole in which a conductive interconnect is to be formed. Thereafter, as shown in FIG. 3B, the fusible material of the balls is caused to form bonds to the bond pads 208 of the chips 202 of the wafer. For example, when the conductive material is a fusible material such as solder, tin or eutectic composition, heat is applied to the balls directly or by heating the cap element and the chip to a point that causes the material to flow. As a result of this process, the fusible material flows onto and wets the metallizations 106, and flows onto and wets the bond pads 208 to form a bond to the bond pads 208 of the chip 202. Another result of this process is that the fusible conductive material 304 forms a unified solid electrically conductive interconnect 303 which extends from the bond pad 208 into the through hole to form a solid mass of the fusible conductive material. The thus formed conductive mass extends across the full width of the through hole to seal the through hole and to thereby separate the void 214 underlying the cap from the ambient medium which is present above the through hole.

Thereafter, the assembly formed by the cap element 100 and the wafer 201 is severed at dicing lanes defining their boundaries 101 into individual capped chips, one of which is shown in FIG. 3C.

The plan view of FIG. 3D illustrates features on the surface of the chip 202 as completed, the features including the device area 204 of the chip 202, the interconnects 303 which are joined to bond pads of the chip, and the seal 206 which is disposed as an annular or "ring" structure surrounding the bond pads and the device area 204.

Note, with respect to the above processing, that various stages of processing can optionally be performed in different facilities, as the required cleanroom level, i.e., a level specifying the maximum concentration of contaminating particles in the air and on surfaces of the facility, varies during the stages of processing. Moreover, some of the stages of processing are best performed in facilities which are oriented to performing certain steps of processing. In addition, in a preferred embodiment, testing is performed as to intermediate results of processing to eliminate product and materials from the process stream which are determined to be defective at particular stages of processing.

Thus, with respect to the processes described in the foregoing, a facility can fabricate cap elements, e.g. cap wafers having dimensions sized to fit the chip-containing wafers to be covered thereby. As an example, such cap elements are fabricated from blank wafers, which can be either new or possibly wafers recycled from previous processing. The cap elements are subjected to processing to form the through holes, which are then tested to assure conformance to standards of quality, e.g., placement, location, alignment, pitch, depth, sidewall angle, etc., and any of several other criteria for assuring quality. In either the same or in another facility, when the through holes include wettable regions, e.g., under bump metallizations ("UBM") on the sidewalls thereof, processing is then performed to form the wettable regions. Because of the techniques used, and the increased sizes of features of the cap element, and tolerances therefor, these particular steps can be performed in facilities which need not be geared to the fabrication of semiconductor devices. However, such steps can be performed in a semiconductor fabrication facility, if such is desired. Again, at the conclusion of this processing, testing is optionally performed to assure that the wettable regions of the cap element meet quality standards.

Thereafter, the cap element and the chip-containing wafer are joined together according to processing such as described above with reference to FIG. 2A, such joining process preferably being performed in a facility having a high cleanroom level. For example, such process is desirably performed in a semiconductor fabrication facility, such as the facility in which the chip wafer is made. When the chips include optically active elements such as imaging sensors, processing to complete the conductive interconnects 303 (FIG. 3B) of each cap element can be deferred until later processing, if desired, since the primary concern is to mount the cap element as a cover over the chip wafer to avoid dust contamination. However, if the chip contains a SAW device, MEMs device or other such device requiring hermetic packaging, it is desirable to form the conductive interconnects 303 at this time as well, to form a seal which protects the SAW device during subsequent stages of processing. Again, some testing is then desirably performed to assure that quality standards are met prior to proceeding to subsequent stages of fabrication. Subsequent processing to form the electrical interconnects, if not formed already, and to provide any further sealing, if necessary, is then performed. Such processing can be performed in another facility other than the semiconductor fabrication facility, and at a cleanroom level that is not required to be as high as that of a semiconductor fabrication facility.

Similarly, subsequent processing to complete the packaging, as by adding other elements, e.g., optical lenses, interposer elements, thermally conductive elements and the like, and processing to mount the packaged chip to a circuit panel, such as the processes described below with reference to FIGS. 7C–11B, or FIGS. 16–17, for example, need not be performed in the same facility. Such subsequent processing can be performed in environments which do not have the same cleanroom level as that in which the cap element is mounted to the chip-containing wafer, that step preferably being performed in the semiconductor fabrication facility.

The mounting of a cap element to a chip wafer, as described in the foregoing, is especially advantageous for the packaging of certain types of chips, especially those including SAW devices, MEMs devices, and optical devices, potentially resulting in increased yields, due to the ability of such processing to be performed efficiently in cleanroom environments of semiconductor fabrication facilities, where sources of contamination are kept to a minimum. In particular, it is especially desirable to protect chips which include imaging sensors such as charge-coupled device (CCD) arrays and the like from dust or other particle contamination by attaching a cap or lid to the front surface of the chip, as early in the packaging process as possible. Such imaging sensors include an imaging device array of a chip, over which a layer including an array of bubble-shaped microlenses is formed in contact with the device array. The array of microlenses typically includes one microlens per pixel unit of the device array, the pixel unit having dimensions of a few microns on each side. In addition, such microlenses are often made of a sticky material to which dust tends to adhere after manufacture. Particles and dust, if allowed to settle directly on an imaging sensor, can obscure a portion of the pixel area of the imaging sensor, causing the image captured by the sensor to exhibit a black spot or degraded image.

However, owing to the shape of the microlenses and their number, and the sticky nature of the material used to make them, it is virtually impossible to remove dust or other particles that settle on the surface of a typical imaging sensor having such microlenses. Thus, any particles which settle on the imaging sensor at any time after the microlens array is formed, such as during the packaging process, render the imaging sensor defective, such that it must be discarded. This provides an explanation why such imaging sensor chips, when packaged according to conventional chip-on-board techniques, exhibit a yield rate in the final packaged chips, which is only 80% to 85% of the chips fabricated on each wafer.

On the other hand, particles and dust which settle on a transparent cap or cover above the outer surface of the chip do not obscure a portion of the image because the outer surface of the cap lies outside of the focal plane of the device. At worst, particles settling on the cover result in slightly decreased light intensity striking a portion of the imaging sensor. The slightly decreased light intensity rarely affects the quality of the image captured by the imaging sensor. Moreover, as described herein, the caps or covers can be mounted over the imaging sensors of the chips while the chips remain attached in wafer form, i.e., before the wafer is diced into individual chips. The mounting of the caps is preferably performed in substantially the same level of cleanroom environment as that used to fabricate the wafer, e.g., before the chip wafer leaves the semiconductor fabrication facility. In such manner, dust and particles are prevented from ever reaching the surface of imaging sensors of the chips. Moreover, once the chips are protected by such transparent caps, it becomes possible to clean the top surfaces of the covers if particles such as dust reach them. This is because the transparent caps can be made substantially planar, unlike the topography of the bubble-shaped microlenses of the imaging sensor, and are typically made of a material such as glass, which is readily cleaned by a solvent. Because the potential for direct dust contamination of the imaging sensor is virtually eliminated once the transparent cap wafer is mounted to the chip wafer, it is estimated that imaging sensor chips which are provided with transparent covers early in the packaging cycle have a yield rate of 97%–99%. In such case, the defect rate becomes no longer primarily due to contamination of the imaging sensors, but rather, for other reasons such as electrical functionality.

Desirably, wafer-level testing is performed on the chip-containing wafer 201 (FIG. 3B) prior to the cap element 100 being joined to the wafer 201 and the conductive interconnects 304 formed thereto. "Wafer-level testing" refers to such testing as is generally performed on chips, prior to the chips being severed into individual chips. More extensive testing, commonly referred to as. "chip-level testing," is typically performed only after the chip has been severed from the wafer and packaged as an individual chip.

Wafer-level testing typically tests for basic functionality, such as for electrical continuity, and basic functional operation of each chip. Such testing is desirably performed prior to individually packaging each chip, in order to eliminate the costs of packaging chips that are later determined to be defective. Thus, it is desirable to perform steps to complete the packaging of chips only with respect to chips which have passed initial wafer-level testing, i.e., "known good dies." By completing the packaging only as to "known good dies," unnecessary packaging operations and/or rework of packaging operations are avoided.

Wafer-level testing generally takes much less time, perhaps as much as 100 times smaller amount of time per chip tested than chip-level testing. However, the cost per chip of wafer-level testing performed by equipment capable of mechanically probing the surface of the wafer can equal or exceed that of the cost of chip-level testing, despite the greater amount of time per chip needed to perform chip-level testing. The special equipment required to precisely, mechanically probe the contacts on the wafer surface is very expensive. For that reason, such special equipment is typically also subject to resource constraints within the manufacturing facility. Moreover, fewer contacts per chips are capable of being simultaneously contacted by such equipment than is generally the case for chip-level testing, for which chips are generally placed in sockets for testing. Another factor that affects the cost of wafer-level testing is that the special equipment used to probe the contacts of the wafer is limited to testing a single chip at a time, to at most a few chips at one time.

On the other hand, chips that are processed into capped chips in wafer form or lidded chips in wafer form, as described herein, e.g., in FIGS. 1–3D, are capable of being tested at the wafer level, with test equipment that is potentially less expensive than the mechanical probing equipment described above, because interconnects of the chips are disposed on the top surface of the cap wafer and for that reason, are capable of being probed by equipment similar to that used to perform chip-level testing. For example, the top or outer surface of the cap wafer can be mechanically contacted by a contact-bearing dielectric element of test equipment, the contacts of the test equipment being held in contact with the conductive interconnects of multiple chips of the wafer, as by mechanical force. In such manner, testing is performed through voltages and/or currents applied through the interconnects 303 of each capped chip 300 to a plurality of the chips which remain attached in form of the wafer 201 (FIG. 3B). In that way, a plurality of chips of each wafer are simultaneously tested and determined to be good or defective, using equipment that can be less expensive than the above-described test equipment, because the need to mechanically probe the wafer surface directly is eliminated. In a particular embodiment, a greater subset of tests than is generally performed as "wafer-level testing" is performed to the capped chips. This is possible because the wafer containing the capped chips is able to be tested by test equipment that is less expensive than the mechanical probing equipment discussed above. In addition, the ability to test a greater number of the chips at one time permits more testing to be performed per chip for the same total amount of test time using the less expensive test equipment. In a highly preferred embodiment, the capped chips are tested in such equipment for all or nearly all of the same functions ordinarily performed during chip-level testing, prior to the chips-being severed from the capped chip-containing wafer into individual capped chips.

Figure 3E:
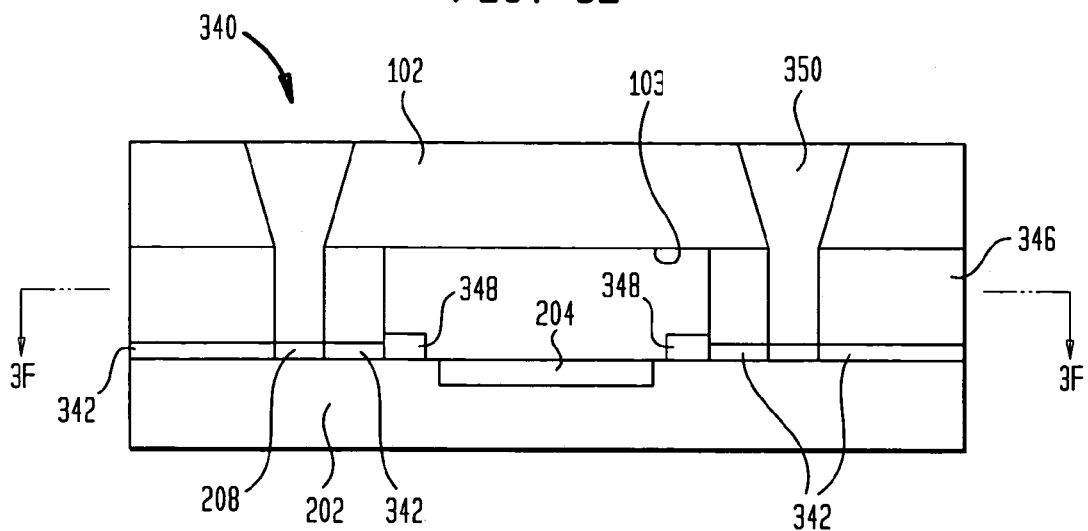
Figure 3F:
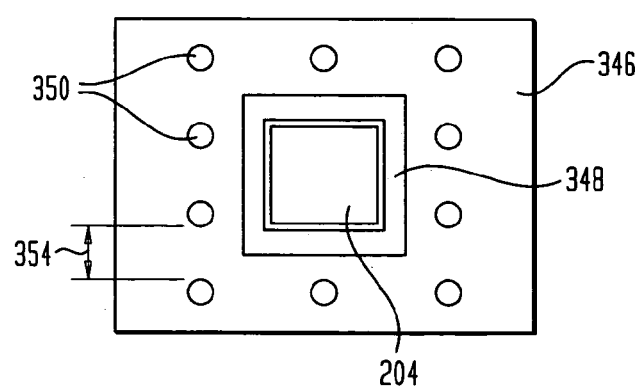

FIGS. 3E and 3F illustrate a variation of the above-described embodiment, in which a sealing material is disposed between the chip 202 and the cap 102 in such way that it separates electrical interconnects 350 of the capped chip from adjacent electrical interconnects.

FIGS. 3E and 3F are a sectional view of such capped chip and a plan view corresponding thereto, through line 3F–3F. In this embodiment, the capped chip 340 includes a sealing material 346 which surrounds the device area 204 of the chip 202, as in the above embodiment, but also encompasses the area of the electrical interconnects 250. Preferably, the sealing material is an insulating material, for example, a nonconductive polymer, e.g., adhesive such as epoxy or other adhesive, a thermoplastic, a glass, e.g., low-melting point glass, etc., such as described above, such that the sealing material provides an isolating medium between adjacent ones of the electrical interconnects.

As further shown in FIG. 3E, optionally, a seal ring layer 342 is disposed on the front surface of the chip 202, such that the sealing material 346 adheres to the seal ring layer 342. The seal ring layer presents a surface that is wettable by the sealing material 346 such that the sealing material preferentially wets the seal ring layer and forms a bond thereto. The capped chip optionally includes a guard ring 348 which is used to prevent the sealing material from flowing beyond the wettable seal ring layer towards the device area 204 of the chip 202. The guard ring presents a surface which is not wettable by the sealing material. Certain materials present nonwettable surfaces to other materials. For example, polytetrafluoroethylene (PTFE) presents a surface to which most other materials will not adhere or wet. In one embodiment, the guard ring 348 includes PTFE as a material at the exposed surface thereof. A similar seal ring layer and guard ring are optionally provided on the facing surface 103 of the cap.

Herein, while processes and accompanying figures are generally described in relation to individual chips and individual caps, unless otherwise noted, they shall also be understood to apply to the simultaneous processing of multiple attached chips, e.g., a wafer, and multiple attached caps of a cap element, e.g., a cap wafer.

Figure 3G:
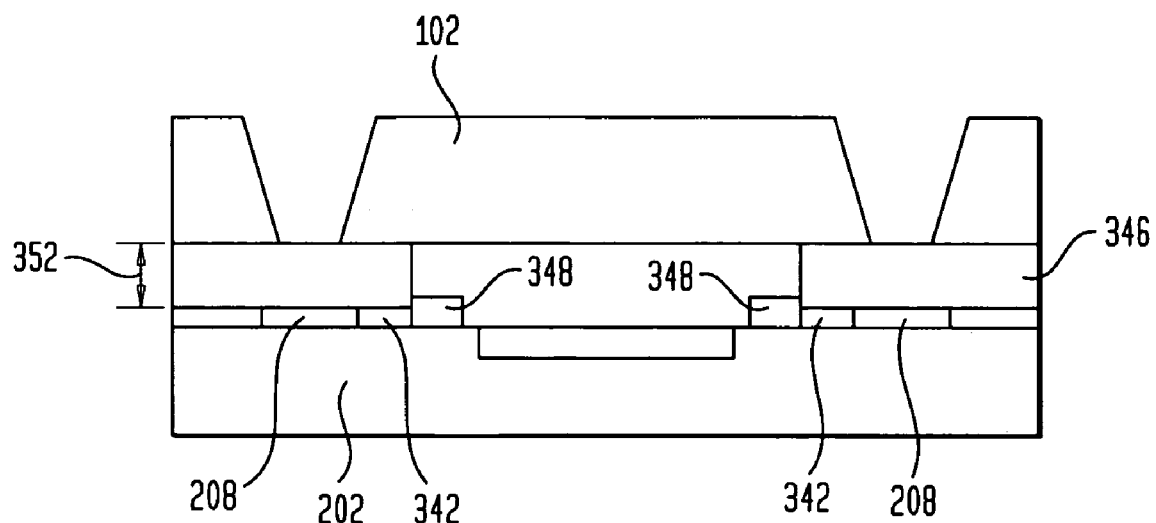
Figure 3H:
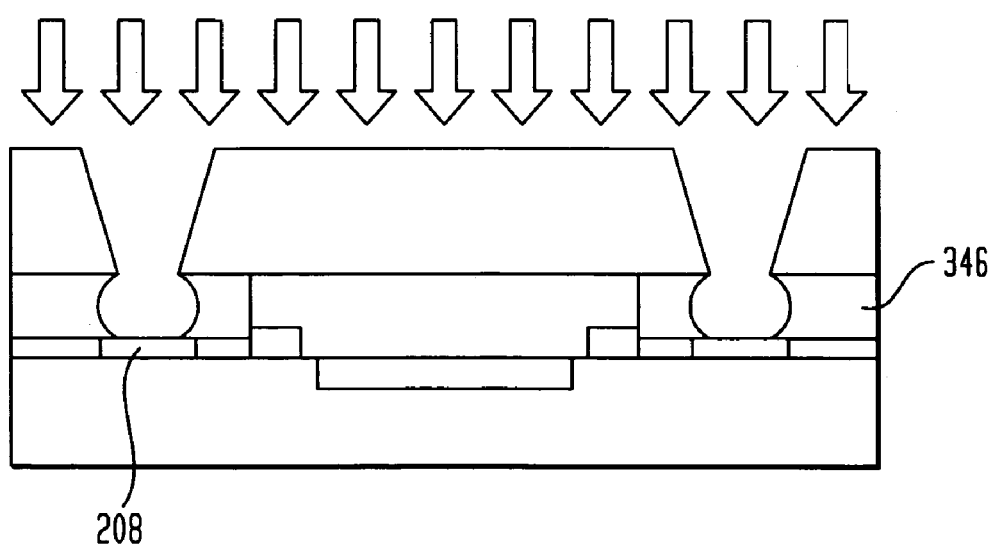

FIGS. 3G through 3H illustrate one option for fabricating the capped chip shown in FIGS. 3E–3F. As in the above-described embodiment, this embodiment is preferably practiced as a way of simultaneously mounting a chip member including a plurality of chips to a cap member including a plurality of caps, after which the resulting joined article is severed to provide individual capped chips. As shown in FIG. 3G, the insulative sealing material 346 is placed on the surface of the chip 202 or the cap 102. The cap, having preformed through holes therein, is then juxtaposed and aligned to the chip such that the sealing material 346 contacts and wets respective areas of the cap 102 and the chip 202, including the seal ring layer 342, but not wetting the guard ring 348. As a result, the sealing material flows onto and is disposed on the contacts, e.g., the bond pads 208 of the chip 202.

Thereafter, as shown in FIG. 3H, a process is performed to remove unwanted sealing material 346 which is disposed on the bond pads 208. Such process is preferably tailored to the specific sealing material that is used. For example, when the sealing material is a glass, the process is preferably performed by etching, which is preferably performed anisotropically, e.g., such as by reactive ion etching, sputter etching, or other process which includes removal of material primarily in the vertical direction. However, in another embodiment, the etching process need not be highly anisotropic. The etching process may even be a generally isotropic process, if the relative thickness 352 of the sealing material being removed is comparatively smaller than the dimensions 354 (FIG. 3F) between adjacent ones of the bond pads 208. In that way, the removal of the sealing material 346 from on top of the bond pads 208 does not result in areas wider enough for adjacent electrical interconnects to contact each other. In a particular embodiment, when the sealing material is an organic material, e.g., a polymer such as an adhesive or thermoplastic, the removal is performed by a "plasma ashing" process, in which plasma etching results in the polymer being converted to an ash-like substance, leaving the surfaces of the bond pads 208 exposed. Thereafter, the electrically conductive interconnects 350 are formed by a process such as one of the above-described processes.

FIGS. 3I through 3N illustrate an alternative process for making capped chips similar to those described above with reference to FIGS. 3E through 3H. Referring to the completed capped chip as shown in FIG. 3N, this embodiment differs from the embodiment described therein, in that the sealing material 356 is a self-fluxing underfill. A self-fluxing underfill is an insulative material that is frequently used to fill a space between the front surface of a chip and a packaging element to which it is mounted in a flip-chip arrangement. Typically, a self-fluxing underfill material is an epoxy-based material, which is viscous as applied at a normal ambient temperature, or at a slightly elevated temperature, but which hardens into a solid mass upon heating.

The self-fluxing aspect of the material relates to components of the composition which cause it to function as a flux when articles are soldered in its presence. Stated another way, the self-fluxing underfill material carries away reaction products, e.g., oxidation products from the soldering process that is performed in contact with it. In a particular embodiment shown in FIG. 3N, the self-fluxing underfill material is disposed in contact with a sealing ring layer 342 and is prevented from contacting the device area 204 of the chip by a guard ring. The sealing ring layer is similar to the sealing ring layer and the guard ring described above with reference to FIGS. 3E–3F. A Similar sealing ring layer (not shown) and guard ring (not shown) may also be disposed on the underside 103 (bottom side) of the cap member 100.

A process of forming capped chips using such self-fluxing material will now be described, with reference to FIGS. 3I through 3N. An initial stage in fabricating a capped chip is illustrated in FIG. 3I. In such stage, a cap member 100 including a plurality of caps 102 is aligned to and disposed overlying a chip member 200 which includes a plurality of attached chips 202. For example, the cap member 100 and the chip member 200 can be held together in a fixture. Thereafter, as shown in FIG. 3K, the through vias of the cap are loaded with a fusible conductive medium, e.g. solder, tin, eutectic composition, or diffusion bondable medium, etc. In such case, the fusible conductive medium may adhere to the walls 107 of the through holes, the walls preferably presenting surfaces which are wettable by the fusible conductive medium. Alternatively, the walls are metallized to provide surfaces wettable by the fusible medium, as described above. One method of applying the fusible medium shown in FIG. 3J is by paste screening. Another method includes application of molten solder to the cap 102 at the through hole, for example. The result of this step is to provide a solder mass held to the cap 102 at the through hole 358, such as through a bond, adhesion, surface tension, etc. FIG. 3K illustrates an alternative, in which the fusible medium is applied in form of a ball such as a solder ball 304, in a manner such as that described above with reference to FIG. 3A. Thereafter, the self-fluxing underfill material is applied between the cap member 200 and the chip member 100 to the space surrounding the device region 204 of each chip, resulting in the structure as shown in FIG. 3L and 3M. The self-fluxing underfill material can be provided to the sealing surfaces at the periphery of each chip of the chip member and each cap of the cap member through capillary action. For example, referring again to FIG. 2B, the filling process is conducted by applying the sealing material onto the sealing surfaces of the chips and the caps that are disposed along rectilinear dicing channels, including the vertical dicing channels 211 of a chip member such as a wafer, and also along horizontal dicing channels 213.

In a particular embodiment, if the above-described capillary action is not sufficient to achieve adequate fill quality, the process can be conducted as to a smaller number of attached chips and caps, for which such filling method is adequate. For example, in an embodiment, the cap member contains a one-cap wide strip of chips and the chip member contains a one-chip wide strip of chips. The underfill is applied to the interface between peripheral edges of each chip and each cap on the strip, and the self-fluxing material is then drawn onto the wettable sealing ring layers that are disposed adjacent to the peripheral edges of each chip.

After the underfill is applied, the structure, as shown in either of FIGS. 3L and 3M is heated, such that the fusible medium, e.g., solder, flows down the walls of the through holes to wet, contact and bond with the bond pads 208 of the chips 202, as shown in FIG. 3N. During such heating step, the self-fluxing underfill 356 is displaced by the molten medium. The self-fluxing underfill then preferably also provides flux to carry away oxides which may occur due to the bonding process, such that a good conductive bond is achieved between the resulting electrical interconnects 350, as provided by the fusible medium 358, and the bond pads 208. Thereafter, as in the embodiment described above with reference to FIGS. 1–3D, the structure is severed into individual capped chips.

In a variation of the above embodiment, the self-fluxing underfill material is provided to at least one of the opposing surfaces 103, 216 of the chip member and the cap member prior to aligning and placing the cap member into a desired position relative to the chip member.

Figure 3O:
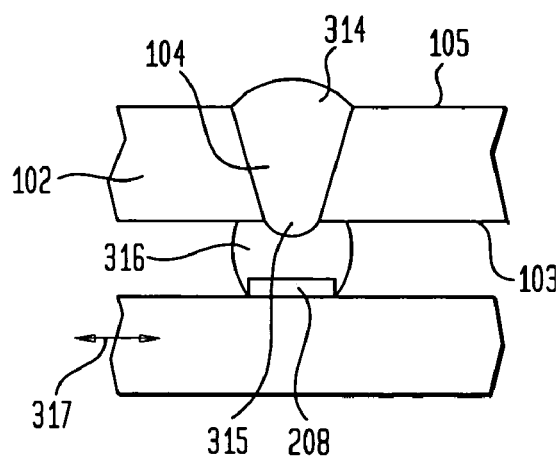

In another embodiment as shown in FIG. 3O, masses of fusible conductive material are pre-bonded to wettable surfaces of the through holes 104 of the cap 102, and the cap is then bonded by a conductive adhesive 316 provided on bond pads 208 of the chip 202, to form electrically conductive interconnects extending from the bond pads 208 through the through holes to the top surface 105 of the cap 102. Again, this process is preferably performed simultaneously as to a plurality of attached chips, such as a chip-containing wafer and a plurality of caps, such as a cap wafer, and the joined structures then severed to form individual capped chips. This process permits the cap wafer and the chip-containing wafer to be joined at room temperature or at most, a minimally elevated temperature, i.e., without requiring heating to a temperature sufficient to cause the flowing of a fusible material such as solder. Such process is advantageous, in order to avoid problems of differential expansion between the chip-containing wafer and the cap wafer, e.g., when the two wafers are not CTE matched.

The masses of fusible material are provided, for example, by screen printing a controlled amount of solder into each through hole of the cap wafer. Alternatively, the masses of fusible material can be provided by contacting a cap wafer having tapered through holes wettable by solder with a bath of solder, such that the solder is drawn onto the wettable surfaces of the through holes, to fill the through holes with the solder. The through holes are preferably tapered, either in the manner shown, i.e., growing smaller from the top surface 105 towards the bottom surface 103, or alternatively, growing smaller from the bottom surface towards the top surface. In another alternative, the through holes are tapered from both the top and bottom sides, growing smaller towards a middle of the thickness of the through holes 104. The application of the solder results in the mass 314 of solder having a protrusion 315 extending beyond the bottom surface 103 of the cap. The protrusion 315 can be a natural consequence of applying the solder in liquid, e.g., as a solder paste, or in a molten state. In either case, due to surface tension, a sessile drop forms which causes the protrusion 315 to appear. The protrusion 315 provides a surface which displaces some amount of the conductive adhesive upon bringing the cap together with the chip, such that the solder mass 314 fully contacts the conductive adhesive 316. The conductive adhesive is preferably an anisotropically conductive adhesive, which conducts in a vertical direction by way of conductive elements in the adhesive that are pressed into contact with the solder mass 314 and the bond pad 208. As also described and shown below with reference to FIG. 10B, an anisotropically conductive adhesive does not conduct in a lateral direction 317 due to lateral spacing between the conductive elements of the adhesive.

Figure 3P:
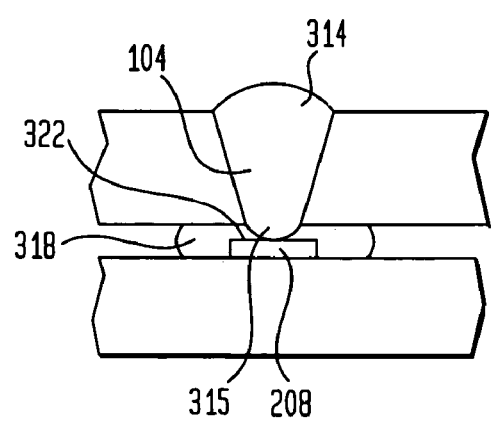

In a variation of this embodiment, as shown in FIG. 3P, a viscous, nonconductive adhesive 318 is applied to the vicinity of the bond pad used. In this case, the protrusion 315 of the pre-formed solder mass 314 displaces the nonconductive adhesive so as to contact the upper surface of the bond pad. The nonconductive adhesive functions to maintain the solder mass 314 in contact with the bond pad 208. Application of a slightly elevated temperature may be performed to cure and/or shrink the nonconductive adhesive 318, so as to better maintain the contact between the protrusion 315 and the bond pad 208.

Figure 3Q:
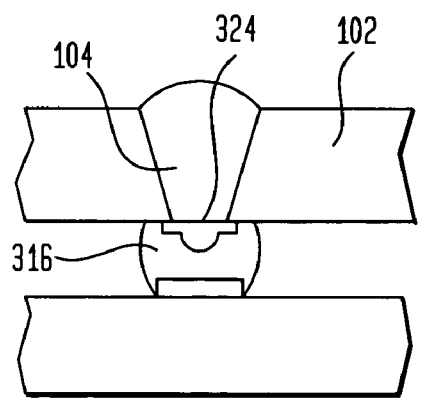
Figure 3R:
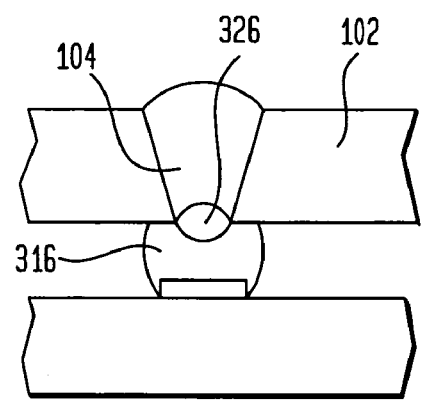

FIGS. 3Q an 3R illustrate further variations of this embodiment, in which additional protruding features are added to the cap wafer in each case, in registration with the through holes 104, such protruding features provided to assure the quality of contact between the pre-formed conductive interconnect structures provided in the cap wafer 102 and the bond pads of the chips 102. Specifically, in FIG. 3Q, the protruding feature includes a stud bump 324 which is applied to the cap wafer 102 at the location of the through hole 104. In a particular embodiment, the solder mass 314 is planarized, e.g., by polishing, after which the stud bump 324 is applied to make the structure shown. Embodiments including stud bumps are described in greater detail below throughout the present application. In FIG. 3R, the solder mass 314 does not completely fill the through hole. In such case, the protruding feature 326, e.g., a stud bump fills the remaining space within the through hole to project beyond the bottom surface 103 of the cap 102. Although FIGS. 3Q and 3R illustrate structures in which a conductive adhesive is used, i.e., a preferably anisotropic conductive adhesive, a nonconductive adhesive can be used instead, in the manner as described with reference to FIG. 3P.

FIGS. 3S through 3V illustrate a particular embodiment of a method by which a structure 360 including capped chips, in wafer form, are severed into individual capped chips.

As noted above, a cap wafer and a chip-containing wafer need not consist of the same or similar materials. For example, a chip-containing wafer consisting essentially of silicon may be joined to a cap wafer which consists essentially of glass. In such case, a difficulty arises in the manner in which the structure including the cap wafer, as joined to the chip-containing wafer, can be severed into individual capped chips. Conventionally, a silicon wafer can be cut by sawing using a 25 µm wide blade, which saws through the thickness of the wafer at a rate of 70 mm per minute. On the other hand, a glass wafer, having an exemplary thickness of 325 µm, must be cut using a blade having a thickness of 75 µm, which also cuts at a comparable rate. The blade optimized for cutting a silicon wafer will cause chipping if used on the glass wafer. Conversely, a blade optimized for cutting a glass wafer produces unsatisfactory results when used to cut a silicon wafer.

In order to cut through a structure including both the silicon wafer and the glass wafer, a poor compromise is presented. A sawing process capable of cutting both silicon wafer and glass wafer together operates at a rate of only 5 mm per minute, which is unacceptable, given the thickness of the combined structure, which is in the hundreds of microns. In addition, typically, dozens of cuts are required to sever all chips of such wafers into individual units.

Figure 3S:
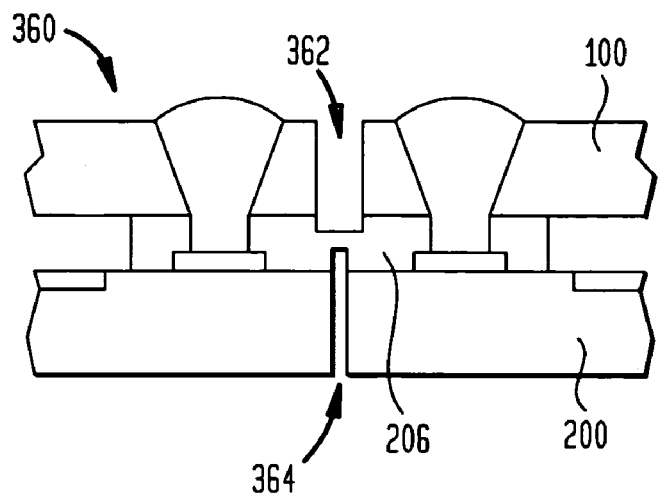

FIG. 3S illustrates an improved method of severing the structure 360 into individual units according to an embodiment of the invention. In this embodiment, a sealing material 206 is disposed between the chip-containing wafer and the cap wafer, the sealing material 206 being such as that described above with reference to FIG. 2A or in other above-described embodiments. The cap wafer 100 and the chip-containing wafer 200 are spaced from each other by a distance. In one embodiment, the distance is controlled, for example, by features of the cap wafer or the chip wafer which protrude beyond the opposing surfaces 216, 103 of the cap wafer or the chip wafer, respectively, as described in greater detail below with reference to FIG. 23. Alternatively, the sealing material can include spacing elements, e.g., spheres, for maintaining a minimum distance between the chip and the cap wafer.

The structure 360 is sawed, first by a saw optimized for cutting one of the wafers, and thereafter by a saw which is optimized for cutting the other one of the wafers. For example, a saw having a thick blade is used to produce the wide cut 362 first, cutting through the glass cap wafer 100, as shown in FIG. 3S. Such cut 362 may touch the sealing material 206, but does not cut through the sealing material. This sawing operation is preferably then repeated to make all of the cuts through the glass across throughout the cap wafer. As stated above, this sawing operation, being optimized to the glass, proceeds quickly for that reason. Thereafter, a saw having a relatively narrow blade is applied to make the narrower cut 364, as shown in FIG. 3S. In this case, the blade and the sawing operation are optimized to cutting the silicon wafer, Preferably, this cut is performed to cut all of the way through the silicon wafer and through the remaining sealing material. In such case, given the greater width of the cut 362 in the glass wafer 100, the narrower cut 364 meets the wide cut 362 to complete the severing of the chip. Beneficial results are provided, in that the rate of sawing through each wafer separately is at about one order of magnitude or more greater than the rate of sawing through a combined structure 360 using a single saw. Thus, the rate of severing the chips is at least several times faster, for example, about 5 to 10 times faster, when the method according to this embodiment is utilized, as compared to using one blade capable of cutting through both wafers.

Figure 3T:
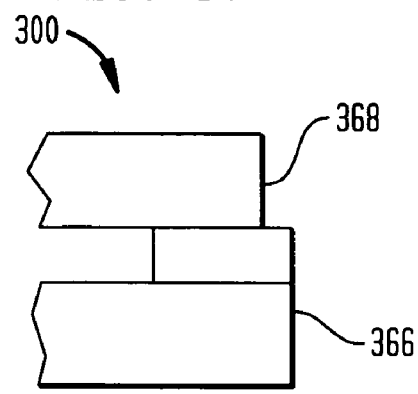
Figure 3U:
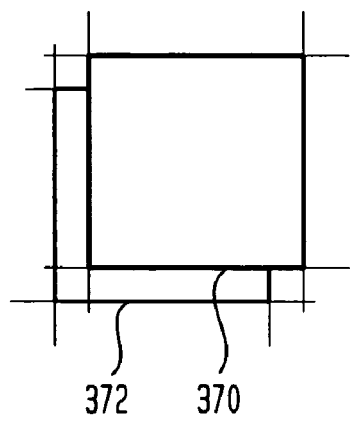
Figure 3V:
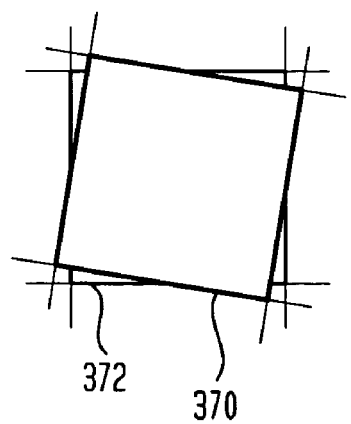

FIG. 3T illustrates an individual capped chip 300, diced using this embodiment of the invention. As shown therein, the edges of the chip 366 and the cap 368 of the capped chip unit 300, are not perfectly aligned. This is a consequence of the two separate sawing operations that are performed. Perfect alignment and orientation of the separately performed sawing operations is difficult, if not impossible, to achieve. FIGS. 3U and 3V are plan views illustrating the capped chips, after sawing them into individual units. Some displacement in one or more axes of the dicing lines 370, 372 produced by the two sawing operations is likely to occur, as shown in FIG. 3U. Angular displacement of one sawing operation relative to another sawing operation, may also cause angular displacement of the dicing lines 370, 372, as shown in FIG. 3V.

Figure 4A:
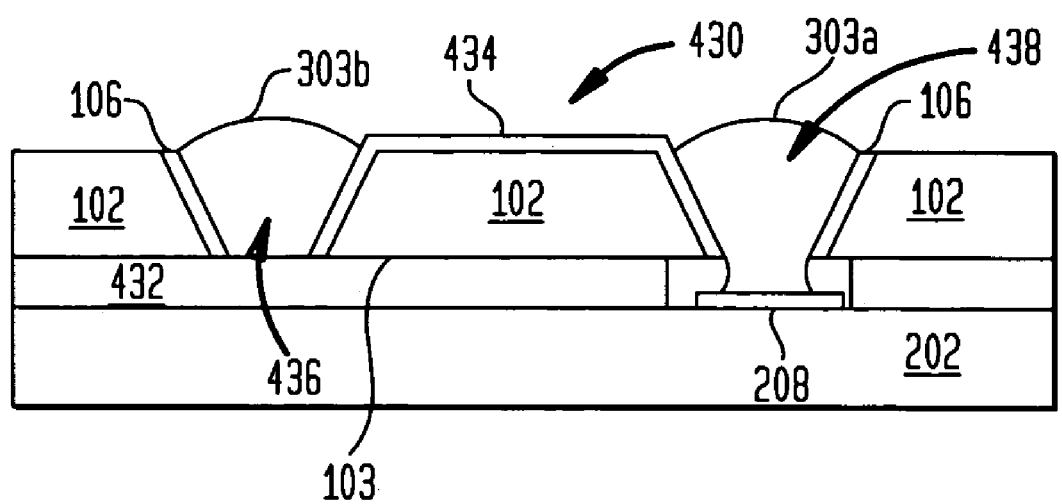
FIGS. 4A and 4B are a sectional view and a plan view corresponding thereto, illustrating a particular embodiment of the invention in which a redistribution wiring trace is provided.
Figure 4B:
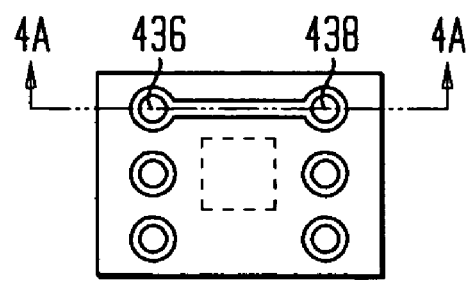

FIGS. 4A and 4B are a sectional view and a top-down view, respectively, illustrating a particular embodiment of a capped chip 430 in which the electrical interconnects 303 are conductively connected by a trace 434 formed on the top surface of the cap 102, such as for the purpose of redistributing an electrical connection. In such embodiment, the trace 434 extends from a bonding layer 106 provided on the sidewall through a through hole at one electrical interconnect 303a to a bonding layer 106 provided at another electrical interconnect 303a. The trace 434 can be formed at a separate time as the bonding layer 106 or simultaneously with the bonding layer 106. As shown in FIG. 4A, a sealing medium 432 is provided between the cap and the chip 202 in an area underlying the through hole 436. When a fusible conductive material is placed, in through hole 436, as well as through hole 438 and heated, the material forms a solid bonded connection to the bonding layer 107 and forms an electrically conductive connection between the bond pad 208 and the electrical interconnect 303b. Note that during such process, the fusible material does not flow from the through hole 436 onto the chip because of the seal medium 432 which blocks the material from flowing lower than the bottom surface of the cap 102. Alternatively, if the arrangement permits two bond pads of the chip to be at the same potential, e.g., such as for the distribution of power or ground connections, the chip may include a bond pad underlying the through hole 436, and the sealing medium 432 not be disposed under through hole 436, such that the electrical interconnect 303b is also bonded to that bond pad.

Figure 4C:
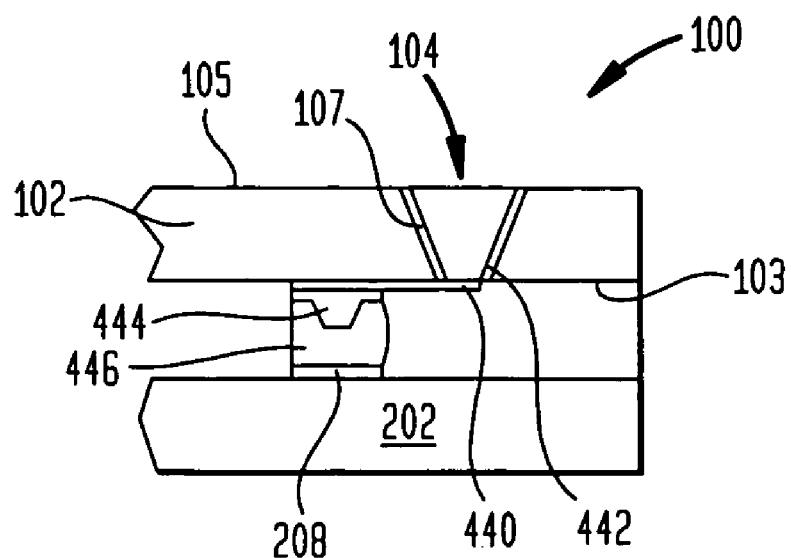
FIGS. 4C and 4D are views illustrating a capped chip on which redistribution traces are provided on an underside of the cap, according to an embodiment of the invention.
Figure 4D:
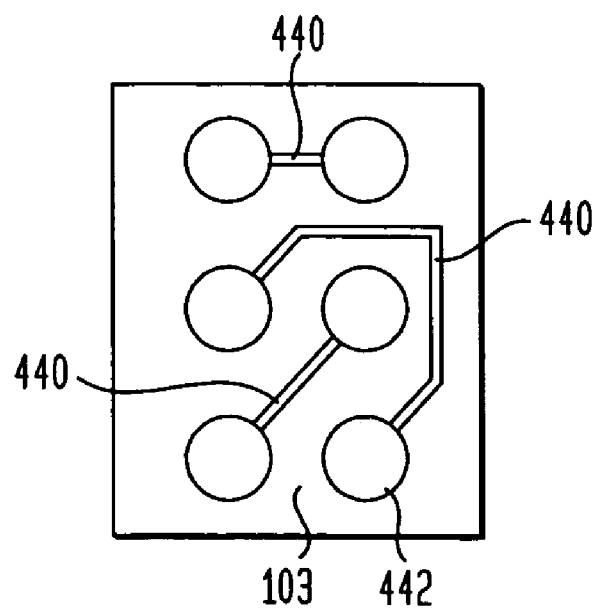

FIGS. 4C–4D are a sectional view, and a plan view, respectively, illustrating a variation of the capped chip structure 100 discussed above with reference to FIGS. 4A–4B. With reference to both figures, in this structure, Ma redistribution trace 440, which may function as a "fan-out" trace, is provided on the side 103 of the cap 102 which faces the chip 202, that is, the underside of the cap, also referred to herein as the "bottom side" of the cap. The redistribution traces can function as a "fan-out" trace for the purpose of providing contacts on the cap which are disposed farther apart and at more convenient locations for higher level packaging than the locations of the bond pads of the chip. Such arrangement permits the size of the chip to be made smaller, which allows more cost-effective chip processing, because more chips are fabricated at a time on a single wafer. The cap 102 is provided of a material such as that described above, and is preferably mounted to the chip as a plurality of attached caps in wafer form to a plurality of attached chips of a chip-containing wafer, after which the joined structure is severed into individual units.

With specific reference to FIG. 4C, the redistribution traces 440 extend along the underside 103 of the cap from the locations of interconnecting masses 442 of conductive material which extends from the bottom side 103 to the top side 105 of the cap 102 by way of through holes 104. The conductive material forming the masses 442 is a flowable conductive material such as a conductively loaded polymer, one or more metals or a fusible conductive medium. Most preferably, the masses 442 are formed of a fusible conductive medium such as solder, tin or eutectic composition, and are formed in contact with a bonding layer 107 disposed on walls of the through holes. At the other end of the conductive traces, protrusions 444, such as stud bumps, are preferably provided. The protrusions 44 provide surfaces to which a bonding medium such as a conductive adhesive 446 adheres to form an electrically conductive path from the bond pads 208 of the chip 202 to the traces 440. Preferably, the adhesive is an anisotropic conductive adhesive, such as that described above with reference to FIGS. 3O–3R. Alternatively, a nonconductive adhesive can be used in place of the conductive adhesive 446, in a manner such as that described above with reference to FIG. 3P. Alternatively, a fusible conductive medium such as solder is used in place of the conductive adhesive. In such case, a mass of fusible material such as solder is preferably applied as a bump to the protrusion 444 or the corresponding location of the trace 440, if the protrusion is not present, before the cap wafer is bonded to the chip wafer. The cap wafer and the chip wafer are then heated to cause the solder to reflow, thus forming a solder mass bonding the two wafers in the place where the conductive adhesive 446 is shown.

In one embodiment, the cap wafer is formed by patterning a layer of metal on the cap wafer to form the redistribution traces 440, after which the through holes are formed by an etching process or other removal process which is end-pointed upon reaching the redistribution traces 440. Bonding layers 107 are then formed on walls of the through holes, as needed, and the through holes are then are then filled with the conductive material, that material preferably being a fusible conductive material such as solder.

Figure 4E:
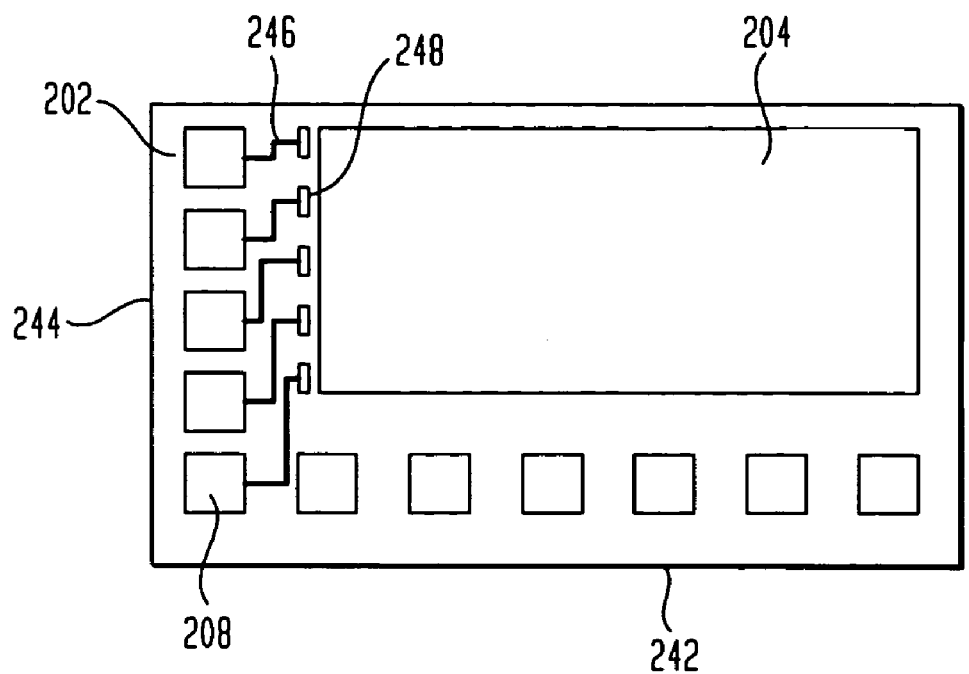
FIG. 4E is a plan view illustrating a layout of a chip having bond pads disposed along both vertical and horizontal edges of the chip.

FIGS. 4E is a plan view illustrating an example of a chip 202 which would benefit upon redesign, through use of the redistribution scheme illustrated in FIGS. 4C–4D. As shown in FIG. 4E, the chip 202 is rectangular, such that the chip has a long edge 242, and a short edge 244. The rectangular shape is used because of the rectangular shape of a device area 204 of the chip, which may be, or may not be required to be rectangular. For example, a charge-coupled device (CCD) array is required to be rectangular for capturing images. In such chip 202, interconnection wiring 246 carries signals from points 248 connected to the device area 204 to bond pads 208 of the chip 202. However, the rectangular shape of the chip is not optimum, because a greater number of chips having the same amount of area could be fabricated on a single wafer, and thus, be fabricated more cost-effectively, if the chips had square shape. Moreover, it is more difficult to form interconnections to a package including the chip by way of wire-bonding when the contacts of the package are provided at positions which may vary in two degrees of freedom. For example, as shown in FIG. 4E, the positions of the bond pads 208 of the chip vary vertically along the short edge 244 of the chip 202. Other positions of the bond pads vary horizontally along the long edge 242. These positions of the bond pads 208 of the chip are reflected in corresponding positions of the contacts of a package (not shown), e.g., a capped chip which includes the chip, which are also disposed at different vertical positions along a short edge of the package, and at different horizontal positions along a long edge of the package.

Faster, more effective, and/or higher quality wire bonding can be achieved if the contacts of the package, and thus, the bond pads 208 of the chip are disposed in lines which extend in either horizontal or vertical directions, but not both. In such way, when the wire-bonder forms a bond wire to each location, it is only required to move between respective horizontal locations along each line.

Figure 4F:
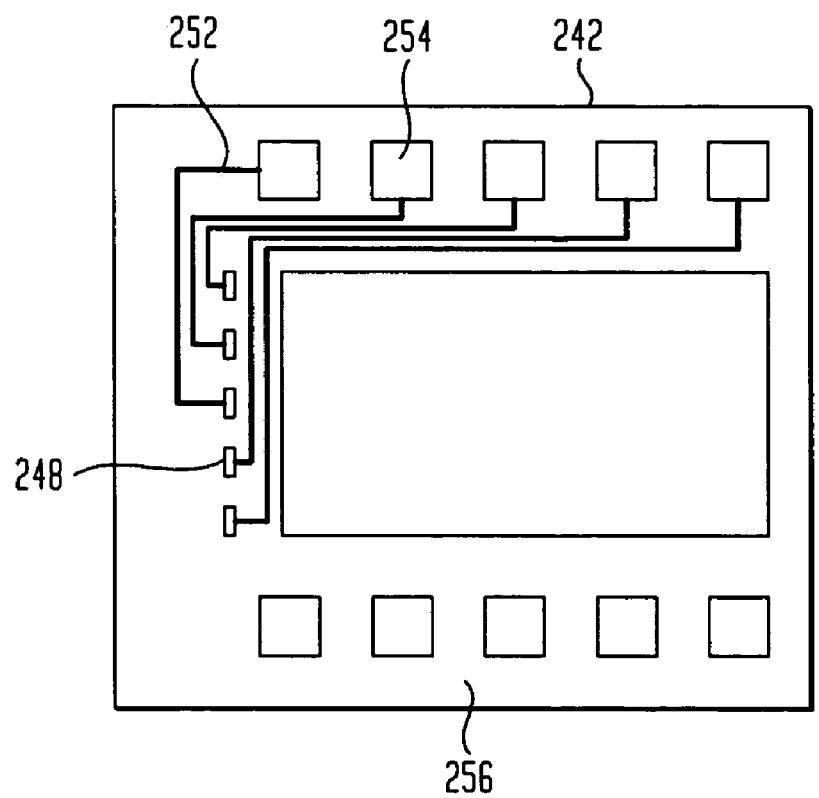
FIG. 4F is a plan view illustrating a layout of a chip which is advantageously packaged according to an embodiment of the invention, the chip having bond pads disposed along only vertical edges or only horizontal edges.

Accordingly, as illustrated in FIG. 4F, in an embodiment of the invention, wiring 252 extends from the connection points 248 to bond pads 254 which are disposed at different horizontal locations along one of the horizontal (long) edges 242 of the chip 256.

The above-described embodiment, showing caps having redistribution traces disposed on the underside of the caps, is desirably employed with chips having a design such as that shown in FIG. 4F, the caps providing any redistribution of signal way that is made necessary by the different layout of the bond pads on the chip.

The flowing on and bonding of a fusible conductive material such as solder in the manner discussed in the foregoing with reference to FIGS. 1–3N and 4A–4B applies to chips which have bond pads that include exposed regions which are wettable by solder or other fusible material. In some types of chips, particularly those having aluminum bond pads, and some types of SAW device chips, the bond pads are not wettable by solder or other such fusible material, in the form that the chips are available when packaged. Aluminum bond pads oxidize under ordinary atmospheric conditions to form a surface layer of alumina which is generally not wettable by a molten mass of solder. On the other hand, some types of wafers, especially III–V compound semiconductor wafers, include bond pads which are formed of or include an outer layer of gold. Here, a different problem exists in that the gold of the bond pad is subject to being dissolved by solder and other fusible materials, which potentially destroys the bond pad to cause an open circuit between the bond pad and the connecting trace.

One way that these concerns is addressed is to specifically form a bonding layer on the bond pads 208 of the wafer prior to joining the cap element to the wafer, the bonding layer being wettable by solder (or other fusible material to be used). Such bonding layer can be formed by a process such as that used for forming an "under bump metallization" ("UBM") on a chip. However, some types of chips, particularly SAW devices, are very sensitive to contamination and can be degraded by processing used to form bonding layers.

Figure 5:
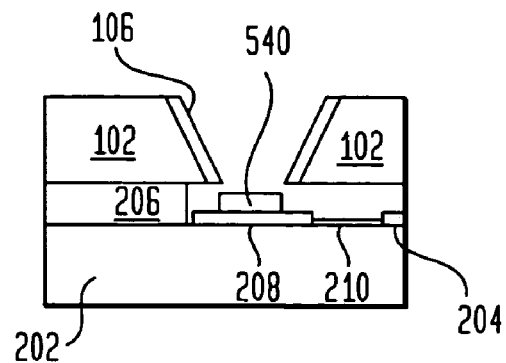
FIG. 5 is a sectional view illustrating a particular embodiment in which a bonding layer of a chip is formed through a cap, after mounting the cap to the chip.

Accordingly, in an embodiment of the invention illustrated in FIG. 5A, such concern is addressed by forming bonding layers on bond pads of a chip or wafer after the cap element has been joined to the wafer. As shown in FIG. 5A, in such embodiment, the joined assembly of the wafer containing the chip 202 and the cap 102 is placed in a chamber in which it is subjected to deposition of one or more materials to form a bonding layer 540, e.g., a UBM on the surface of the bond pad 208. A mask, e.g., a contact mask, may also be positioned over the cap 202 such that only the through holes 104 are exposed during the deposition. Otherwise, the deposited material can be removed from the top surface of the cap 202 after the chip has been joined to the cap and the electrical interconnects 303 have been formed. During such deposition, the cap 202 also functions as a shadow mask to prevent the deposition of the UBM on the device region 204 of the chip 202.

As a result of the deposition, a bonding layer 106 may also be simultaneously formed on the sidewalls 107 of the through holes 104. During such process, dielectric oxide present on the surface of the bond pad 208 is removed.

A limiting factor of the embodiments described above with respect to FIGS. 1–3D is that it requires the solder ball 302 (FIG. 3A) to melt during the reflow process in such way that the meniscus (not shown) of the molten solder ball hangs low enough to touch the UBM coated bond pad 208, and thereby establish a solder bond with the bond pad 208. Whether or not the solder bond is established depends on several factors, including the volume of the molten solder ball, the size of the opening of the through hole 104 which faces the chip, and the height 125 of the spacing between the chip 102 and the cap 101, requiring tolerances on the process to be relatively tight. In addition, such process allows little freedom to choose the height 125 of the spacing between the cap 102 and the chip 202. Desirably, such height is determined by the functionality sought to be obtained by placing the cap over the device area of the chip, such as when the device area includes a SAW device or MEMS device which requires a cavity.

Figure 6A:
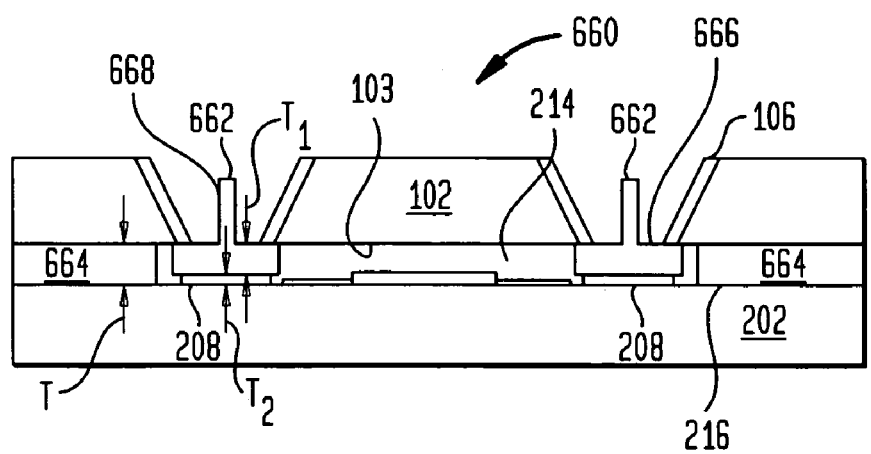
FIGS. 6A–6B are sectional views illustrating a method of forming capped chips having electrical interconnects which include stud bumps.
Figure 6B:
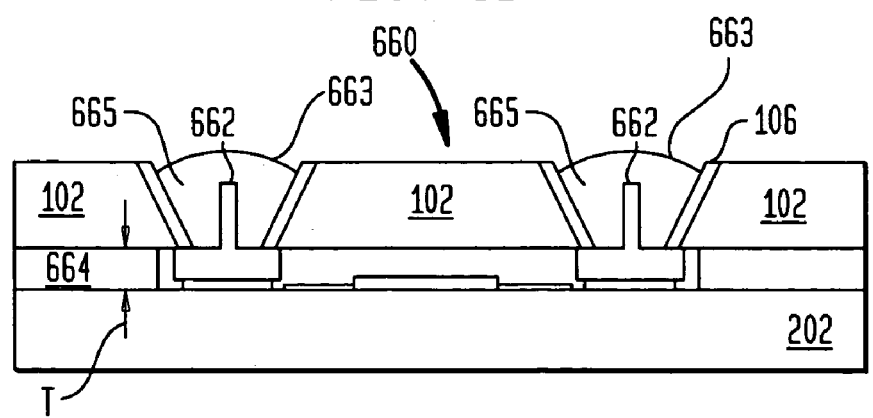

The embodiment, shown in FIGS. 6A–6B addresses this concern. In this embodiment, conductive stud bumps 662 are applied to the bond pads 208 of the chip, which is best performed while the chip is in wafer form. Thereafter, the cap element is aligned to the wafer and sealed thereto. During the alignment step, the stud bumps, particularly if they contain relatively thick shafts, can assist in the process of properly aligning the cap element to the wafer, as the stud bumps 662, when aligned, stick up at least partially through the through holes 106. Stud bumps containing certain metals may be applied directly to bond pads without first applying a bonding layer such as a UBM, thus providing a further alternative way of forming conductive interconnects to bond pads which are not directly wettable by solder. For example stud bumps consisting essentially of one or more of copper, nickel, silver, platinum and gold can be applied this way. When wettable bonding layers are provided on bond pads, stud bumps of solder or other fusible conductive materials can be used.

A process such as that described above relative to FIGS. 3A–3B is then used to form electrical interconnects 663 which include stud bumps and the fusible material so as to extend from the bond pads 208 through the through holes 665. As in the embodiments described above, a sealing medium 664 is provided between the chip 202 and the cap 102. One problem with some sealing media is that it is difficult to control the thickness T of the sealing medium, and thus the thickness of the void 214 between the chip and the cap, simply by controlling the amount of the sealing medium or the amount of pressure applied to locations of the chip after the sealing medium is applied.

This concern is addressed in the embodiment shown in FIG. 6A, in which each conductive stud bump 662 has a shoulder 666, on which the bottom surface 103 of the cap 102 rests, so as to space the bottom surface 103 a distance T from the front surface 216 of the chip. As apparent from FIG. 6A, that distance T includes any thickness T2 of the bond pad 208 which extends above the front surface 216 of the chip, as well as the thickness of the lower 'ball' portion of the stud bump from the bond pad 208 to the shoulder 666.

Figure 7A:
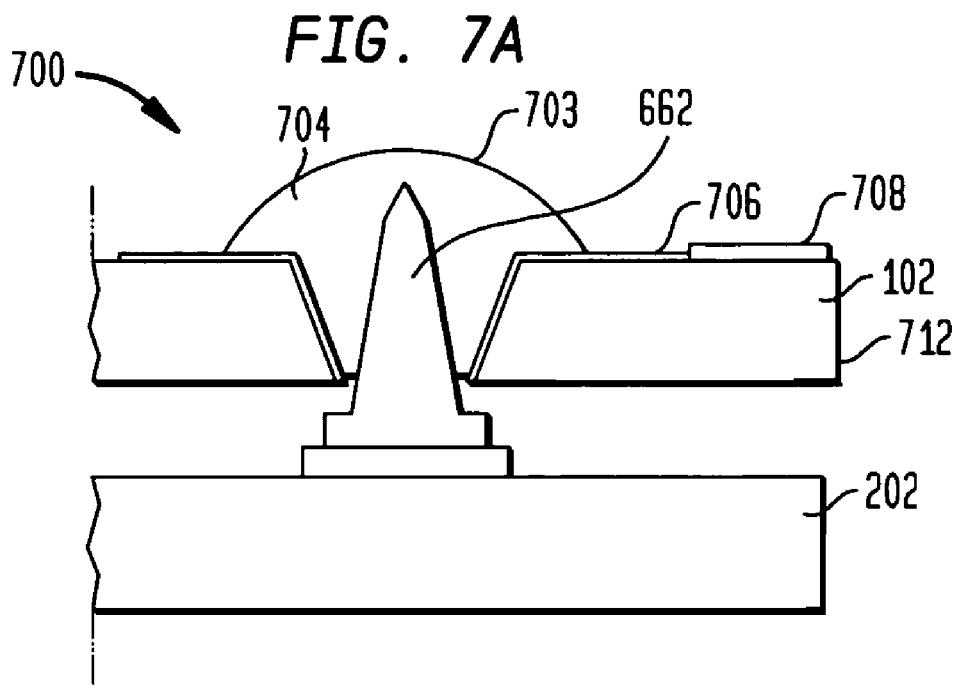
FIGS. 7A–7B are a sectional view and a plan view, respectively, illustrating an embodiment of a capped chip having redistribution wiring traces on the cap.
Figure 7B:
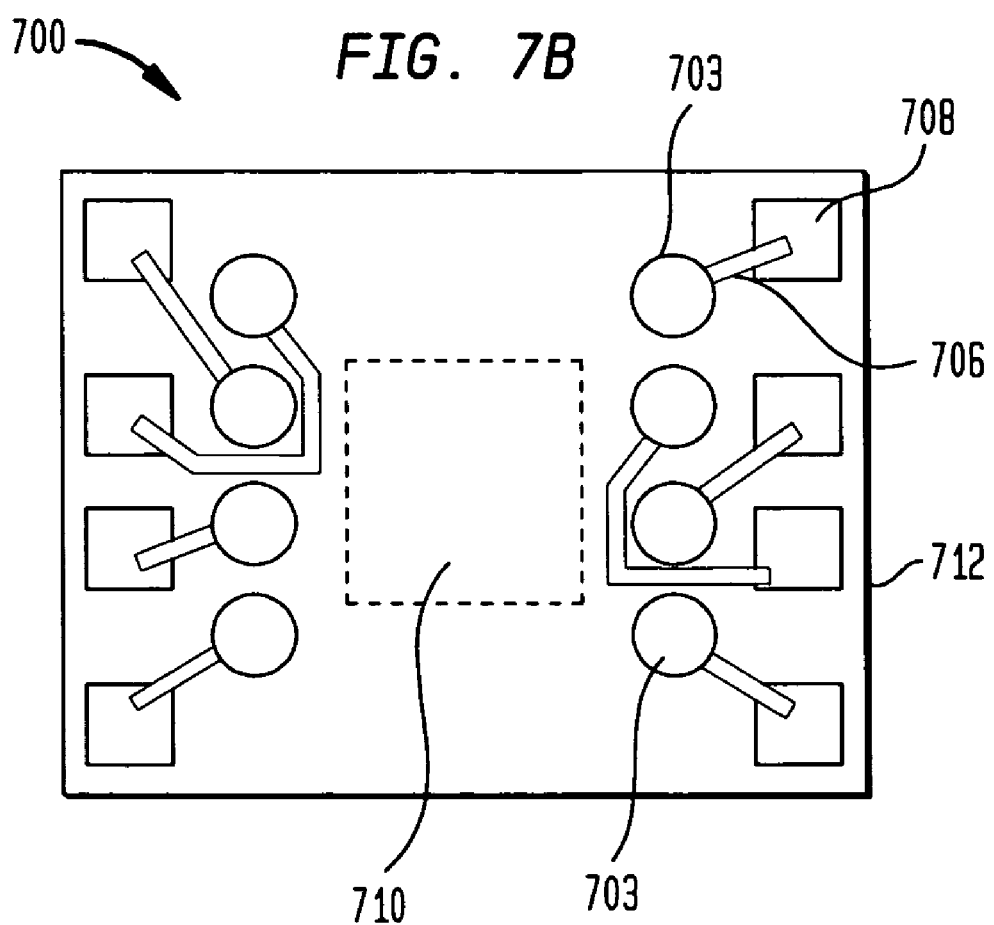
Figure 7C:
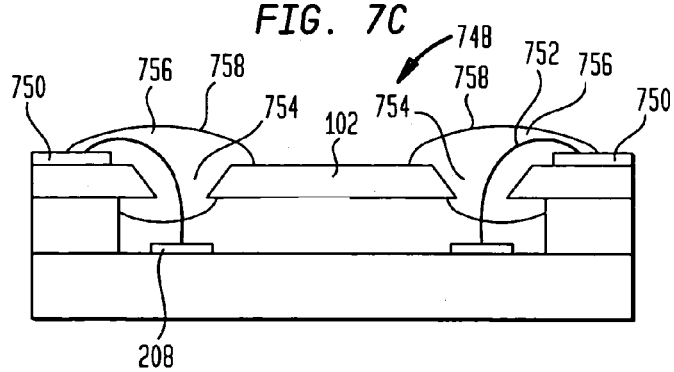
FIGS. 7C–7E are sectional views illustrating embodiments of the invention in which conductive interconnects are provided in form of wire-bonds.

FIG. 7C illustrates a capped chip 748 according to another embodiment of the invention, in which conductive interconnects are provided which include bonding wires 752 which extend from bond pads 208 of the chip 202 through openings 754 in the cap 102 to contacts 750 disposed on the top surface 105 of the cap. The openings 754 can be such as the through holes 104 described above with respect to FIGS. 1–3D, for example, which are sized to accommodate one interconnect per through hole, and to permit the bonding of bonding wires 752 to respective bond pads of the chip. Alternatively, the openings 754 can be bonding windows which are sized and shaped, e.g., extending primarily in one linear direction along the cap, so as to overlie a linearly extending row of bond pads 208 of the chip, and permitting the formation of wire-bonds to each of the bond pads 208 of that row through the opening. While the peripheral edges of the capped chip 748 are sealed by a sealing material 206, in a manner such as that described above with reference to FIGS. 1–3D, an additional sealing material 756 is deposited in contact with the openings 754 of the cap to seal the openings after the bonding wires have been formed. Such sealing material can include, for example, a polymer which hardens to form a nonconductive region for insulating respective bonding wires from each other, while also mechanically supporting the bonding wires. In a particular embodiment, the sealing material 756 is an encapsulant which is disposed as an insulating medium over the top surface 105 of the cap generally, except for the area in which the contacts 750 are located. Alternatively, another insulator such as a glass, e.g., preferably a low-melting point glass, is disposed in each through hole to insulate and support the bonding wire. In a particular embodiment, in which the wire bonds extend through individual through holes 104 which are aligned to the bond pads, a mass of a flowable conductive material such as a conductively loaded polymer or a fusible conductive material is disposed in each opening 754 to seal the opening in place of a polymer. In such manner, enlarged conductive interconnects 758 are formed at the top surface 105 of the cap 102, the interconnects 758 extending across each opening to seal each opening including the area of the contacts 750. In such case, higher level assemblies can be made by forming appropriate electrically conductive bonds to the thus formed interconnects 758.

Figure 7D:
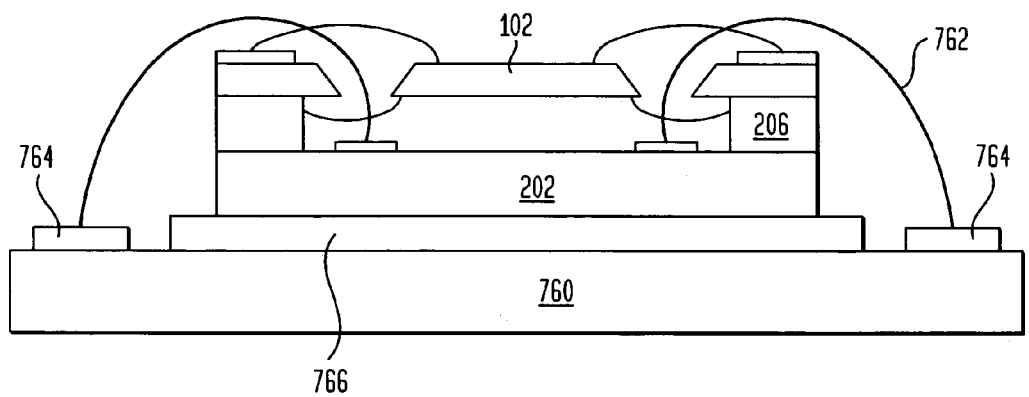

FIG. 7D illustrates a variation of the embodiment described in FIG. 7C in which bonding wires 762 that are joined to the bond pads 208 of the chip are not bonded to contacts on the cap. Instead, the chip is bonded by bonding wires in a face-up orientation to contacts 764 of a packaging element 760, e.g., any of many types of dielectric elements and substrates which have conductive traces thereon. Advances in the capability of wire bonding machines now permit bonding wires to be formed which have relatively complex profiles, and to be formed reliably and repetitively. Thus, FIG. 7D illustrates an example in which the bonding wire 762 is formed to extend directly between a bond pad of the chip and a secondary packaging element, e.g., a dielectric panel, or circuit board, which is farther away from the bond pad 208 than that shown and described above in FIG. 7C. In this embodiment, the cap 102 is preferably an at least partially optically transmissive element, that term denoting an element which is either somewhat translucent or transparent to light in a range of wavelengths of interest. More preferably, the cap 102 is transparent, consisting essentially of a material such as a glass or a polymer, which can be molded,. In a particular embodiment, the cap 102 is molded to contain an optical element, e.g., a lens, such as the caps and optical elements described in commonly assigned, co-pending U.S. patent application Ser. No. 10/928,839, filed Aug. 27, 2004, of which this application is a continuation-in-part.

In this embodiment, the formation of the bonding wires to bond the chip to the packaging element 760 is done after the cap 102 is affixed to the chip 202 by the sealing material 206, and the chip is mounted to the packaging element, such as by an adhesive 766, e.g., an adhesive commonly known as a "die attach" adhesive. Alternatively, a thermal conductor can be mounted between the chip 202 and the cap 102 for conducting heat away from the chip and onto a thermal conductor mount provided in the packaging element, such as described in commonly assigned, co-pending U.S. patent application Ser. No. 10/783,314 filed Feb. 20, 2004, the contents of which are hereby incorporated by reference herein. In a particular embodiment, the chip is bonded, in a "chip-on-board" configuration) to a circuit panel, e.g., a printed circuit board or flexible circuit panel, in place of the packaging element 760.

The above-described embodiment shown in FIG. 7D can be especially advantageous for the packaging of chips which include optically active elements, for example, image sensors. Such sensors are especially vulnerable to dust or other particle contamination which is most likely to occur after the chip has been fabricated. Dust or other particles which settle directly on the imaging are of the chip can obscure a portion of the pixels of the active imaging area, thus rendering the chip unusable. The method provided in this embodiment reduces the risk of such contamination by providing a protective optically transmissive cover over the chip prior to performing subsequent higher-level packaging operations.

Figure 7E:
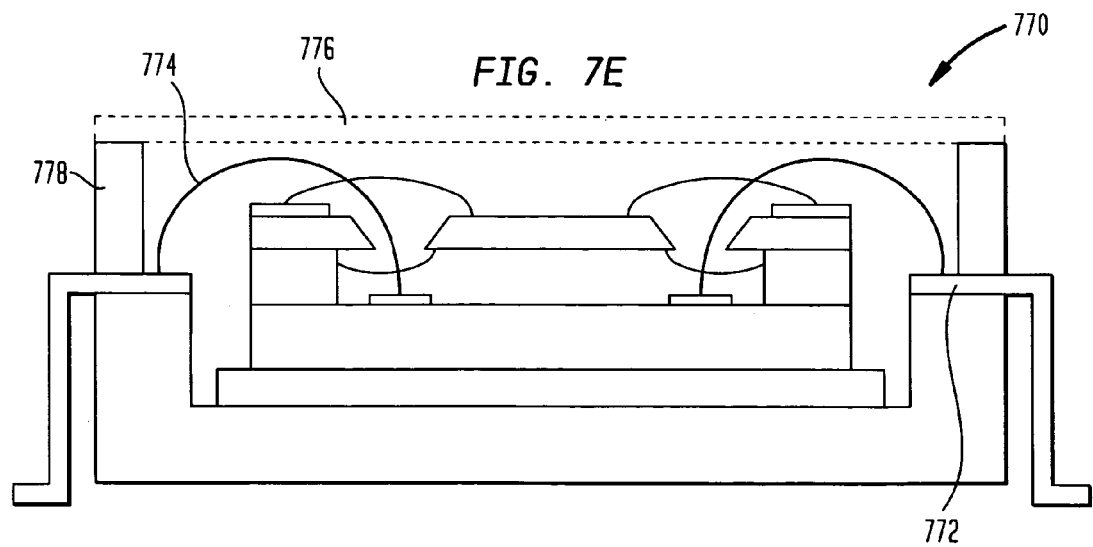

In another embodiment, as illustrated in FIG. 7E, bonding wires 774 extend from bond pads 208 of the chip to bonding shelves 772 of a gull-wing package 770. This packaged chip preferably includes an optically active chip and an optically transmissive cover 202, such as that described above with respect to FIG. 7D. An additional package lid 776 is mounted to vertical members 778 of the package, the package lid 776 desirably also being at least partially optically transmissive, and preferably being transparent.

In a particular embodiment, as shown in FIG. 7A, a unit 700 includes a conductive interconnect 703 which include a stud bump 662 and a conductive material 704 that seals the stud bump to the cap 102. In this embodiment, the conductive material 704 is a conductive organic material such as a conductive adhesive or conductive sealant. A conductive organic material which is curable at room temperature or a slightly elevated temperature is advantageously used when the material of which the cap is formed is not CTE matched to the chip. In such manner, conductive interconnects 703 can be made to the unit 700 without inducing strains in the chip or cap due to CTE mismatch.

As further shown in FIG. 7A, and in the plan view in FIG. 7B, the unit 700 may further include a plurality of such conductive interconnects 703, which are connected by redistribution or fan-out traces 706, to respective conductive contacts 708. In such manner, signals coming off of the chip 202 are redistributed through the conductive interconnects 703 and the traces 706 to the contacts 708 which lie at a farther distance away from the device region 710 and closer to the edges 712 of the capped chip 700.

Figure 8A:
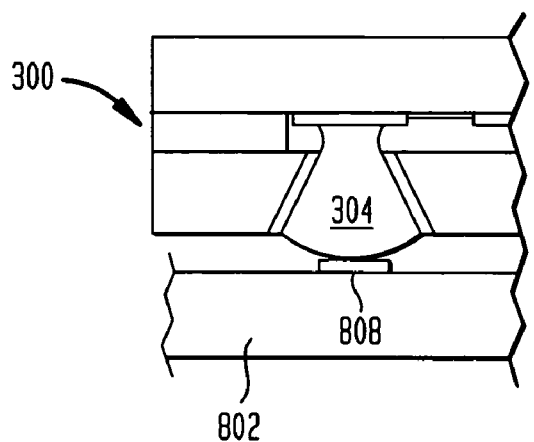
FIGS. 8A–11B are sectional views illustrating various methods of mounting a unit including a capped chip to a circuit panel.
Figure 8B:
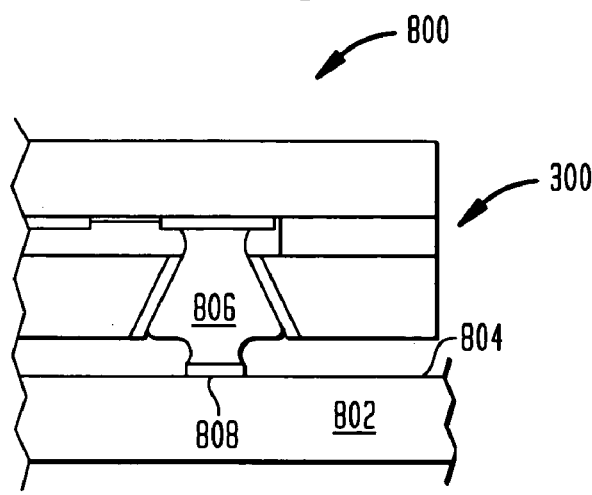

As shown in FIGS. 8A and 8B, once a unit 300 including a capped chip has been formed, it may then be aligned to and surface mounted to a printed circuit board (PCB) or other type of circuit panel 802 to form an assembly 800. FIG. 8A shows the unit 300 having the fusible material 304 of the interconnect aligned to a terminal, e.g., a land 808 of the circuit panel 802. FIG. 8B illustrates the resulting assembly 800 after heating to cause the fusible material to be bonded to the terminal 808 of the circuit panel 802. While flux is generally utilized for the purpose of joining materials in an oxygen-containing environment, the joining process can be performed fluxlessly, under conditions which inhibit contamination, i.e., by joining the unit 300 to the circuit panel 802 in the presence of a non-oxygen containing environment such as nitrogen, argon, or a vacuum, for example.

Figure 9A:
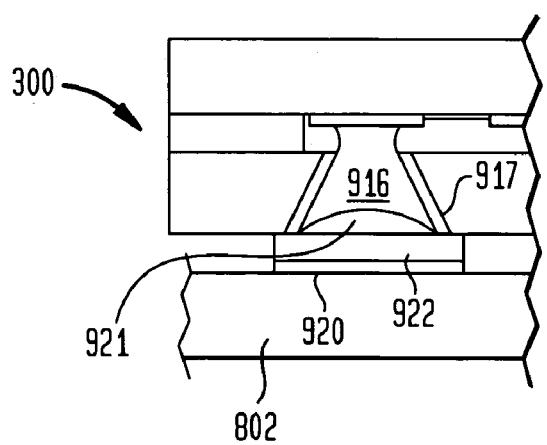
Figure 9B:
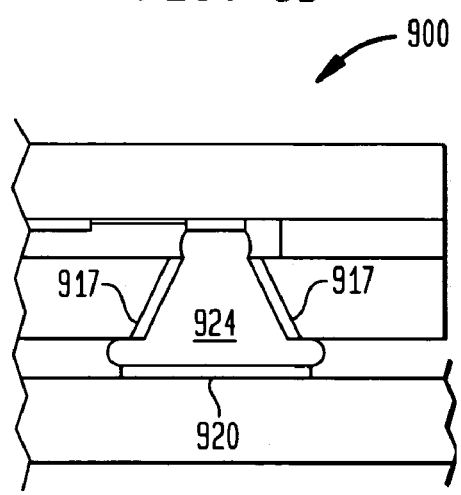

In accordance with some surface mounting practices, extra solder can be applied to the circuit panel prior to mounting the unit to increase the volume of solder available to make the connection. Such pre-forms of solder can be applied to the terminals of the circuit panel with flux, if needed, prior to mounting the unit. FIGS. 9A and 9B illustrate such technique. As illustrated in FIG. 9A, due to the process used to make the capped chip unit 300, the fusible material 916 provided on the bonding layer 917 of the through hole of the unit 300 does not completely fill the through hole, but leaves a void 921 in a portion of the through hole above the circuit panel 802. By providing a pre-form 922 of additional solder or other fusible material on the terminal 920 of the circuit panel 802, sufficient solder is provided to provide a reliable connection between the unit 300 and the circuit panel. FIG. 9B illustrates the assembly 900 formed by the unit and the circuit after heating to cause the solder contained in the pre-form and in the through hole to melt and join, being drawn into the through hole to form connection 924 to terminal 920. As a result of the added solder from the pre-form, a bulked up solder connection 924 is provided which is sufficient to establish a connection to the terminal.

As an alternative to that described above, the solder pre-form can be provided for use in hierarchically soldering the unit to the circuit panel. Stated another way, the conductive interconnects of the unit 300 can be formed using a solder or other fusible material which melts at a higher temperature than the solder used to join the unit 300 to the circuit panel, such that the original higher temperature material does not melt and reflow during the subsequent joining operation.

Figure 10A:
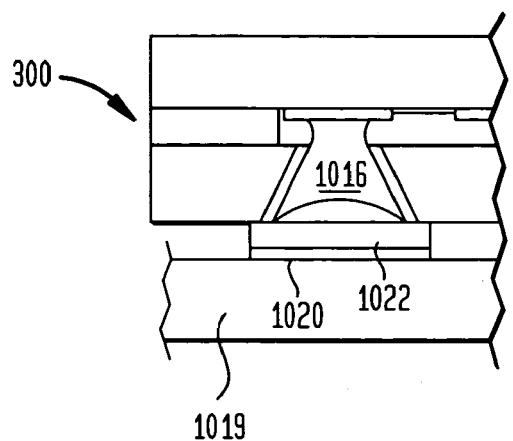
Figure 10B:
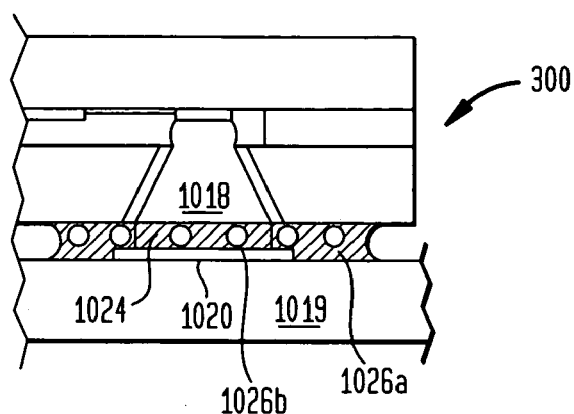

FIGS. 10A and 10B illustrate another method for joining the unit 300 to a circuit panel to form an assembly 1000, in which a conductive adhesive 1022 is used to conductively join the unit 300 to a land 1020 of the circuit panel 1019. FIG. 10A illustrates a stage after which the unit 300 has been placed in alignment with the circuit-panel 1019, such that the solder 1016 in the through hole is positioned over the land 1020. FIG. 10B illustrates a subsequent stage after the unit has been pressed into contact with the land 1020, causing the conductive adhesive to at least substantially fill the through hole to form a connection 1018. However, as also shown in FIG. 10B, a certain amount of the conductive adhesive 1024 flows off the land 1020 onto other areas of the circuit panel. For this reason, in order to avoid the making of electrical connections in places where they are not desired, the conductive adhesive is desirably an anisotropic conductive adhesive 1024, as shown in FIG. 10B. Such anisotropic conductive adhesive contains discrete conductive particles 1026, such as conductive spheres that are normally spaced from each other by a fluid medium used to carry them. When pressed between two objects at a spacing equal to the width of the sphere, the conductive spheres provide an electrical connection between the two objects. However, due to the lateral spacing between the conductive spheres, no substantial electrical connection is provided in a lateral direction which runs between the surfaces of the two objects.

Figure 11A:
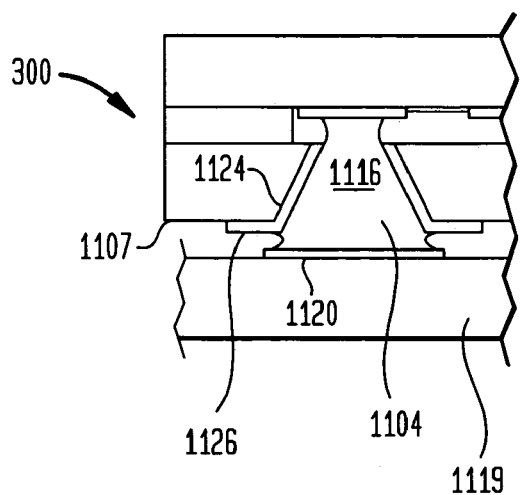

FIG. 11A illustrates a variation of the embodiment shown above in which the unit 300 includes a bonding layer 1124 which extends from inside the through hole 1104 to have an extension 1126 extending on the mounting face 1107 of the unit 300. The extension 1126 is preferably provided as an annular ring surrounding the through hole 1104. The extension 1126 provides additional surface area for retaining solder 1116, prior to and after the unit 300 is bonded to the circuit panel 1119. The extension 1126 and a larger amount of solder adhering thereto on the unit 300, can mitigate against having to provide additional solder on the terminal 1120 of the circuit panel, as discussed above with respect to FIG. 10A.

Figure 11B:
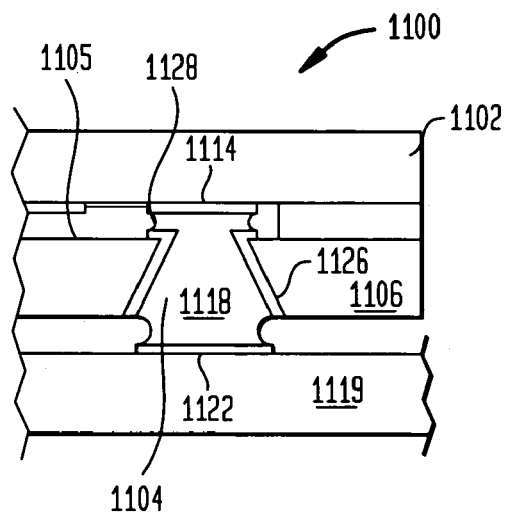

FIG. 11B illustrates yet another variation in which unit 300 includes an extension 1128 of the bonding layer 1126 on the surface 1105 of the cap 1106 which faces the chip 1102. During the joining process of the cap to the chip, the extension 1128 draws solder from inside the through hole 1104 onto itself to bring it closer to the bond pad 1114 of the chip 1102. This, in turn, assists in forming the bond between the cap 1106 and the chip 1102.

FIGS. 12–17 illustrate a particular variation of the process described above with respect to FIGS. 1–3D and 8A–8B, or one of the alternatives shown in FIGS. 9A–11B for making a unit and joining it to a circuit panel. A "lid", like the "cap" described in the foregoing, refers to an article that is mounted as a cover over the front surface of a chip.

Some types of chips, particularly chips which include an electro-optic device, need to be packaged with a cap which is at least partially optically transmissive. The term "optically transmissive" is used to refer to a material that is either optically transparent or optically translucent in a range of wavelengths of interest, whether such wavelengths of interest are in a visible, infrared or ultraviolet range of the spectrum. For example, electro-optic imaging chips including charge-coupled device ("CCD") arrays require a lid which includes an optically transmissive package window, in order to prevent dust or other particles from landing on the CCD array, which would optically impair and obscure pixels of the CCD array. Such lid can also be used to protect against damage due to corrosion by atmospheric contaminants, particularly water vapor. The lid can be of any suitable optically transmissive material, including but not limited to glass, polymer and semiconductors. After the chip is joined to the lid, a turret or train assembly containing a lens, and optionally infrared (IR) and/or ultraviolet (UV) filters is joined to the lid, e.g., as by welding, adhesive bonding or use of a fusible material such as solder.

In this variation, a sacrificial coating is applied to a surface of a lid prior to joining the lid to a chip, in order to protect the lid against contamination. The sacrificial coating is then removed later, after steps are performed to join the lid to the chip to form a unit to join that unit to a circuit panel. As above, while the process is described here in terms of joining a lid to a chip, it should also be understood, with appropriate modifications, to apply to the joining of a lid element containing multiple attached lids to a wafer or other substrate which includes multiple attached chips, after which the joined lid element and wafer are severed along dicing lanes to form individually lidded chips.

Figure 12:
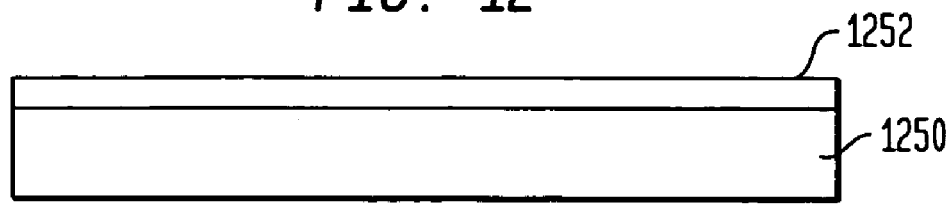

When a lid is joined to a chip by one of the above-described processes, steps to bond the lid to the chip can introduce contaminating material. Thereafter, steps to join the lidded chip to a circuit panel can introduce further contaminating material. Contamination can result from the environment in which the chip is packaged or, from the nature of the process itself that is used to perform the joining processes. For example, a joining process that involves solder with flux can produce residual material that is undesirable to leave on the surface of the cap. Other methods of bonding a lidded chips Accordingly, as shown in FIG. 12, a sacrificial coating 1252 is applied to the surface of an optically transmissive lid 1250. The sacrificial coating 1252 is a material which can be applied and remain through the steps of bonding the lid to the chip, but then be removed to leave the surface of the lid in a clean condition without degrading the condition of the joints of the assembly. In the embodiment shown in FIG. 12, the sacrificial coating includes a photosensitive resist film, suitable for use in subsequent photolithographic patterning of the lid. Such resist film is best chosen with regard to the etchant which will be used to pattern the material of the lid, which can vary between inorganic materials such as glasses and organic materials such as polymers. For example, an etchant such as fluorosilicic acid is suitable for patterning a lid which is formed of glass, especially lids which are formed of a glass which has been doped to facilitate chemical etching such as borosilicate glass. In such case, a spin-on photoresist or hot roll laminate photoresist is suitable for use in etching of glass. Such photoresists are also not degraded by temperatures at which solders melt, nor by fluxes used in soldering processes. However, such photoresists are also readily dissolved and cleared from a surface through organic solvents.

Figure 13:
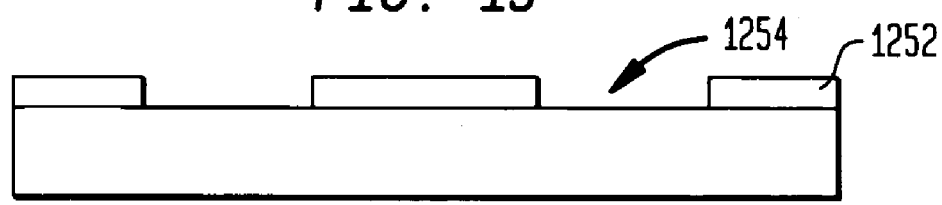
Figure 14:
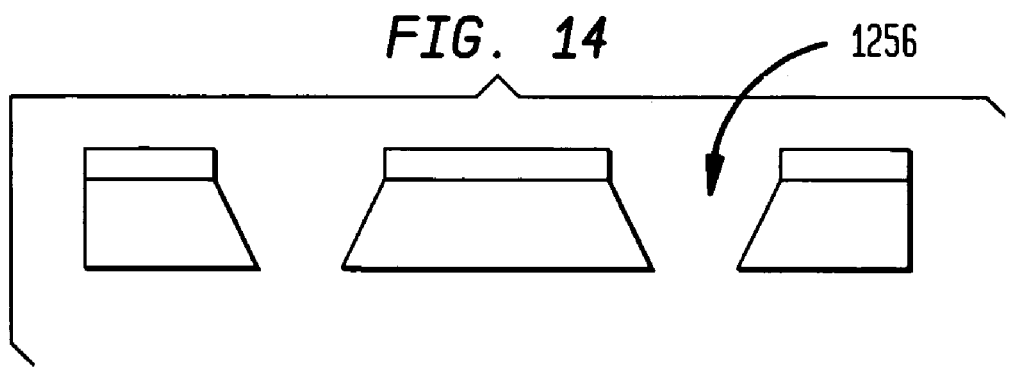

FIG. 13 illustrates the patterned photoresist film 1252, after it has been exposed and developed to produce openings 1254 in the photoresist layer 1254. Thereafter, as shown in FIG. 14, the lid is etched, using the patterned photoresist film as a mask to produce through holes 1256.

Figure 15:
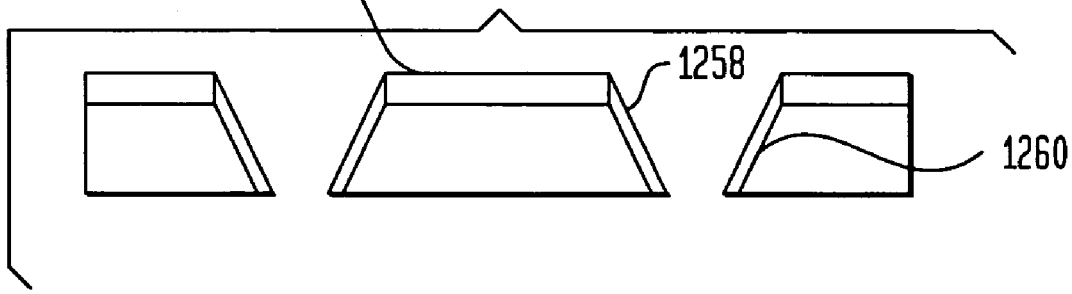

Thereafter, as shown in FIG. 15, further steps are performed to deposit bonding layers 1258 on the sidewalls 1260 of the through holes. The bonding layers 1258 are provided for the purpose of permitting a fusible material such as solder, tin, etc. to be bonded to the through holes of the lid

1256, in a manner as described above with respect to FIGS. 1–3D. During the deposition, a contact mask may be placed over the photoresist film 1252 as needed, to prevent the photoresist film from being sealed within the bonding material, which might interfere with its later removal depending on the type of resist. Such bonding layer is provided, for example, by deposition including electroless plating or electroless plating followed by electroplating. Alternatively, the bonding layer is provided through vapor phase deposition, i.e., any one of many deposition processes such as physical vapor deposition (PVD), chemical vapor deposition and the like.

A subsequent stage of fabrication is shown in FIG. 16, after the lid 1250 has been joined to a chip 1264 by a set of electrically conductive interconnects 1262, and after the interconnects of the lidded chip have been joined to a circuit panel 1264. The circuit panel 1264 includes an opening 1266 or, alternatively, a window consisting of an optically transmissive material, disposed in alignment with the electro-optic device 1268 of the chip 1264 to provide an optically transmissive path to and from the electro-optic device 1268. The circuit panel 1264 can be of any type, being either rigid, semi-rigid, or flexible. In one embodiment, the circuit panel 1264 is flexible and has a flexible dielectric element on which conductive traces are disposed.

As also shown in FIG. 16, one result of the prior joining processes is unwanted residual matter 1270, e.g., particles, flux or adhesive residue, etc., that remains on the surface of the photoresist film 1252. As illustrated in FIG. 17, the residual matter is then removed in steps used to remove the photoresist film, such as through washing of the assembled circuit panel and the lidded chip in an organic solvent in which the film is soluble. This results in an assembly 1272 in which the contaminating material has been removed, and which is now ready for steps to provide a higher order assembly. Thereafter, a turret, train or other optical element, may be mounted above the opening 1266 in the circuit panel 1264.

The process shown and described above can be modified in several alternative ways. In one alternative process, the lid is patterned by laser drilling rather than chemical etching. The laser drilling is performed after the sacrificial coating is applied, at which time material ejected from the drilled openings collects on the sacrificial coating. Thereafter, the ejected material is prevented from contaminating the lid when the sacrificial coating is removed from the surface of the lid.

In another embodiment, the sacrificial coating need not be a photoresist film and the coating need not patterned to provide a mask for etching through holes in the lid. Rather, in such embodiment, the sacrificial coating is provided on a face of the lid, and thereafter, the lid is mounted to the chip, such as through a sealing medium or fusible conductive medium as described above. The lidded chip is then mounted to an additional element such as a circuit panel, or alternatively, a turret, or 'train', as described above. Thereafter, the sacrificial coating is removed, removing with it residual matter remaining from the prior steps used to mount the lid to the chip and the lidded chip to the additional element.

In a particular form of such embodiment, the sacrificial coating is one that is mechanically releasable from the surface of the lid, such as by peeling. For example, such film can be provided of an adhesively backed plastic, polymeric film capable of withstanding the processes used to join the lid to the chip and that which joins the combined unit to another element. For example, materials such as those used in the adhesive of removable self-stick notepaper and in food-wrap film appear suited for this purpose. Alternatively, the peelable film can be a metal such as molybdenum or other metal or other rigid or semi-rigid polymer.

A limiting factor of the embodiments described above with respect to FIGS. 1–3D, for example, is that the lateral spacing between adjacent through holes might not be optimal. Increasing integration density of chips and corresponding decreases in the spacing between adjacent bond pads of a chip demand that a cap to be mounted to the chip have correspondingly decreased spacing between interconnects. Referring to FIG. 3C, the through holes 104 of the cap 102 are shown tapered only from the top surface 105 of the cap, such that a sidewall 107 (FIG. 1) is oriented at an angle typically ranging from about 5 degrees to 70 degrees from the vertical (the vertical being the direction which is normal to the top surface 105). More preferably, the angle of the sidewall (FIG. 1) to the vertical is between 20 degrees to 60 degrees and, most preferably at an angle between 30 degrees and 60 degrees, such that the diameter of the through holes 104 varies between a smaller diameter 330 at the bottom surface 103 and a larger diameter 335 at the top surface 105. Typically, a wet chemical etching process applied to the cap wafer 100 which consists essentially of silicon results in the sidewall 107 making an angle to the vertical of between 20 and 60 degrees. However, laser drilling is another process used to form through holes in a cap wafer which is provided, for example, of silicon, glass, ceramic or other similar material, typically results in an angle of 7 degrees relative to the normal. The angle that the sidewall makes with the top surface 105 is desirably made small, in order to reduce the amount of area occupied by each interconnect, due to the increased pitch of through holes that have a larger angle, as is described in more detail below with reference to FIG. 18. The variation in diameters between the through hole at the top surface 105 with respect to the bottom surface 103 assists the fabrication method as a way of initially holding the solder ball 302 (FIG. 3A) (which is larger than the smaller diameter 330) in place inside the through hole 104. Depending upon the thickness of the cap 102, which, illustratively, ranges between 100 and 300 μm, and the smaller diameter 330 of the through holes, which is typically on the order of 70 to 100 μm, the larger diameter 335 of the through holes may range from twice as large to many times larger than the smaller diameter 330.

Figure 18:
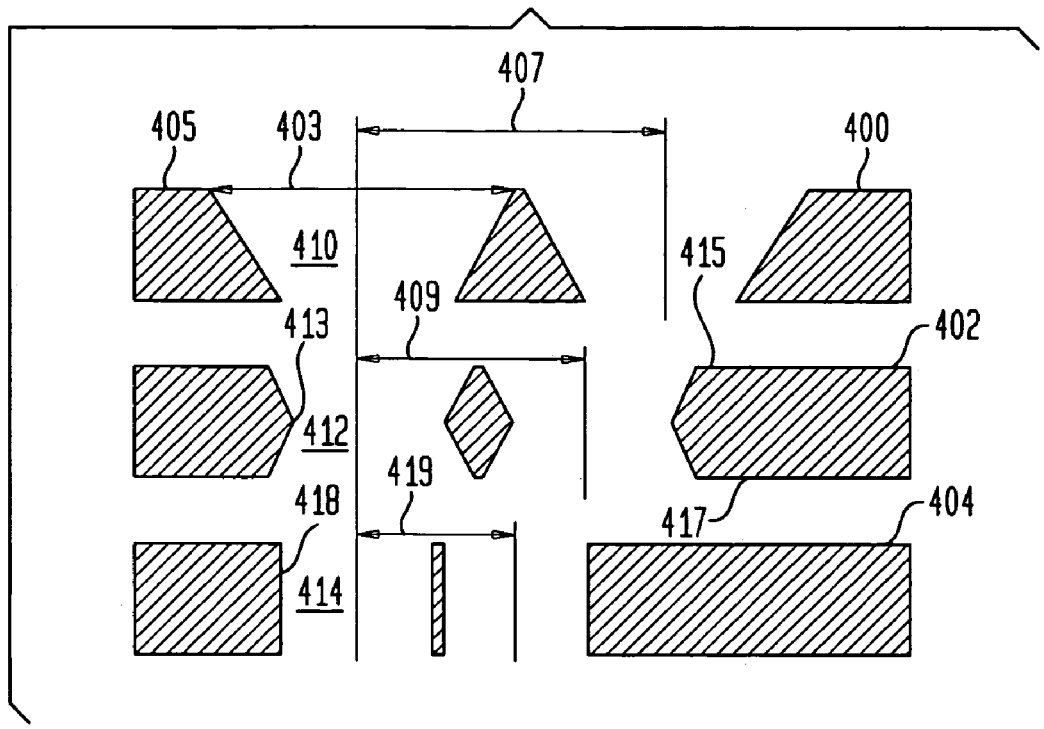
FIGS. 18–23 are sectional views illustrating stages in a method of making capped chips in which conductive features of the chips assist in self-locating the cap element.

When considered in terms of forming interconnects to closely spaced bond pads 208 of a chip 202, it is seen that the larger diameters 335 of the through holes at the top surface 305 of the cap may well limit the spacing at which such interconnects 303 can be made. This concept is best illustrated with respect to FIG. 18. FIG. 18 illustrates three individual caps 400, 402 and 404, respectively, in which through holes 410, 412, and 414, respectively, have been patterned differently, and in which the pitch between adjacent through holes varies significantly according to the method used to pattern the caps. Thus, cap 400, having through holes 410 which are tapered from only one surface, i.e., the top surface 405, has the largest pitch 407, because of the large diameter 403 of the through holes 410 that exist at the top surface 405. Through holes are ordinarily tapered from one surface of the cap by isotropic etching from that one surface. On the other hand, cap 402 has smaller pitch 409 because its through holes are tapered from both the top surface 415 and the bottom surface 417 of the cap 402, such that the profile of the through holes includes an internal edge 413. Such taper is typically achieved by etching the through holes 412 simultaneously and isotropically from both the top and bottom surfaces of the cap 402. In some cases, depending upon the degree to which the through hole is etched in a lateral direction (being the direction parallel to the diameter 409) the internal edge 413 can acquire the appearance of a "knife edge". Cap 404 illustrates a case in which through holes 414 are patterned without tapering, having straight, vertical sidewalls. The pitch 419 of through holes 414 of the cap 404 is the smallest of the pitches 407, 409, 419, because of the straight, vertical profile of the through holes 414.

However, the profiles of the through holes of cap 402 and cap 404 are such that they do not permit the same techniques to be used as described above relative to FIGS. 1 through 3D when joining the cap 402 or 404 to a chip. Solderable metallizations cannot be easily provided on sidewalls of the through holes 412 of cap 404 by the patterning processes described above, which are conventionally used in conjunction with vapor phase deposition and wet electro-chemical processes to make the tapered through holes as described above relative to FIGS. 1 through 3D. These patterning processes cannot be performed from just the top surface 415 or the bottom surface 417 of the cap, because patterning will be achieved only on surfaces that face up, i.e. only the surface of the through hole above the internal edge 413 and upward, including the top surface 415 of the cap 402. This precludes the portion of the through hole below the internal edge 413, i.e., facing towards the bottom surface 417 from being properly metallized. In the case of cap 404, the vertical, straight profile of the sidewall 418 of the through hole 414 makes it difficult to achieve a suitable metallization. However, in the case of cap 402, the knife-edge through hole profile can still be used to form a capped chip having electrical interconnects which include stud bumps extending from the bond pads, similar to that described above in relation to FIG. 6A. In such case, only the portion of the through hole 412 that is tapered towards the top surface 415 need be metallized. This requires the stud bump (662 in FIG. 6A) to protrude upwardly through the through hole 412 past the knife-edge 413 in the cap 402. On the other hand, the necessity for the through hole 412 to have a bonding layer 106 (FIG. 6A) on the sidewall thereof is diminished if another flowable conductive medium such as an organic medium is used in place of the solder.

Figure 19:
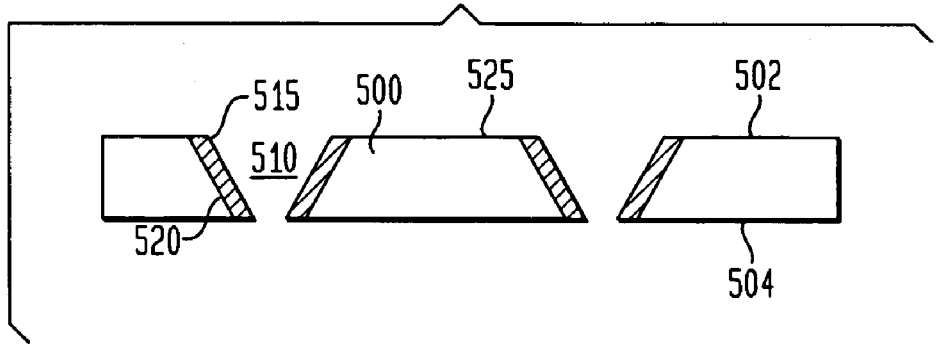
Figure 20:
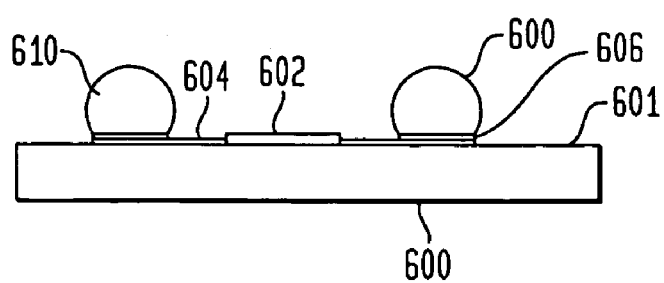
Figure 21:
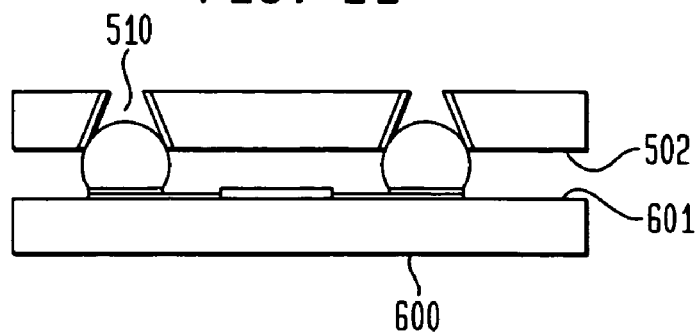
Figure 22:
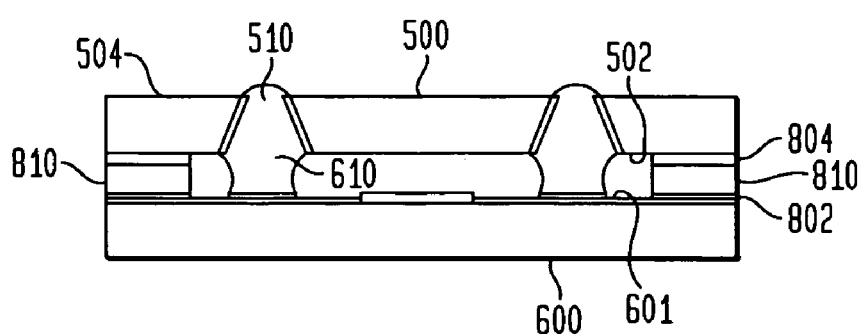

FIGS. 19 through 22 illustrate stages in a method of joining a cap to a chip according to one embodiment of the invention. FIG. 19 shows a cap 500 in an inverted position during fabrication, the cap 500 having a bottom or inner surface 502, a top or outer surface 504, and through holes 510. These designations of the bottom (inner) and top (outer) surfaces refer to the orientation in which the cap will be mounted to the chip, when steps to complete the bonding of the cap to the chip are performed, as shown in FIGS. 21–22. In this embodiment, the through holes are preferably tapered so as to become progressively smaller from the bottom surface toward the top surface. As such, the tapered through holes are substantially frusto-conical in shape. The tapering of the through holes 510 is not absolutely necessary. Tapered through holes assist in achieving some of the potential benefits available by the joining process, as will be apparent from the description below.

In this inverted position, solderable metallizations 515 are formed on the sidewalls 520 of the through holes 510, as by conventional vapor-phase or wet electro-chemical processing directed towards the bottom surface of the cap 500, as described above. In one embodiment, the solderable metallizations optionally extend onto a portion 525 of the bottom surface of the cap 500 surrounding each through hole.

FIG. 20 illustrates processing performed to a chip 600 to which cap 500 is to be mounted, the chip having solder-wettable bond pads 606, a device region 602 and wiring 604 interconnecting the device region 602 to the bond pads. A conductive ball 610 is placed on each metallized bond pad, preferably by a fluxless process, in order to avoid flux vapor and residue therefrom from potentially contaminating features at the surface of the chip 600, e.g. the device area 602. A process is then conducted to bond the conductive ball 610 to the chip 600. In a preferred embodiment, the conductive ball is a solder ball, consisting essentially of a solder or other fusible conductive material, e.g., one or more of tin, lead, or eutectic composition or layered arrangement of such metals or other metals, which is adapted to generally soften or liquefy upon being heated to a reflowing temperature, which is relatively low. FIG. 20 illustrates the chip after a solder ball 610 has been placed on each bond pad 606 and bonded thereto by a process which is characterizable as "reflowing". After reflowing, the solder balls typically retain a shape that is essentially spherical. The temperature of the solder balls is then lowered again for the performance of a subsequent step in which the cap 500 is aligned to the chip 600.

FIG. 21 illustrates such further stage in the process. In this stage, the chip 600 is placed such that the front surface 601 faces up. The cap 500 is turned over, such that the bottom surface 502 of the cap now faces down, toward the front surface 601 of the chip 600. At this stage, the metallized substantially frusto-conical through holes 510 of the cap 500 assist in aligning the cap 500 to the chip 600 in a self-locating manner. This occurs as follows. Rough alignment is achieved between the cap 500 and the chip 600, such that any misalignment is less than the spacing between the centerlines of the through holes. If the cap 500 is then allowed to rest on the chip 600, the through holes 510 will align themselves to the solder balls 610, causing the through holes of the cap 500 to drop down onto the solder balls 610, thus self-locating the through holes 510 to the solder balls 610. Misalignment between the cap 500 and the chip 600 is subject to variation in two horizontal degrees of freedom (X) and (Y), in three rotational degrees of freedom: turning in the horizontal plane (yaw), forward or backward tilt (pitch) and side-to-side tilt (roll), and in a vertical degree of freedom, i.e. vertical displacement (Z). The self-locating mechanism described herein aligns the cap to the chip with respect to all of these degrees of freedom at the time that the cap 500 is placed on the chip 600.

In the stage shown in FIG. 22, a process is conducted to bond the conductive balls 610 to the metallizations provided in the cap 500. When the conductive balls are solder balls 610, this is preferably conducted as a reflowing process, which causes the material of the solder balls 610 to be drawn further into the through holes 510. As a result of this reflowing process, the solder balls 610 preferably extend somewhat above the top surface 504 of the cap 500. As also shown in FIG. 22, the cap 500 is desirably sealed to the chip 600 by a sealing material 810 which surrounds the device region and the region which includes the bond pads of the chip 600. The sealing material preferably includes a material such as that described above with reference to FIG. 2A.

Figure 23:
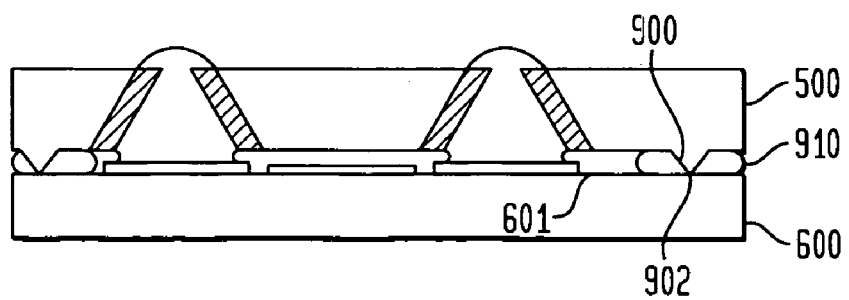

During such reflowing process, due to the fluid nature of the solder balls 610, means preferably are provided for maintaining a desirable vertical spacing between the opposed surfaces 502, 601 of the cap and the chip. In one embodiment, one or more spacer elements are incorporated into the sealing material. For example, an adhesive sealing material can include spherical or fibrous elements which deform little, thus maintaining a predetermined spacing between the opposed surfaces. In a particular embodiment, a spacer structure is incorporated into one or the other of the cap and the chip. For example, as shown in FIG. 23, a spacer may take the form of a ridge 900 formed as part of the cap 500, the ridge 900 having a knife-edge 902, which is allowed to rest on the front surface 601 of the chip 600. A sealing material 910, such as an adhesive, can be disposed in contact with the ridge 900, as shown in FIG. 23. Otherwise, the sealing material can be displaced from the location of the ridge 900. The ridge 900 allows the cap 500 to be pressed to the chip, e.g., pressure clamped, during the joining process for any of the above-listed sealing materials, while the ridge maintains a desired spacing between the cap 500 and the chip 600. When the above processing is performed simultaneously on an array of attached chips and attached caps, the packaged chips are thereafter diced, i.e., severed into individual packaged chips.

Figure 24:
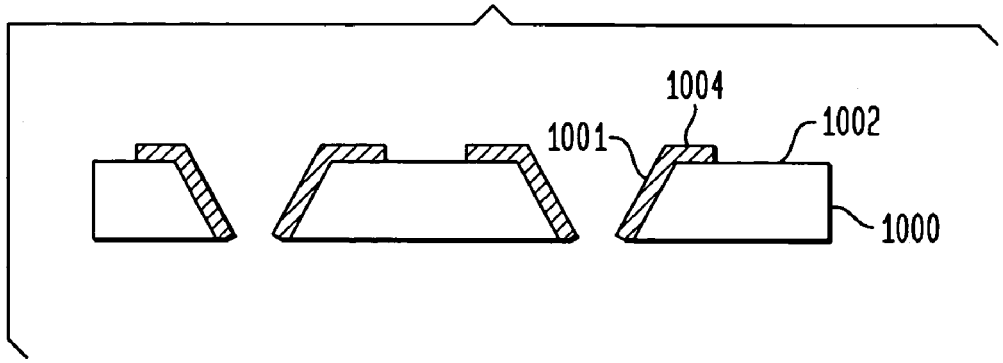
FIGS. 24–26 are sectional views illustrating a variation of the embodiment shown in FIGS. 18–23 in which the conductive features include conductive spheres having solid cores.
Figure 25:
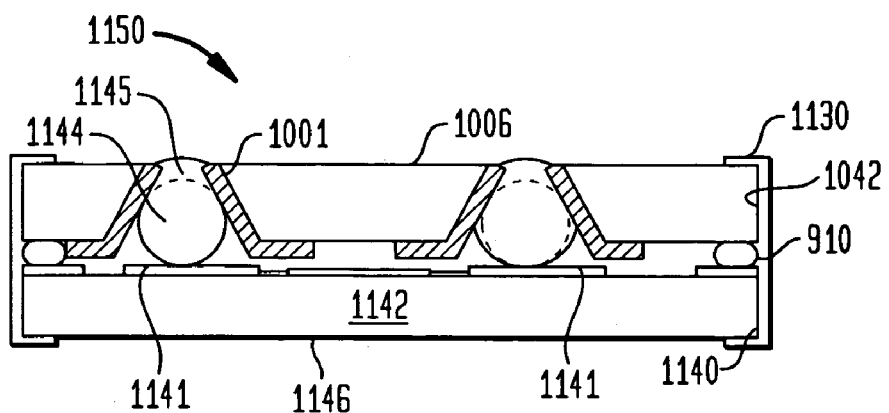

FIG. 24 illustrates a variation of the embodiment described above, in which the metallization of the cap to provide a bonding layer extends as an annular structure 1004 disposed on the bottom surface 1002 of a cap 1000. In one embodiment, an annular structure 1004 is formed by deposition through widened openings of a masking layer (not shown) on the cap through which material is deposited in an additive process to form the metallization, in comparison to those used to form the metallizations shown in FIG. 1. Alternatively, the annular structure 1004 can be formed by decreasing the size of mask patterns disposed between the annular structures, when metallization patterns are formed by a subtractive process following the formation of a metallization layer over the cap. FIG. 25 illustrates a packaged chip 1150 showing a further variation in which the conductive balls 1144 are of a type which remain substantially rigid upon heating to a bonding temperature, or have a core which remains substantially rigid. In such embodiment, the conductive balls 1144 are used to maintain a desirable vertical spacing between the cap 1000 and the chip 1142. A solder bond or diffusion bond can be provided between a metal disposed at an exterior of the conductive ball and the metallization layer 1001 of the cap 1000 and also between such metal and the metallization 1141 of the chip, for example. Joining at this location may also be accomplished using an electrically conductive organic material.

As further shown in FIG. 25, solder or other conductive material 1145 is provided to fill the space between the conductive ball and the top surface 1006 of the cap 1000. In a particular embodiment, an additional seal 1130 can be provided over the peripheral edges 1042, 1140 of the cap and the chip, respectively, by depositing an additional sealing material. The additional seal 1130, which desirably also covers the already provided sealing material 910, may be provided for the purpose of achieving hermeticity, electrical isolation, or other such purpose. The additional seal also preferably extends onto the top surface 1006 of the cap and the rear surface 1146 of the chip.

Figure 26:
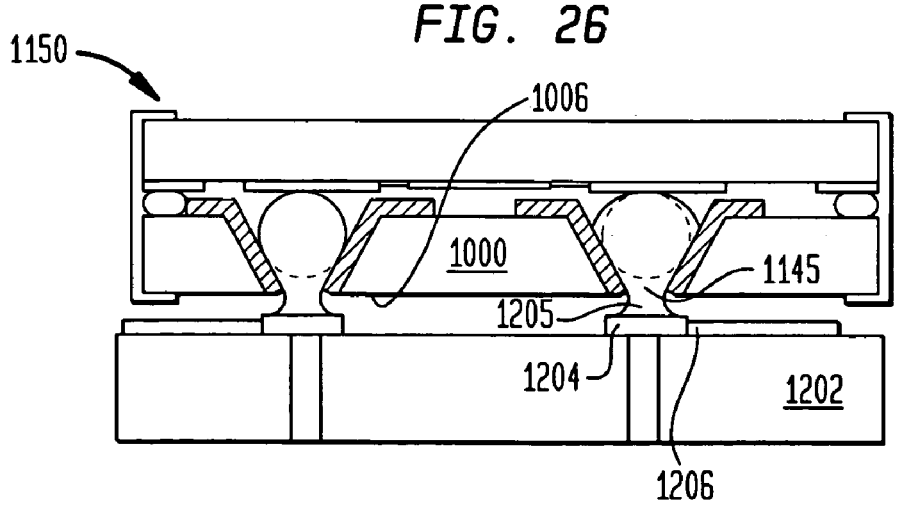

FIG. 26 illustrates a further embodiment in which the packaged chip 1150 shown in FIG. 25 is mounted to a circuit panel 1202 having one or more terminals 1204 and traces 1206 disposed thereon. The mounting shown in FIG. 26 is through a solder bond between the solder or other conductive material 1145 present at the top surface 1006 of the cap 1000 and masses 1205 of solder disposed on the terminals 1204 of the circuit panel 1202.

Figure 27:
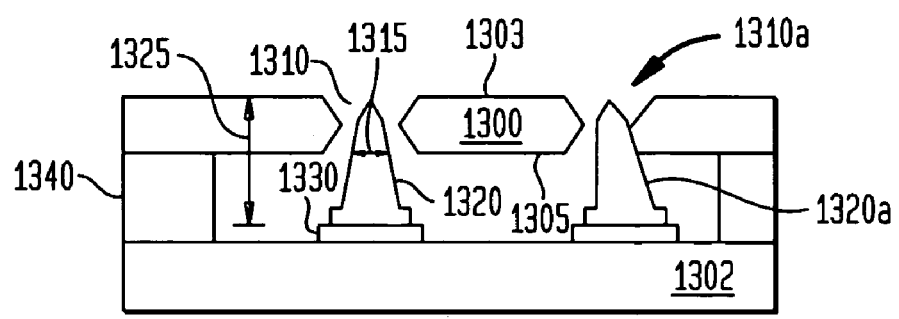
FIGS. 27–32 are sectional views illustrating embodiments of capped chips in-which electrical interconnects are formed which include stud bumps extending from the chip into through holes in the cap.

With reference to FIG. 27, another embodiment of a method of making a capped chip having vertical interconnects is shown in which the through holes 1310 of a cap 1300 are not required to have solderable metallizations prior to the cap 1300 being joined to the chip 1302. FIG. 27 illustrates a case in which the through holes 1310 of the cap 1300 are tapered from both the top surface 1303 and the bottom surface 1305, as described above with respect to FIG. 18. In this embodiment, the chip 1302 has stud bumps 1320 disposed on bond pads 1330. The stud bumps 1320 provide a surface for bonding of solder or other conductive material to form a vertical interconnect extending upwardly from a chip 1302. As described in relation to other embodiments above, a "picture frame" ring-seal 1340 seals the gap between the chip and the cap.

The stud bumps 1320 are desirably tapered, as shown in FIG. 27, as can be provided according to several processes known to those skilled in the art. In this embodiment, the stud bump desirably has a shaft diameter 1315 which is close to the mashed ball diameter obtained during the application of the stud bump, and a length 1325 that exceeds the thickness of a sealing material 1340 that seals the cap 1300 to the chip 1302. For example, the stud bumps can be such as those shown and made according to the process described in U.S. Patent Publication No. US 2003/0159276 A1, published Aug. 28, 2003, the disclosure of which is hereby incorporated herein by reference. Tapered stud bumps are more capable of retaining their upwardly extending shape when the cap 1300 is placed over the chip 1302, such that the stud bumps 1320 are more likely to maintain registration with the through holes 1310, than if the stud bumps had a narrow, much more deformable profile. As such, the stud bumps assist the cap 1300 in becoming aligned to the chip 1302 in a self-locating manner, at least on a side-to-side basis, i.e., in at least the X and Y degrees of freedom. However, as shown in FIG. 27, when a through hole 1310a is not in perfect alignment with a stud bump 1320a, the taper of the through hole 1310a allows the stud bump 1320a to deform somewhat, thus allowing it to at least enter the through hole 1310a. Desirably, stud bumps 1320 protrude through the through hole to extend above the top surface 1303 of the cap.

Figure 28A:
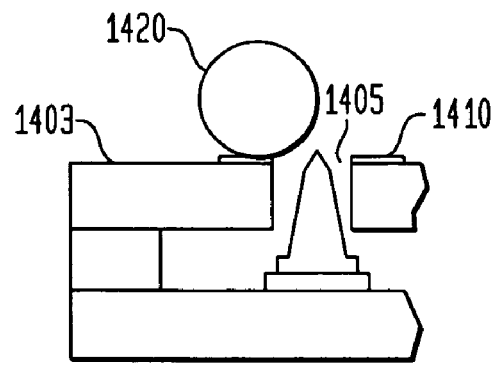
Figure 28B:
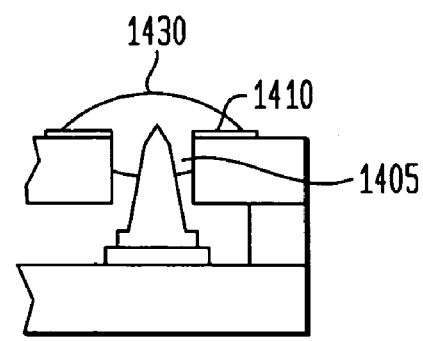

FIG. 28A illustrates a variation of the embodiment shown in FIG. 27, in which the through holes have a straight, vertical profile, rather than being tapered from both sides, as described above with respect to FIG. 27. As shown in FIG. 28A, the top surface 1403 of the cap is optionally provided with a solderable metallization 1410. The solderable metallization is preferably provided as an annular structure surrounding each through hole. FIGS. 28A and 28B illustrate two stages of processing. In an earlier stage of processing, shown in FIG. 28A, a solder ball 1420 is disposed on the metallization 1410, as placed thereon by a prior solder ball stenciling process. A subsequent stage of processing, shown in FIG. 28B, illustrates the reflowed solder ball 1430 as joined to the stud bump 1320 by a subsequent reflowing process. During such reflowing process, the solder ball 1430 is drawn onto the surface of the stud bump 1320 by a solder-wettable metal present at the surface of the stud bump such as gold, tin or platinum. As a result, the solder forms a continuous solid electrically conductive mass connecting the stud bump to the bonding layer 1410 of the cap and sealing the cap at the through hole 1430.

In a variation of the above process, the solder ball 1420 is placed on the metallization 1410 of the cap 1400 and bonded thereto to form a solder bump, prior to the through holes 1405 of the cap being aligned to the stud bumps 1420 provided on a chip 1402.

Figure 29A:
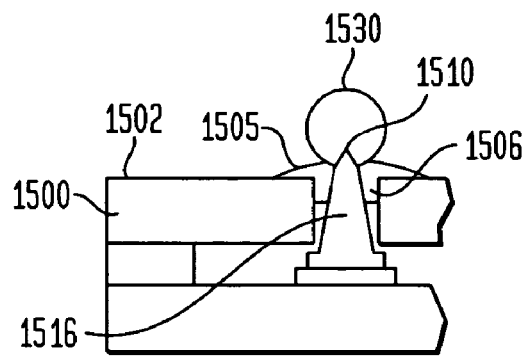
Figure 29B:
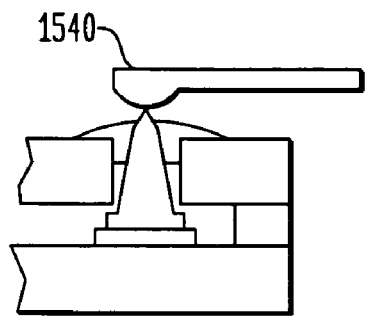

FIG. 29A illustrates a further embodiment; in which external interconnects above the cap 1500 are not soldered to the top surface 1502 of the cap. In this case, a sealing material 1505 such as an organic material which can either be conductive, or nonconductive, e.g. an adhesive material, is applied to the cap 1500 to cover the through holes 1506 at the top surface 1502. After the cap 1500 is placed over the chip 1501 and aligned thereto, the cap 1500 and the chip 1501 are pressed together, causing the peaks 1510 of the stud bumps 1516 to penetrate through the sealing material. In yet another alternative embodiment, the sealing material 1505 can be deposited onto the top surface 1502 of the cap 1500 after the through holes 1506 have been aligned to the stud bumps 1516 and then the sealing material is etched back, leaving the peaks 1510 of the stud bumps substantially free of the sealing material. In still another alternative, the sealing material 1502 may be applied around the circumference of the stud bump 1516. Thereafter, further steps are taken to complete the interconnections. For example, a solder ball 1530 can be bonded to the stud bump 1516 to provide a surface to form a further interconnection, such as to a circuit panel, e.g., such as shown and described above relative to FIGS. 8A through 11B. Alternatively, the stud bump can be contacted by a sliding or deformable mechanical contact 1540, such as shown in FIG. 29B.

Figure 30:
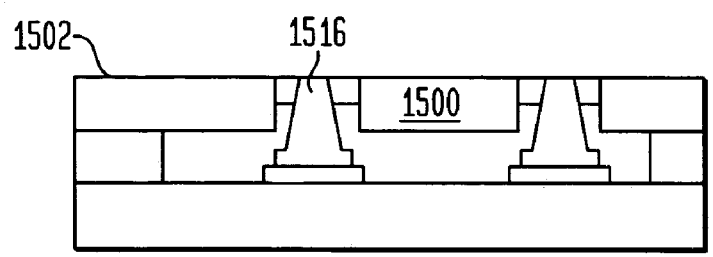

FIG. 30 illustrates yet another variation, in which the stud bumps 1516, which may further include a solder or other joining material applied thereto, are planarized to the top surface 1502 of the cap 1500, after the cap 1500 is aligned and joined thereto. The planarized surfaces of the stud bumps 1516 thus form a land grid array for interconnection of the cap 1500 to further elements such as a circuit panel (not shown).

Figure 31:
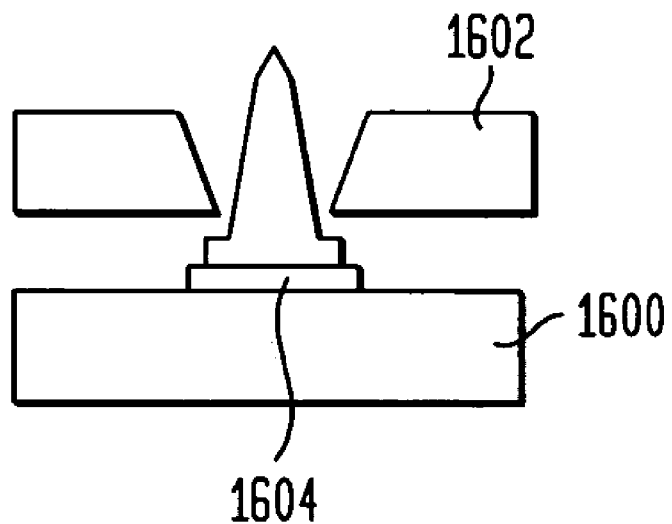
Figure 32:
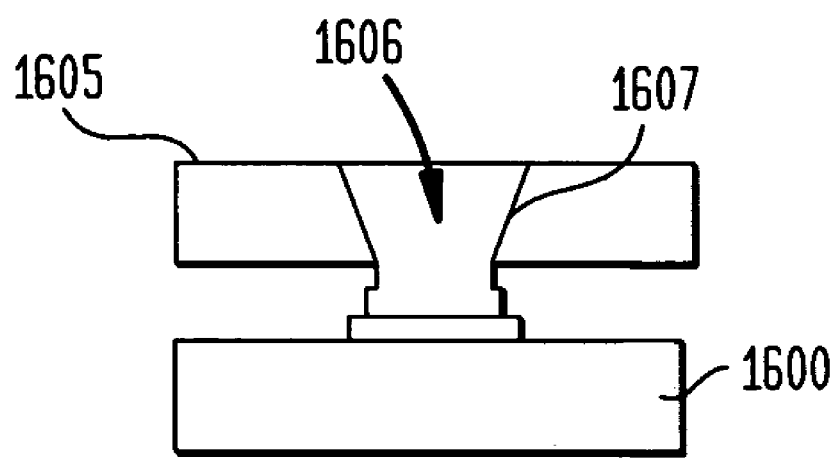

FIGS. 31 and 32 illustrate yet another alternative embodiment in which a cap 1602, is aligned to and placed over a chip 1600 having a stud bump provided on bond pad 1604, and thereafter deformed under pressure until the stud bump engages the sidewall 1607 of the through hole 1606. In such way, the stud bump 'coined' into engagement with the through hole 1606 in a metal forming operation similar to riveting. In this embodiment, the cap 1602 need not have a solder-wettable metallization in the through hole 1606 or on the top surface 1605 of the cap 1602 surrounding the through hole. The stud bump is desirably provided of a highly malleable metal such as gold or alloy thereof, which tends to retain the same shape after being worked in a cold-pressed manner. When such malleable metal is used, the resulting coined stud bump may provide a seal of sufficient integrity to the through hole of the cap. Alternatively, an additional fusible material such as solder or tin can thereafter be deposited and reflowed to seal top surface 1605 of the cap at the through hole, such as when hermeticity is needed. When the stud bump is formed of gold, a fusible material such as solder or tin forms a permanent solid bond.

Figure 33:
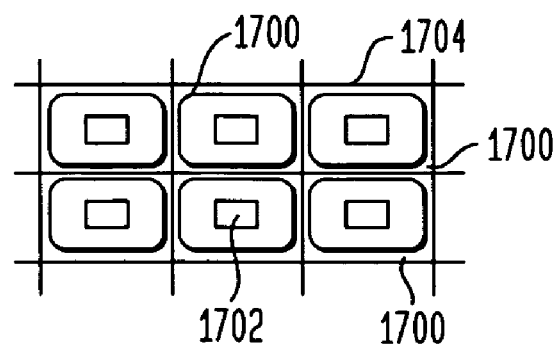
FIGS. 33 and 34A are plan views illustrating a plurality of chips, and a cap, respectively, from which microelectronic units are fabricated, according to an embodiment of the invention.
Figure 34A:
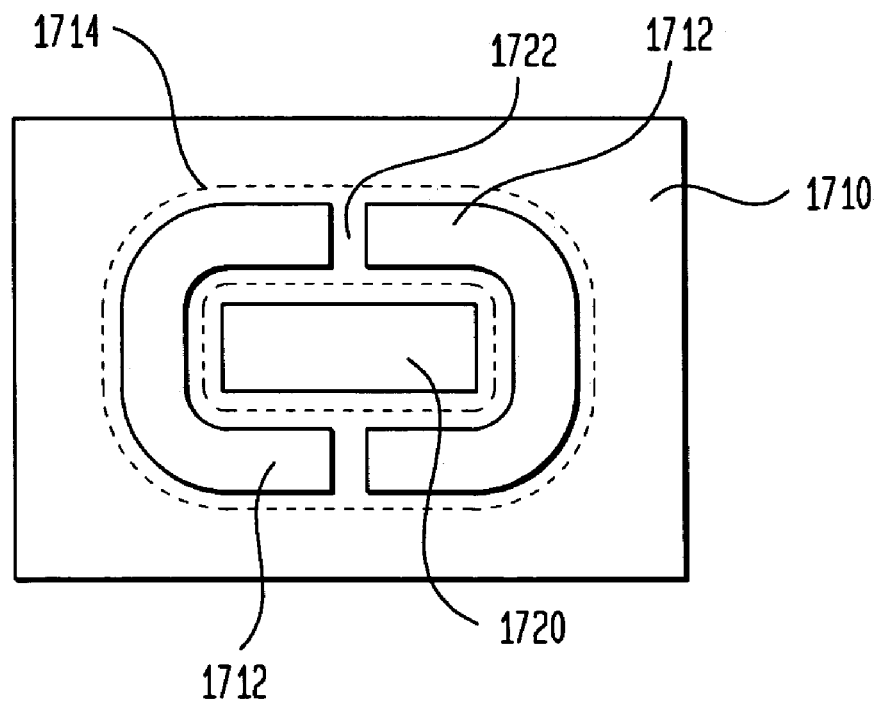
Figure 34B:
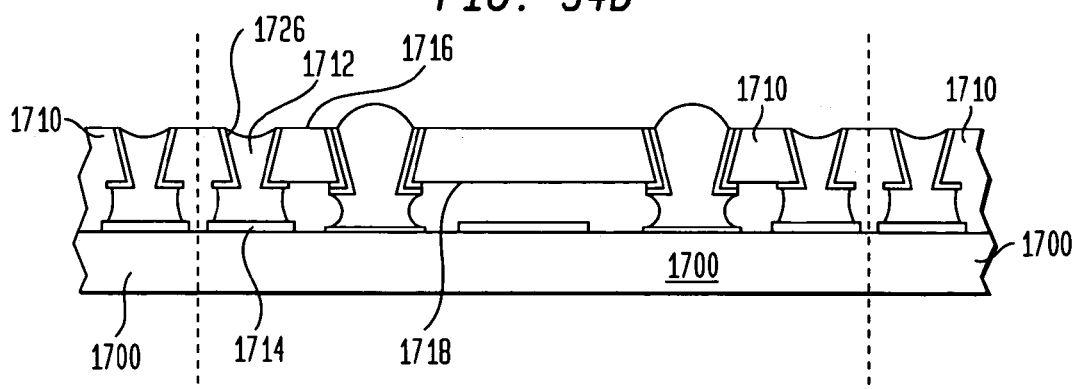
FIG. 34B is a sectional view of microelectronic units fabricated from the chips and the cap illustrated in FIGS. 33–34A.

FIGS. 33–34B illustrate a particular method of simultaneously forming peripheral "picture frame" ring seals between multiple caps of a cap element, e.g., cap wafer, and multiple chips, such as are still attached in wafer form. In this method, the ring seal is formed by aligning the multiple cap element above a wafer containing the chips and providing a flowable sealing material through an opening in a top surf ace of the cap element. The sealing material, is then allowed or caused to flow down onto the surface of the chips below, at which time the sealing material then seals the individual chips to the caps of the cap element. Thereafter, the cap element and the wafer joined thereto are separated into individually capped chips by severing chips along dicing lanes between each chip.

FIG. 33 is a top-down view illustrating a plurality of chips 1700 each having a device, region 1702 provided thereon. Chips having sensitive device regions require caps such as those described above in relation to FIGS. 1–3D. Picture frame ring seals 1704 are provided in order to seal the chips to the caps, preferably when the chips are still in wafer form, as one way of protecting against the possibility of degradation to the devices thereon. A method of simultaneously forming seals surrounding a device region of the chips will now be described with reference to FIGS. 34A–B.

FIG. 34A is a top-down view and FIG. 348 is a sectional view illustrating the structure of a cap 1710, such as may be provided as part of a multiple cap element used in this embodiment. The cap 1710 includes ring-like troughs 1712 which are shown overlying a bonding layer 1714 provided on a front surface of a chip which is disposed below the cap 1710. As shown in FIG. 34B, the troughs 1712 extend all the way through the cap 1710 from the top surface 1716 to the bottom surface 1718 of the cap, and is tapered to become smaller in the direction from the top surface towards the bottom surface. A bonding layer 1726, e.g., a solder-wettable metallization, is provided on sidewalls of the trough 1712 as a surface to which a fusible material such as solder wets and fuses to provide a solid bond.

Referring to FIG. 34A, the troughs 1712 extend to almost completely surround a central portion 1720 of the cap which overlies a device region of the chip, the trough being connected to the central portion 1720 by bridges 1722. In a method similar to that described above for making interconnects with reference to FIGS. 1–3D, a fusible material is provided in the trough and then caused to flow along the sidewalls of the trough down onto the bonding layer 1714 of the chip 1700, as best seen in FIG. 34B.

In an alternative embodiment, a low-melting point glass or other suitable material may be placed and flowed downward through the trough to make the seal, in a manner similar to a fusible conductive material. In yet another alternative embodiment, a fluid organic adhesive may be utilized as the sealing material instead of a fusible conductive material.

Figure 35:
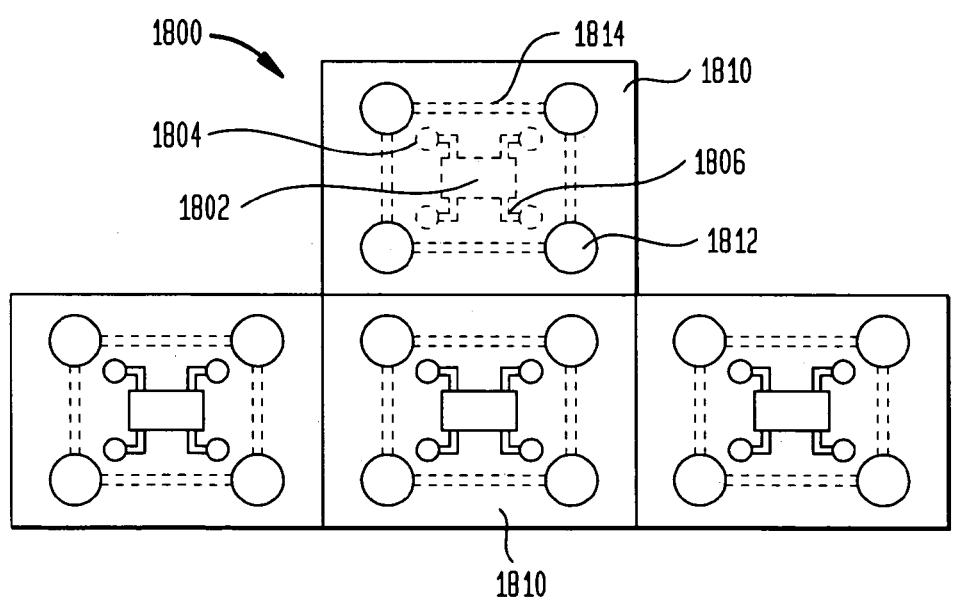
FIG. 35 is a plan view illustrating a plurality of caps of a cap element from which microelectronic units are fabricated, according to one embodiment of the invention.

FIG. 35 illustrates a variation of the above-described embodiment in which a set of discrete through holes 1812 are provided in caps 1810 of a cap element 1800, rather than a trough as described above. As shown therein, the cap 1810 is disposed overlying a chip having a central device region 1802, bond pads 1806 and wiring 1806 connecting the device region 1802 to the bond pads 1806, as shown in dotted outline form. The chip includes a bonding layer 1814 disposed in an annular pattern surrounding the bond pads 1806 and device region 1802 of the chip. In this embodiment, the discrete through holes 1812 facilitate the delivery of a more precisely controlled amount of solder to the bonding layer 1814 of the chip, by way of solder balls which are sized to be placed at or within the through holes, in a manner such as described above in relation to FIG. 3B. To achieve a good ring seal between the chip and the cap, neither too little solder nor too much solder should be provided to the bonding layer. Too little solder can cause the seal between the chip and the cap to have voids and possible gaps which would permit air or other fluids, e.g., water vapor to reach the device region 1802 of the chip. On the other hand, too much solder could cause the solder to spread beyond the boundaries of the bonding layer to cause a short circuit.

Accordingly, in this embodiment, solder balls are placed in the through holes and heated to cause the fusible material to flow laterally along the bonding layer 1814 of the chip and a corresponding bonding layer (not shown) of the cap to form a seal which at least substantially surrounds the bond pads 1804 and the device region 1802 of the chip. By judicious choice of the dimensions of the bonding layer and the size of the solder balls, a precisely metered amount of solder can be distributed to the bonding surfaces. The steps used to form the seal are similar to those described above in relation to FIGS. 1–3D or 6A–B for forming electrical interconnects through holes in a chip. Thus, in one embodiment, the solder balls used to form the ring seal are placed in the through holes 1812 at or near the time that solder balls used to form the interconnects are placed in the through holes overlying the bond pads 1802, and then all of the solder balls are melted together by one heating operation to form the ring seal at the same time as conductive interconnects are formed.

Figure 36A:
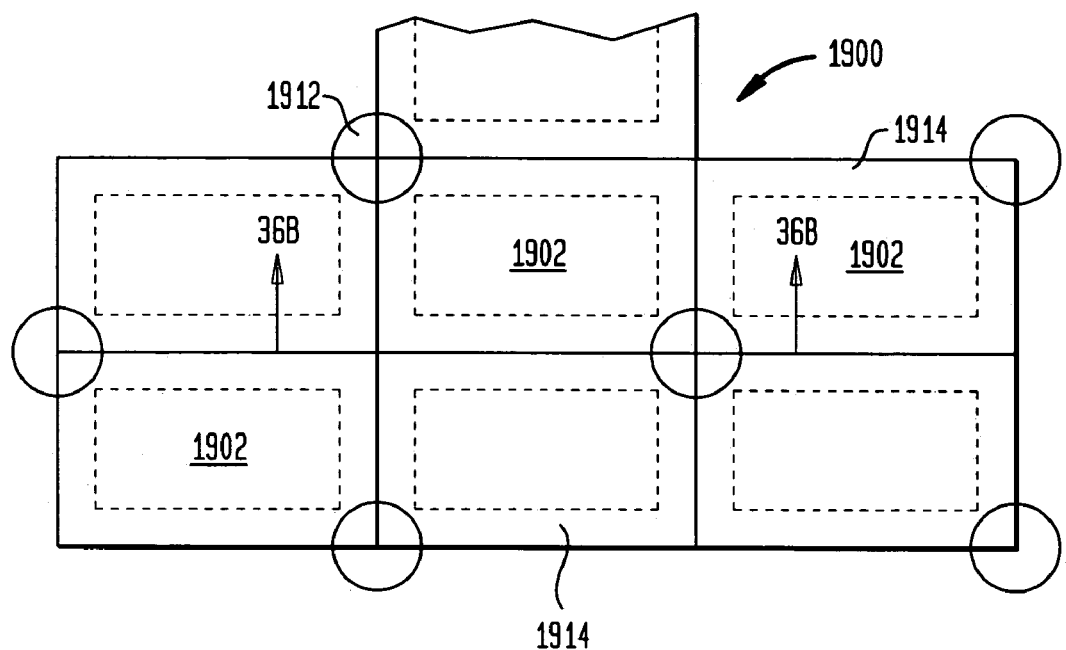
FIGS. 36A–B are a plan view and a sectional view, respectively, illustrating a plurality of caps of a cap element from which microelectronic units are fabricated, according to one embodiment of the invention.
Figure 36B:
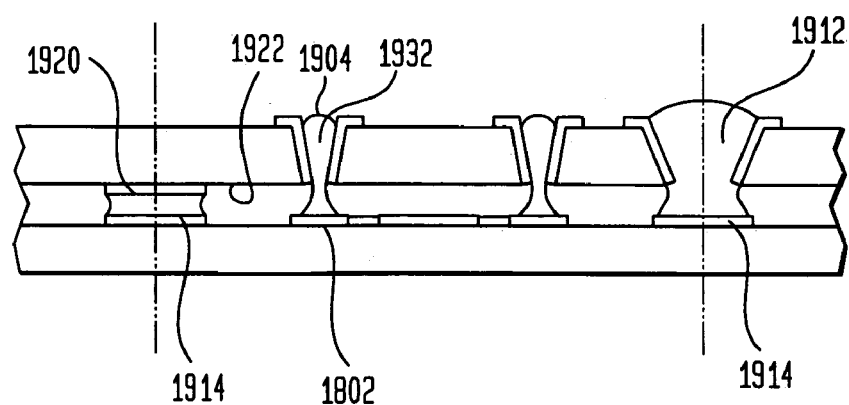

FIGS. 36A–B illustrate yet another alternative in which fewer through holes 1912 are provided in caps 1902 of a multiple cap element 1900. The through holes 1912 are also provided at boundaries between respective chips, thereby greatly decreasing the number of through holes 1912 necessary to form the seal of each chip covered by the cap element. The bonding ring layer 1914 of each chip is provided on the front surface along the periphery of the chip 1902 so as to permit the flow of solder from within a given through hole 1912 onto the bonding layer 1914 to seal the respective chip, thus forming a structure as shown in the sectional view of FIG. 36B. Note, that as illustrated in FIG. 36B, a bonding ring layer 1920 is disposed on the bottom surface 1922 of the cap, as a corresponding wettable metallization onto which the molten solder spreads during the process of reflowing the solder from the solder balls to form the seal. The bond pads 1802 and the conductive interconnects 1924 joined thereto are desirably formed simultaneously with the formation of the ring seal by placing the solder balls in the through holes 1912 at or near the same time that solder balls are placed in through holes 1932 used to form the interconnects. Thereafter, a simultaneous heating step can be used to form the electrical interconnects and the ring seal.

Figure 37:
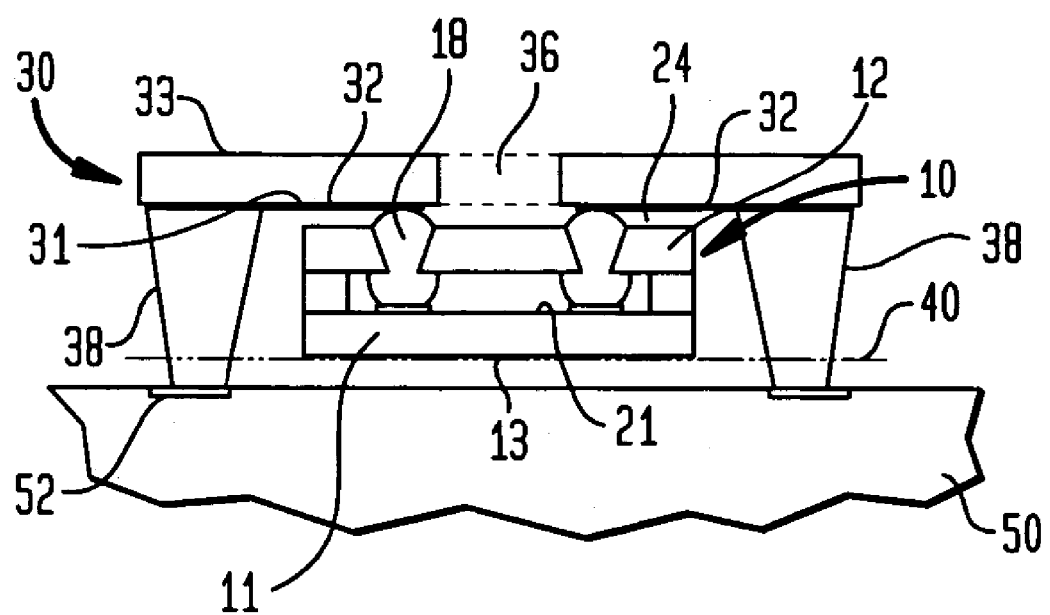
FIG. 37–43 are sectional views illustrating various embodiments of microelectronic units having lidded or capped chips, and assemblies including such units, according to various embodiments of the invention.

With reference to FIG. 37, a packaged microelectronic device according to another embodiment of the invention incorporates a package structure including a dielectric interposer 30 having electrically conductive traces 32 extending along the bottom surface 31 of the dielectric element. In the embodiment depicted in FIG. 37, the dielectric element incorporates an aperture or window 36. Terminals in the form of electrically conductive posts 38 project downwardly from the bottom surface 31 of the dielectric element, and are electrically connected to traces 32. A dielectric element with posts thereon can be formed, for example, by assembling a metallic sheet or plate having projecting posts thereon with a dielectric layer, and etching the sheet or plate to form the traces. The traces may be disposed on either the bottom surface 31 or the top surface 33 of the dielectric element, or within the dielectric element.

A unit 10 as discussed above is assembled with the package structure so that the top surface 24 of the cover faces upwardly toward the bottom surface 31 of the interposer 30. The unit connections 18 are electrically connected to the traces 31, and hence to terminals or posts 38. The active area 21 of the chip is aligned with the window 36, in the interposer. For example, where active area 21, is an optical detector or emitter, the active area can accept or send light through window 36. In other embodiments, as, for example, where the active area is a MEMS structure, window 36 may be omitted. The bottom surface 13 of the chip incorporated in unit 10 faces downwardly, and defines a theoretical horizontal bottom plane 40 at the level of such bottom surface. The height of posts 38 desirably is greater than the thickness or vertical extent of unit 10, so that posts 38 project downwardly beyond bottom plane 40. Thus, the unit connections 18, and hence the electrical connections to chip 11, are effectively routed to a plane below unit 10.

The package can be mounted on a circuit panel 50 having contact pads 52 thereon, as, for example, by soldering the tips of the posts 38 to the contact pads using conventional surface-mounting soldering techniques. In the completed assembly, unit 10 is positioned with its top surface (the top surface 24 of lid 12) facing upwardly away from circuit panel 50. Because the interposer 30 is larger in plan area than the package, this affords the possibility of the metal posts having a diameter and pitch that is suited for attachment of the structure to a PCB (printed circuit board) Preferably, the interposer 30 or the posts 38 have some degree of mechanical compliance, so that the structure is able to accommodate differences in the height of individual pins or nonplanarity of the circuit panel during assembly and/or testing. The mechanical compliance desirably accommodates thermal expansion mismatch between the circuit panel and the unit 10.

Figure 38:
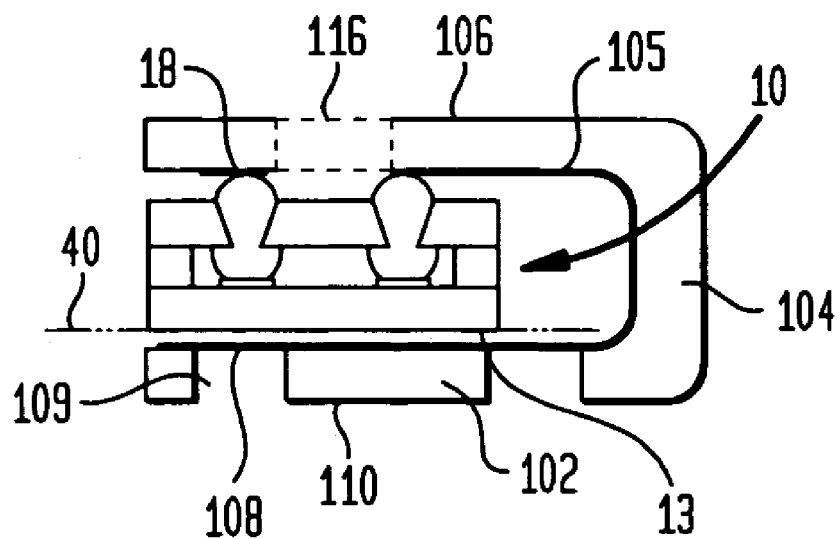

A packaged device according to a further embodiment of the invention (FIG. 38) includes a unit 10 as discussed above, together with a package structure including a dielectric element having a bottom run 102 extending beneath the rear surface 13 of the chip incorporated in the unit and hence extending beneath the bottom plane 40 defined by the unit. The dielectric element further includes a fold region 104 projecting upwardly from the bottom run and a top run 106 extending from the fold region. The dielectric element preferably is a flexible dielectric film having one or more layers of electrically conductive traces 105 extending along the film. The traces extend from the bottom run, along the fold region to the top run. Unit 10 is disposed between the top run 106 and bottom run 102 of the folded dielectric element. Bottom run 102 has terminals 108 connected to traces 105. Terminals 108 are exposed through holes 109 at the bottom surface 110 of the bottom run, which defines the bottom surface of the packaged device. The unit connections 18 of the unit 10 are bonded to traces 105 on the top run 106, and hence are electrically connected to terminals 108. The bond between the unit connections and the traces mechanically secures unit 10 to the top run. Additional elements such as an adhesive between the top surface of the unit and top run 106 may be provided for further securement. Alternatively or additionally, the bottom surface of the unit may be secured to the bottom run. An encapsulant (not shown) may be provided in the space between the runs of the dielectric element, around the unit. Folded package elements for conventional semiconductor chips are described in U.S. Pat. No. 6,225,688 and in commonly assigned U.S. patent application Ser. Nos. 10/077,388, filed Feb. 15, 2002; 10/640,177, filed Aug. 13, 2003; 60/515,313, filed Oct. 29, 2003; and 10/654,375, filed Sep. 3, 2003 the disclosures of which are hereby incorporated by reference herein. Similar structures and techniques can be used in the folded package for a chip and lid unit. Here again, package terminals 108 may have a different layout in plan than the unit connections 18, and the package terminals may have a larger pitch than the unit connections. The packaged device may be secured to a printed circuit panel as, for example, by solder-bonding the terminals 108 to the contact pads of the circuit panel. The terminals 108 may be arranged in a layout which facilitates surface mounting, with adequate terminal size and pitch. A wide range of dimensions and pitches may be used to suit any desired application as, for example, to fit a standard pad layout. Furthermore the package structure desirably provides mechanical compliance such that it is able to safely absorb the differential strain mismatch between the circuit panel and the unit arising from the differential thermal expansion during manufacture and during service. Here again, the unit can be mounted readily with the top surface 24 of the unit facing upwardly away from the circuit panel. A window 116 optionally may be provided in the top run 106 of the dielectric element to permit reception of light or other energy through the top run and through the lid of the unit. As described in the aforementioned incorporated applications, a folded package structure may also define top package terminals (not shown) exposed at the upwardly-facing surface of top run 106. Some or all of the top package terminals are connected to some or all of the traces 105 and, hence, to some or all of the unit connections 18, to some or all of the bottom package terminals 108, or both. The top package terminals can be used for testing or for attaching a further microelectronic element as further discussed below, as for example, to stack several packaged devices. The packages of FIG. 37, discussed above, and of FIGS. 39 and 40 can also be provided with top package terminals.

Figure 39:
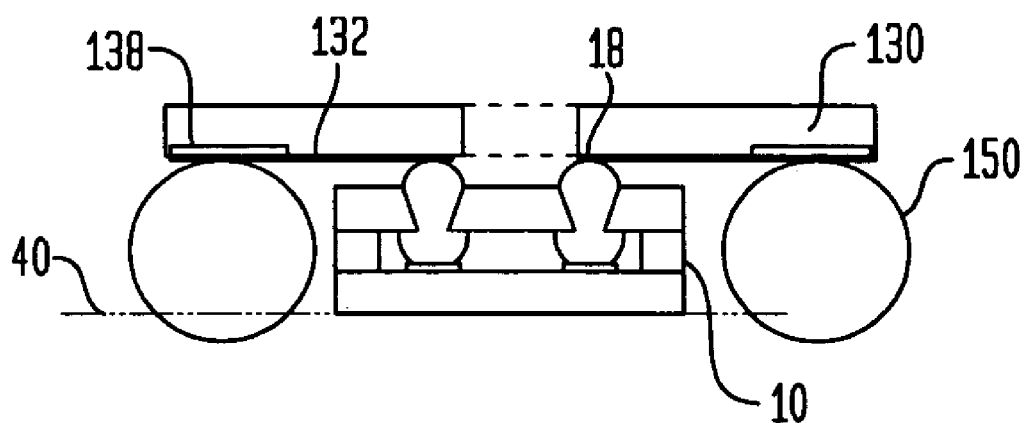

The packaged device of FIG. 39 is generally similar to that discussed above in connection with FIG. 37, except that the package terminals 138 exposed at the bottom surface 132 of the interposer 130 are in the form of flat pads rather than downwardly-projecting posts. Thus, the terminals themselves do not project downwardly beyond the bottom plane 40 of unit 10. In the embodiment of FIG. 39, additional elements in the form of masses 150 of a bonding material such as, for example, conventional solder balls are provided in contact with the terminals. These additional elements or masses 105 project downwardly beyond the bottom plane. The additional elements or masses 150 can be provided as part of the packaged device, or may be added during assembly to a circuit panel as, for example, by providing the masses on the contact pads of the circuit panel prior to mounting the packaged device. The additional elements or masses desirably have a height or vertical extent greater than the thickness of unit 10. The additional elements or masses 150 desirably provide substantial mechanical compliance. Elements other than solder conventional solder spheres may be used. For example, elements commonly referred to as solid-core solder balls, having a core formed from a high-melting metal such as copper covered by a layer of solder may be used. In a further variant, the core of such a ball may be hollow or may include a polymeric or other non-metallic material covered by a thin layer of metal, which in turn may be covered by a solder. In yet another variant, the additional elements or masses 150 may be masses of a polymer-based conductive material as, for example, a metal-filled solder. In yet another variant, the additional elements may be provided as pins (not shown) projecting upwardly from the circuit panel or as contacts on a socket which, in turn, is surface-mounted to the circuit panel.

The interposer 130 may be rigid, in the case of a direct-bonded copper (DBC) ceramic substrate, semi flexible, for example a PCB, or fully flexible, as typified by a dielectric film. The choice of material for the planar interposer will depend on the application. For example, a flexible dielectric film will help absorb thermal expansion mismatch between the PCB and the wafer scale package, while a DBC substrate will be mechanically robust and facilitate the removal of heat from the package. The planar interposer is larger in plan area than the unit 10, and hence trace 132 routes unit connections 18 to a layout which is different from, and larger than, the layout of the unit connections. Traces 132 may be provided on either or both sides of interposer 130, or within the thickness of the interposer. Where the terminals are disposed above plane of the interposer bottom surface 132, the terminals are exposed at the bottom surface of the interposer through holes (not shown) extending partially or fully through the interposer. Here again, the interposer may have an aperture in the region of the unit to facilitate assembly of the structure or provide a passageway for radiation between the unit and the environment.

Figure 40:
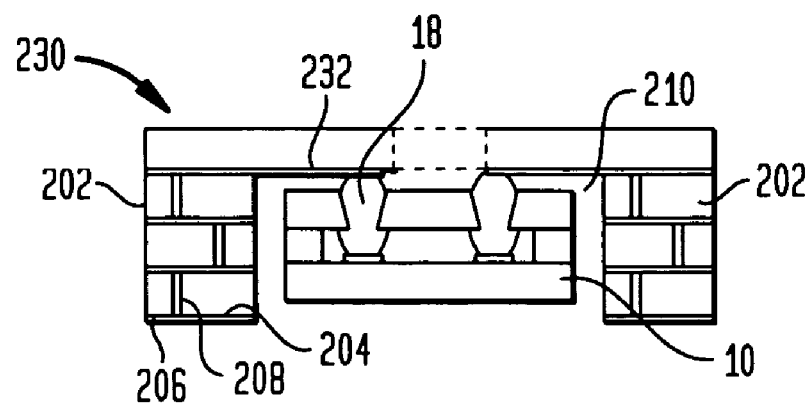

In the embodiment of FIG. 40, the package structure includes a planar interposer 230 similar to those used in the embodiments of FIGS. 37 and 39, discussed above, and also includes a spacer 202 disposed beneath a peripheral region of the interposer, outside of the area occupied by unit 10. The spacer projects downwardly from the interposer, and downwardly beyond the bottom plane 40 defined by unit 10. The bottom surface 204 of the spacer defines a part of the bottom surface of the packaged device. Spacer 202 is formed from a dielectric material, and has package terminals 206 disposed on spacer bottom surface 204. Package terminals 206 are electrically connected by vertical conductors 208 carried on spacer 202 to traces 232 on the interposer. Thus, the package terminals 206 are electrically connected to unit connections 18. For example, spacer 202 may include one or more layers of a dielectric material such as a ceramic or polymeric circuit board having through vias formed therein and partially or completely filled by a conductive material forming the vertical conductors 208. In this arrangement, the package structure including interposer 230 and spacer 202 defines a cavity to accommodate unit 10.

In another arrangement (FIG. 41), the package structure incorporates a lead frame having generally 'S'-shaped leads 302. Leads 302 have portions 304 overlying the top surface 24 of the unit, these portions being connected to unit connections 18. The leads 302 also have downwardly-extending portions 306, and terminal portions 308. The terminal portions have exposed surfaces 310 forming the package terminals. These package terminals are disposed below the bottom plane 40 of unit 10, and are exposed at the bottom surface of the package defined by the bottom surface of the unit. In the embodiment illustrated, the terminal portions project outwardly in horizontal directions. The downwardly-extending portions 306 also may slope outwardly. The package structure optionally may include an overmold or encapsulant 320 surrounding the leads and unit and further securing the leads in place. The overmold or encapsulant 320 should not cover the surfaces 310 of the terminal portions, so that these surfaces remain exposed for mounting. The overmold may terminate at or above the bottom plane 40 of the unit, or may extend below the unit. In a further variant, the downwardly-extending portions 306 of the leads can be attached to the sides of unit 10 as, for example, by a dielectric adhesive, where additional mechanical support is required. In the embodiment depicted in FIG. 41, the lead portions 304 are shown as directly connected to unit connections 18 so that these connections physically attach the lead frame to the unit. However, the lead portions 304 may be connected to the unit connections by intermediate elements as, for example, by wire bonds. The techniques commonly employed to join a lead frame with a chip may be used to join the lead frame with unit 10.

Figure 41:
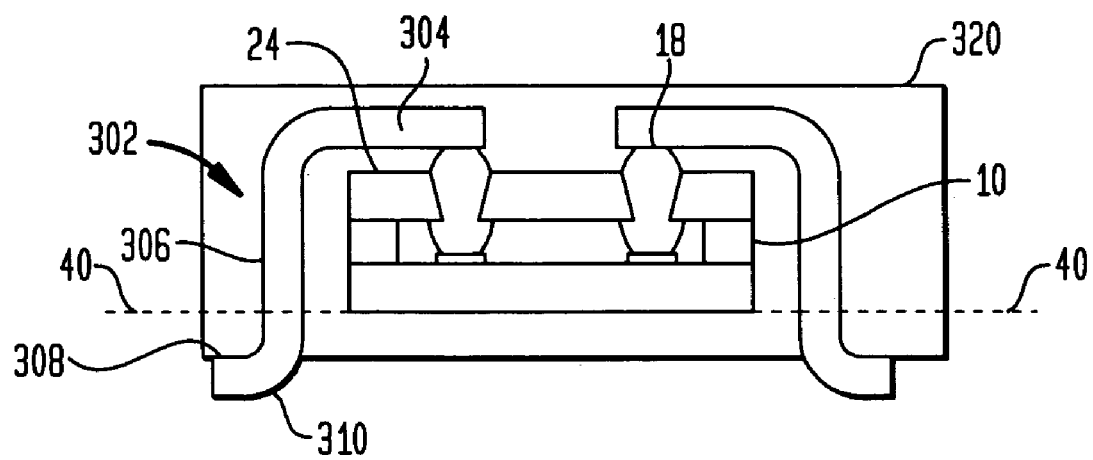

In the embodiment of FIG. 41, the leads route and fan out the electrical connections to or below the bottom plane of the unit, provided the lead frame height exceeds the package thickness. The lead frame can be made to possess a certain degree of compliancy and thereby accommodate thermal expansion mismatch between the wafer scale package and the circuit panel. Also, it is possible to extend the lead frame in plan area to provide fan out and achieve connection to the circuit panel at a coarser pitch than the interconnects to the wafer scale package.

Figure 42:
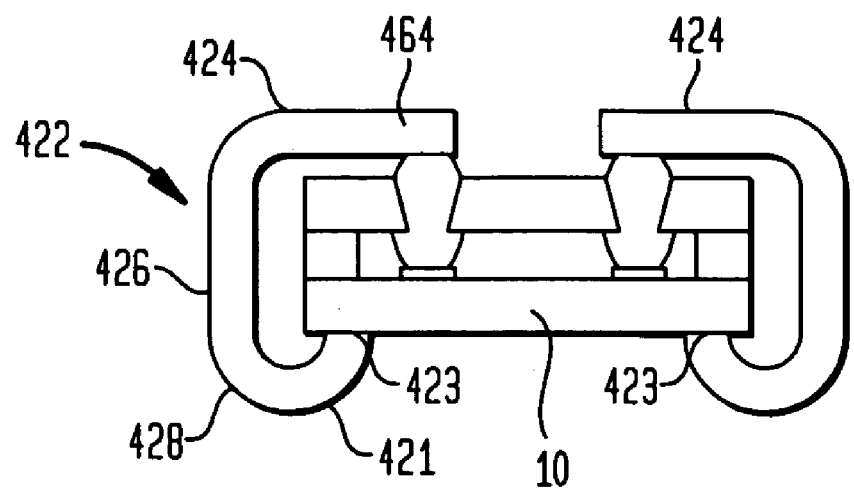

The embodiment depicted in FIG. 42 is generally similar to the embodiment of FIG. 41, except that the terminal portions 428 of the leads constituting lead frame 422 extend inwardly from the downwardly-extending portions 426, so that the terminal portions 428, and hence the exposed portions 421 constituting the package terminals, are disposed within the area occupied by unit 10. Thus, the packaged device as a whole may occupy an area which is approximately the same as, or only slightly larger than, that occupied by unit 10. The leads of lead frame 422 may be resilient, and may be held in place on unit 10 in whole or in part by resilient engagement with the unit. The unit is resiliently engaged between the terminal portions 428 and the top portions 424 of the leads. Alternatively or additionally, the leads can be affixed by solder, glass or an organic adhesive on any or all of the faces of the package that they touch. A similar structure can be made using a flexible tape with traces thereon wrapped around the edges of the unit. A structure with a flexible tape wrapped around edges of a chip is disclosed in certain embodiments of U.S. Pat. No. 5,347,159, the disclosure of which is incorporated by reference herein. For applications where fan-out is required, the metal leads or tape can be provided with extensions than protrude outside of the plan area of the package. In a further variant, an overmold or encapsulant (not shown) may cover the leads and the unit, but desirably does not cover the exposed surfaces 421 of terminal portions 428 of the leads. In a further variant, the terminal portions 428, at the innermost extremities 423, may be free of the overmold or encapsulant, to increase flexibility and hence mechanical compliance of the leads. In yet another variant, whether or not an overmold is employed, upwardly facing surfaces 424 on the upper portions 424 of the leads may remain exposed, so as to provide exposed package terminals at the top of the packaged device as well as at the bottom. As explained further below with reference to FIGS. 50–52, the terminals at the top of the packaged device can be used as test terminals, or for the mounting of additional microelectronic devices. An additional microelectronic device mounted on the top package terminals may be connected to the unit 10, to the circuit panel upon which the bottom package terminals 428 are mounted, or both by leads 422. Packages of this type may be mounted in a stacked arrangement, with the top terminals of one device connected to the bottom package terminals of the next higher device in the stack.

Figure 43:
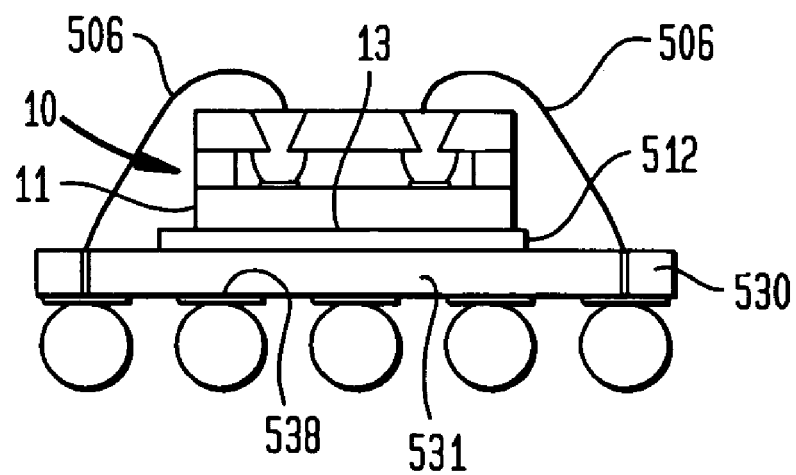

In the structure depicted in FIG. 43, the bottom surface of 13 unit 10 (defined by the rear surface of chip 11) is mechanically attached to a planar interposer 530 by a mounting structure 502 which may include a layer of a die attach material. As discussed above, a wide variety of materials can be used for the interposer. Preferably, the interposer 530 is flexible and the mounting structure 502 has appreciable mechanical compliance. For example, mounting structure 502 may include a layer of a compliant material. In this embodiment, the bottom surface 531 of interposer 530 defines the bottom surface of the packaged device. Terminals 538 are exposed at this bottom surface. Electrical connection between the terminals 538 and the unit connections 18 on the top surface of unit 10 are made by leads 506 which may be wire bonds, metallic ribbons or the like. The connections between the unit connections 18 and terminals 538 may include other conductive elements such as traces (not shown) extending along the interposer and vias extending through the interposer. The connections, such as wire bonds 506, desirably are flexible, so that terminals 538 remain movable with respect to unit 10 as permitted by the compliance of mounting structure 502. Interposer 530 can carry a relatively compact array of terminals 538, at any desired pitch. Some or all of these terminals may be disposed in the region of interposer 530 disposed below unit 10. Arrangements of this type can provide a high density and space efficient interconnect to the circuit panel.

Figure 44:
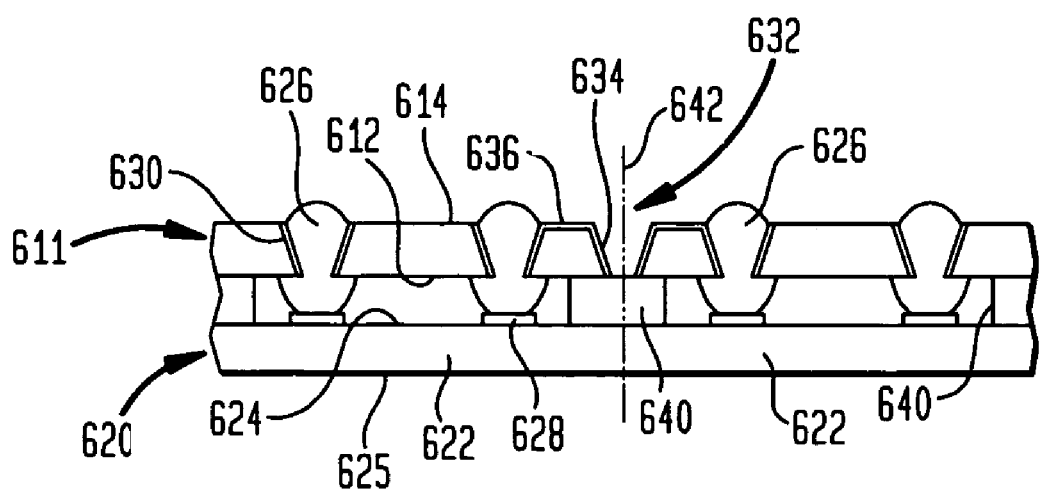
Figure 45:
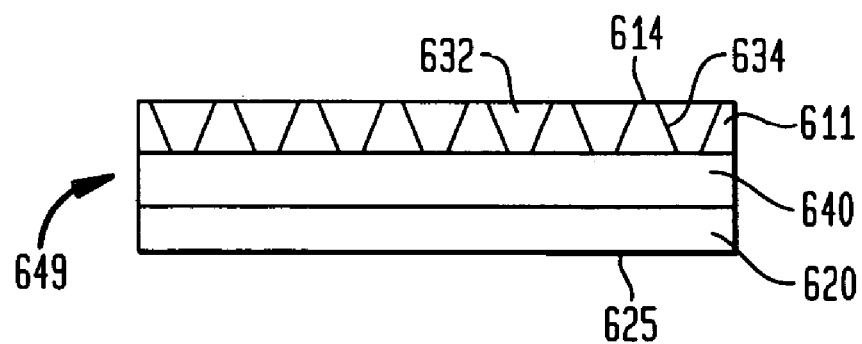

As shown in FIGS. 44 and 45, units can be provided with additional unit connections. In a process according to one embodiment of the invention, a lid element 611 is united with a unitary wafer element 620, such as an entire wafer or a portion of a wafer, incorporating a plurality of semiconductor chips 622, so that a bottom surface 612 of the lid element faces toward a front surface 624 of the wafer element. A top surface 614 of the lid element faces upwardly away from the wafer element. Vertical interconnect structures 626 are formed so that the vertical interconnect structures extend upwardly through lid 611 from contacts 628 on the chip so as to provide unit connections exposed at the top surface 614 of the lid element 611. As described in the aforementioned commonly owned incorporated applications Ser. Nos. 60/506,600; 60/515,615; 60/532,341; and 60/568,041, the lid element may have through vias lined with a thin layer 630 of a metal. The metallic via liners 630 can be provided, for example, by depositing the metal on the lid element and selectively etching the metal prior to assembly with the wafer element. A solder or other electrically conductive bonding material is provided on the lid element, on the wafer element or both and reflowed so that the bonding material wets the metal lining in the vias and wets contacts 628 on the wafer element to form the vertical interconnect structures. In the process of FIG. 44, the lid element is provided with additional rows of vias 632 at locations corresponding to the boundaries between chips in the wafer element. These additional vias may extend partially through the lid or entirely through the lid element as depicted in FIG. 44. Additional vias 632 are lined with metal or other conductive material 634, and electrically conductive redistribution traces 636 are provided on a surface of the lid so that the traces interconnect the liners in some or all of the additional vias 632 with the via liners 630 in some or all of the other vias used to form the vertical interconnect structures. The additional liners 634 and traces 636 may be formed during the same process steps used to make the via liners 630. Thus, the conductive liners 634 in the additional vias will be electrically connected to at least some of the vertical interconnect structures 626 when the vertical interconnect structures are formed. As described in the co-pending applications, a sealant 640 is provided between the lid element and the wafer element at boundaries between adjacent chips, so that the sealant extends around the periphery of each chip.

After assembly of the lid element, wafer element and sealant, and desirably after formation of the vertical interconnect structures, the lid element, wafer element and sealant are severed along lines of severance 642, also referred to as dicing lanes, one of which is visible in FIG. 44. The severing step forms individual units, each including one or more chips and a lid with vertical interconnect elements extending through it. As best seen in the elevational view of FIG. 45, each such unit has vertically-extensive edge surfaces 649 extending between the top surface 614 of the lid and the bottom surface 625 of the chip. The severing process cuts the additional vias 632, leaving partial vias exposed at the edge surfaces of the units. As shown in FIG. 45, an elevational view showing one such edge surface 649, the conductive liners 634 within the severed vias form edge connections exposed at the edge surfaces of the units. At least some of these edge connections are electrically connected to at least some of the vertical interconnect structures 626 and hence to at least some of the contacts 628 on the chip. Edge connections can be provided in this manner on one, some or all of the edge surfaces of the unit. In a variant of this process, the redistribution traces 636 may be formed of the bottom surface 612 of the lid element, rather than on the top surface of such element.

Figure 46:
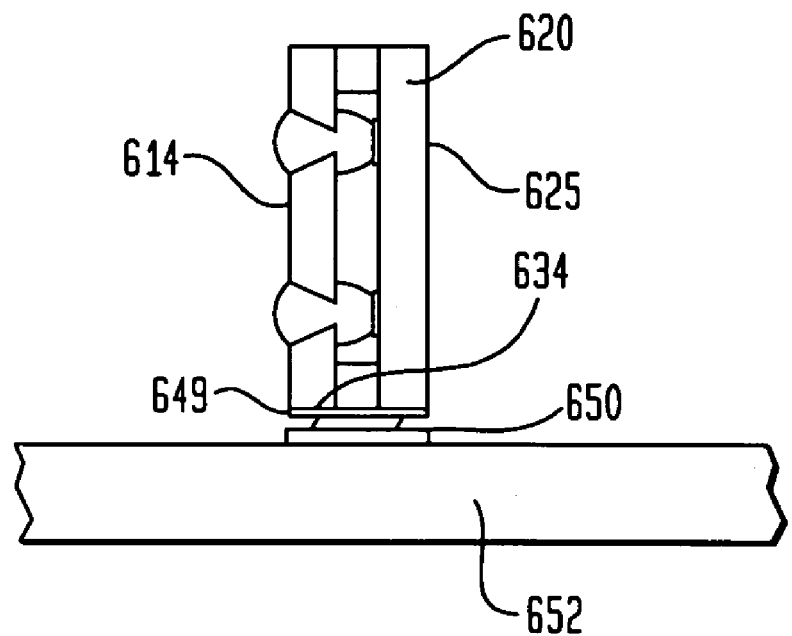
Figure 47:
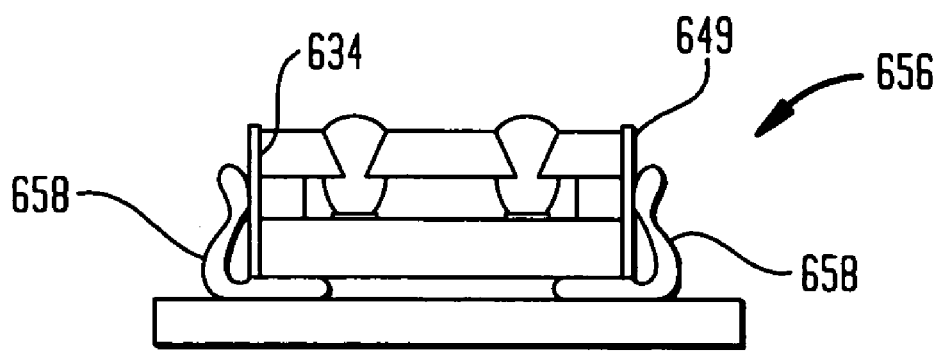

As seen in FIG. 46, the edge connections 634 may be bonded to contact pads 650 of a circuit panel 652 or other substrate so that the unit can be mounted with the top surface 614 and bottom surface 625 of the unit extending transverse to the plane of the substrate, and with an edge surface 649 bearing the edge connections facing downwardly toward the substrate. Alternatively, the unit can be mounted in a socket 656 (FIG. 47) with elements of the socket such as resilient fingers 658 engaging the edge connections 634 on the edge surfaces 649. The unit also can be mounted as discussed above, with connections made through top unit connections made by vertical interconnect structures 626.

Figure 48A:
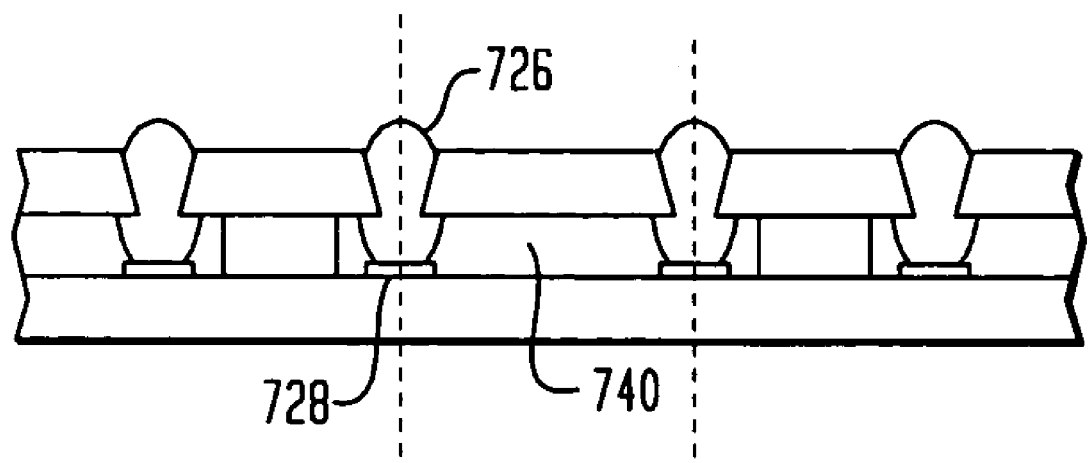
Figure 48B:
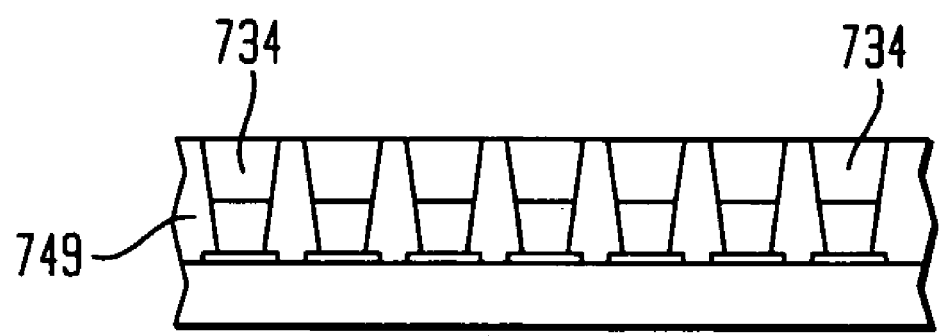

The embodiment of FIGS. 48A–48B is generally similar to the embodiment discussed above with reference to FIGS. 44–47. However, in the embodiment of FIGS. 48 and 49, the sealant 740 extends inwardly from the boundaries of the chips beyond at least some of the vertical interconnect structures 726. The severance operation is conducted so as to cut through these interconnect structures and thus form these vertical interconnect structures 726 into edge contacts 734 at edge surfaces 749. The inwardly-extending sealant 740 remains as a continuous seal between the chip and lid in each unit. The severing operation depicted in FIG. 48A uses two cuts, along two parallel lines of severance, at each boundary between adjacent chips. In a variant, some or all of the contacts 728 and the associated vertical interconnect structures 726 may lie at the boundary between adjacent chips, so that a single cut will form a single row of vertical interconnect structures into edge contacts on two units. Some or all of the vertical interconnect structures in each unit may be converted to edge contacts. A unit formed in this manner can be, mounted as discussed above with reference to FIGS. 46 and 47. In a further variant (not shown) a unit having unit connections on the top surface of the lid can be provided with edge connections by affixing the edge connections onto the unit as, for example, by adhesively bonding a dielectric carrier with conductive connections thereon to the edge surfaces of the unit, or by affixing discrete edge connection elements to the edge surfaces of the unit. The affixed edge connections can be electrically connected to the unit connections on the top surface of the lid by any suitable connection technique. For example, if the dielectric carrier is a flexible dielectric element with traces thereon, the same can be folded over the edge of the lid so that portions of the traces extend along the lid top surface to the unit connections. Alternatively, the edge connections can be connected to the unit connections by wire bonding.

A variation of the capped chip structure described above is illustrated in FIGS. 49A–49B. FIG. 49A is a sectional view of the capped chip structure 730 shown in FIG. 49B through line 49A–49A. In such structure 730, the vertical interconnect structures 726, some of which are disposed along peripheral edges 731 of the chip, are oriented in a first direction, as shown in FIG. 49B. Some others of the interconnect structures are disposed along other peripheral edges 733 of the chip, which are oriented in a second direction which lies at an angle to the first direction. For example, the edges 733 are oriented at a right angle to the edges 731. In a preferred embodiment, some of the interconnect structures 726 are also disposed at corners 732 between the two edges. Providing the interconnect structures along the peripheral edges 731, 733 of the chip, and/or the corners 732 may permit further improvements to reduce the area of the wafer occupied by the chip, because fewer interconnect structures 726 are needed, which consequently occupy less of the chip area. In some cases, the interconnect structures 726 are placed as far apart or farther from the device area 204 of the chip, as they are in the embodiments described above with reference to FIGS. 1–3D, for example. This assists in the manufacturability of the structure and the ability to interconnect the structure 730 in the next higher level assembly. Interconnects that are spaced at intervals farther apart assist in manufacturability of the higher level assembly, because, the tolerances for making such connections of the assembly are not as tight as they tend to be when fabricating the chip. Interconnection of the structure 730 to the higher level assembly, e.g., a circuit panel, is preferably by way of mechanical attachment, e.g., socketing, or electrical connection, such as shown and described above with reference to FIGS. 44–47.

A unit 812 (FIG. 50) according to a further embodiment of the invention incorporates a chip 820 which, like the chips discussed above, has a front face 822 and a rear face 824. Chip 820 has contacts 826 exposed at the front face 822. Here again, the chip has an active element 827 such as a microelectromechanical element, an electroacoustic element such as a SAW element, or an optoelectronic element such as an array of sensing pixels, the active element being disposed at or adjacent to the front face 822. However, in this embodiment, the chip has rear contacts 830 exposed at the rear face of the chip. Some or all of the rear-face contacts 830 are electrically connected to the front-face contacts 826 and to the circuit elements of the chip, including the active element 827. The electrical connections to the rear-face contacts 830 include electrically conductive structures extending partially or completely through the thickness of the chip. These conductive structures should not compromise the physical integrity of the unit, and thus should not provide leakage paths extending between the front and rear surfaces of the chip. These connections typically are formed while the chip is being processed as a part of a wafer. One method of forming conductive structures through the thickness of semiconductor wafers is by ion implantation, or other techniques, to create a highly doped column 844 of semiconductor material in the chip that is sufficiently low resistivity for the application. Alternatively, a hollow via or "pipe" 846 may be carved through the thickness of the semiconductor, so that the pipe extends from the rear face 824 to the contact 826 on the front face. The pipe is sealed at the front surface by the metallic material of, the front-face contact. The walls of the pipe may be made conductive by coating with a metal film 847. In a variant, the pipe can be completely filled with metal (not shown).

Figure 50:
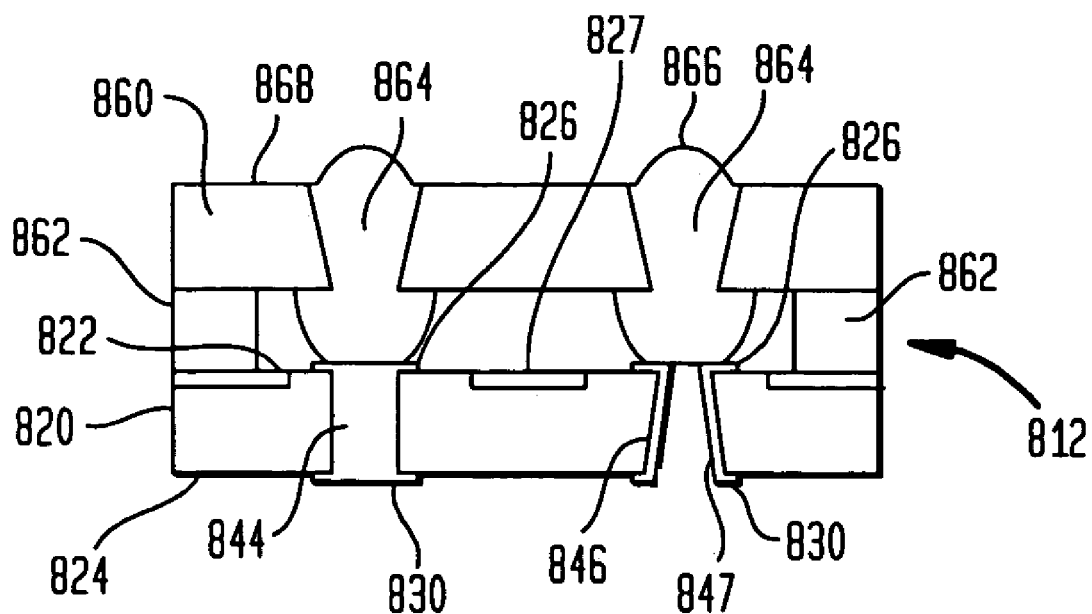
FIGS. 50–56 include sectional and elevational views illustrating various embodiments of microelectronic units having bottom unit connections and methods of making such units.
Figure 51:
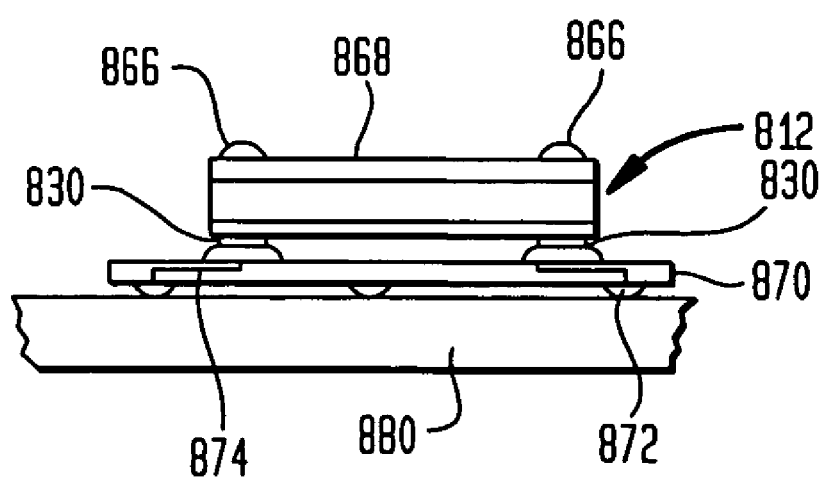

A wafer element incorporating numerous chips 820 as shown in FIG. 50 is assembled with a lid element including lids 860, one of which is shown in FIG. 50, and with a sealant 862 at the boundaries between adjacent chips in the wafer element, and provided with vertical interconnect structures 864 extending from at least some of the top face contacts 826 on the chip through lid 860 to form top unit connections 866 exposed at the top surface 868 of the lid. The units are severed from the wafer element, leaving the individual units in the configuration depicted in FIG. 50. In this configuration, the rear face contacts 830 of the chip form bottom unit connections exposed on the bottom surface 824 of the chip, which constitutes the bottom surface of the unit, whereas top unit connections 866 are exposed at the top surface 868 of the lid, which constitutes the top surface of the unit. At least some of the top unit connections 866 are electrically connected to at least some of the bottom unit connections 830, to the internal circuitry of the chip or both. The unit provides continuous electrical paths between at least some, and preferably all, of the top unit connections 866 and at least some, and preferably all, of the bottom unit connections 830.

The completed unit 812 can be directly mounted on a circuit panel by bonding the bottom unit connections 830 to contact pads on the circuit panel using techniques similar to those used in flip-chip direct chip mounting. This leaves the unit in a face-up orientation, with the lid and unit top surface 868 facing upwardly away from the circuit panel. Alternatively, the unit 802 can be packaged on an intermediate substrate or interposer 870 (FIG. 51) with the top surface 868 facing away from the interposer, and then the interposer be bonded to a circuit panel 880. The interposer has package terminals 872 exposed at its bottom surface, and traces 874 electrically connecting the bottom unit connections 830 to the terminals. The interposer typically provides redistribution so that the terminals 872 are disposed at a larger pitch than the bottom terminals 830. The interposer may also provide mechanical compliance between the unit and the circuit panel 880. The interposer may be generally similar to those used in manufacture of chip-scale packages.

Figure 52:
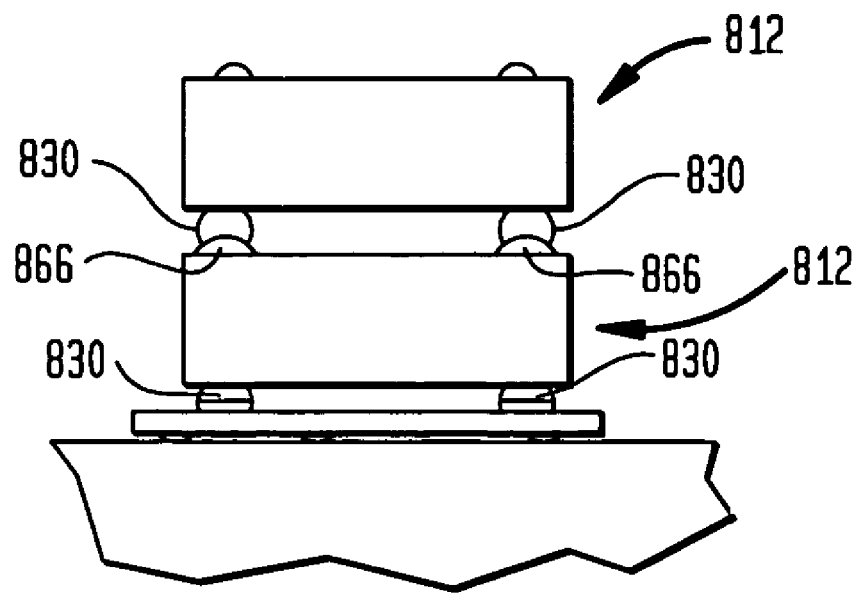

The top unit connections 866 can be used as test connections to allow engagement of a test probe either before or after mounting the unit to a circuit panel. The top unit connections provide probe points advantageously situated on the top surface of the unit. Moreover, the probing process will not damage the bottom unit connections that will be connected to the circuit panel. An additional microelectronic element may be connected to the top unit connections 866 to form part of the circuit in the completed assembly. The additional microelectronic element may be another unit 812 of similar configuration, so that the units are stacked vertically as shown in FIG. 52. Top unit connections 866 of one unit are connected to the bottom unit connections 830 of the next higher unit in the stack. The units thus form common vertical busses disposed inside of the plan area of the units.

Figure 53:
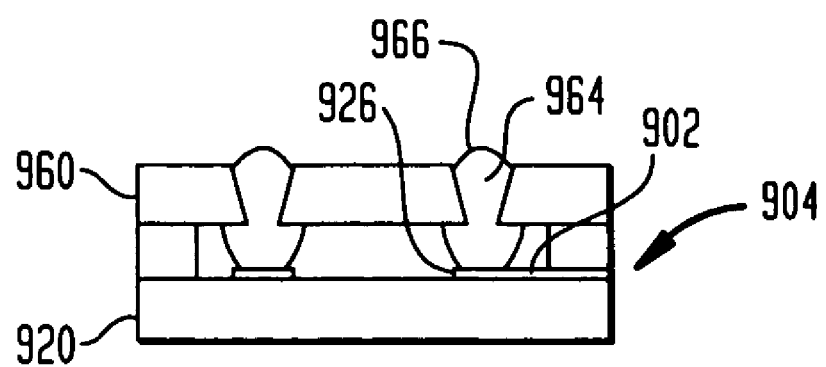
Figure 54:
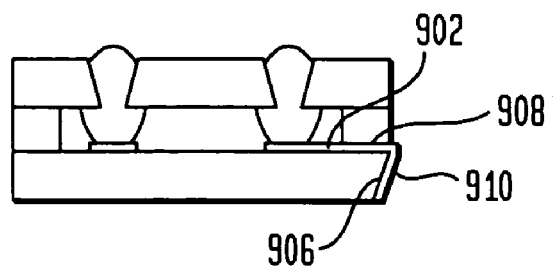
Figure 55:
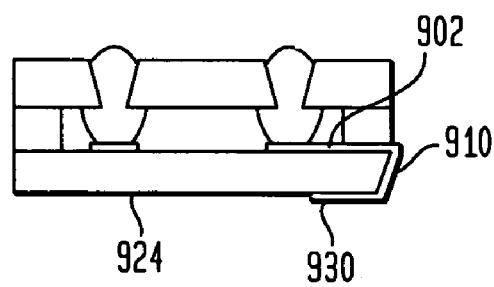

In a further embodiment (FIGS. 53–55), bottom unit connections are provided by forming conductive traces along the edge surfaces of the chip, rather than by providing connections through the chip. As shown in FIG. 53, the wafer element has top surface traces 902 extending from at least some of the top surface contacts 926 on the chips to the boundaries between chips. A lid element 960 and vertical interconnect structures 964 forming top unit connections 966 are provided, as discussed above. Here again, the wafer element and lid element are severed by cutting along the boundaries between chips to form individual units. Thus, after severance, the top surface traces 902 extend to the edge surfaces 904 of the unit. The severing process may be conducted so as to form a trench with sloping edges at the boundaries between units, before severance of the lid element. The sloping trench surfaces provide sloping edge surfaces 906 on the chips, as shown in FIG. 54. A further trace 910 is formed along this sloping edge surface, typically before severance of the lid element. As shown in FIG. 55, further conductive traces are formed along the bottom surface 924 of the chip, so as to provide bottom unit connections 930. Here again, some or all of the bottom unit connections 930 are connected to the circuitry of the chip and to the top unit connections 966. A unit made in this manner can be used as discussed above with reference to FIGS. 50 and 51.

Figure 56:
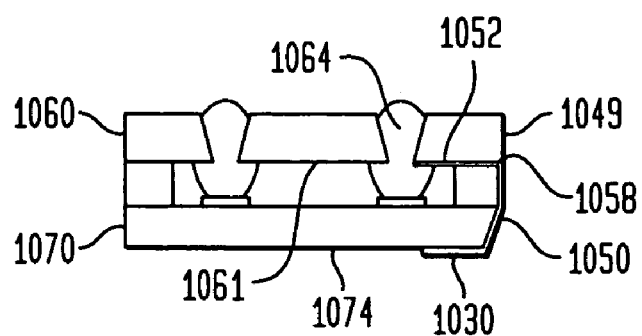

In a further embodiment of the invention (FIG. 56), traces 1002 are provided on the bottom-surface 1061 of the lid element 1060 prior to assembly of the lid element with the wafer element. The traces extend from the vias used to form the vertical interconnect structures 1064 to the areas corresponding to the boundaries between chips. During formation of vertical interconnect structures 1064, the solder used to form the vertical interconnect structures makes contact with the interior ends of traces 1002. After severance of the wafer element 1020 and lid element 1060, the ends 1008 of traces 1002 are exposed at the edge surfaces 1049 of the unit. Traces 1010 extending along the edge surfaces connect traces 1002 with bottom unit contacts 1030 provided on the bottom surface 1024 of the chip. This arrangement avoids the need for special processing of the wafer element to form traces 902 as discussed above with reference to FIGS. 53–55.

Numerous variations and combinations of the features discussed above can be used. For example, units having bottom unit connections in addition to top unit connections can be used with package structures connected to the top unit connections as discussed above, for example, those discussed with reference to FIGS. 37 and 39. In such an arrangement, both the terminals of the package structure and the bottom unit connections are exposed at the bottom of the packaged device for connection to a circuit panel. In a further variant, units can be provided with both edge unit connections as discussed with reference to FIGS. 44–49 and bottom unit connections as discussed above with reference to FIGS. 50–56.

Figure 58:
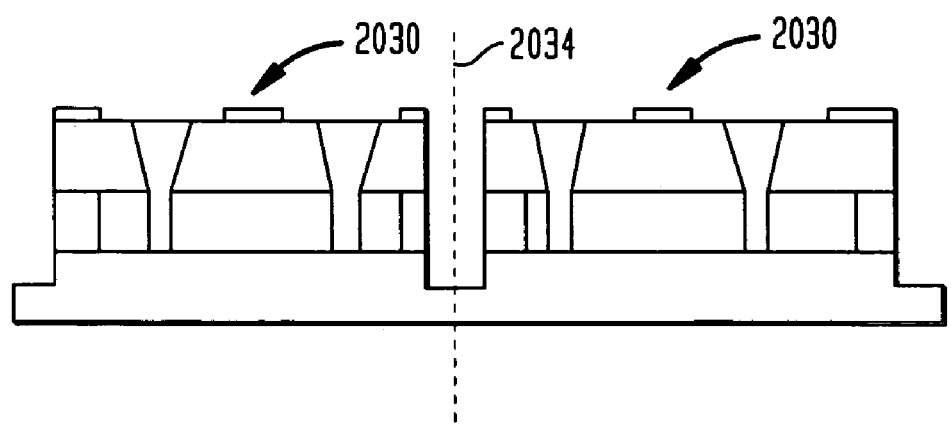
Figure 59:
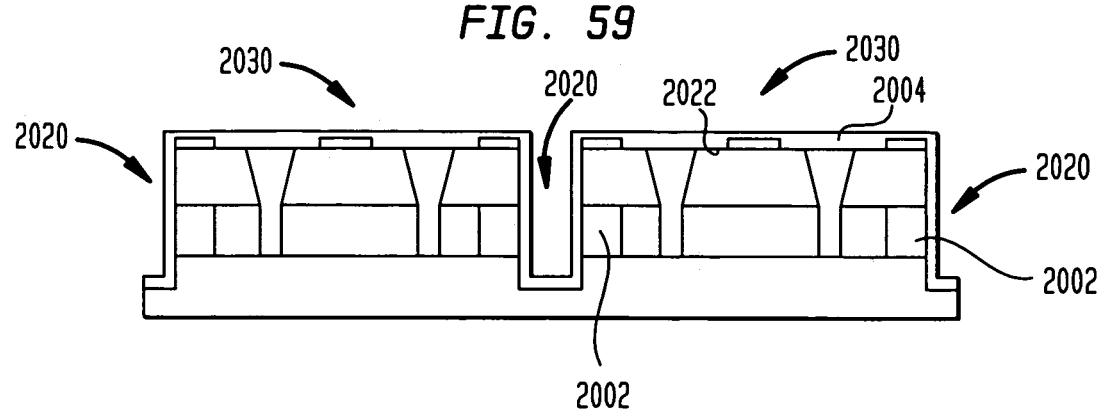
Figure 60:
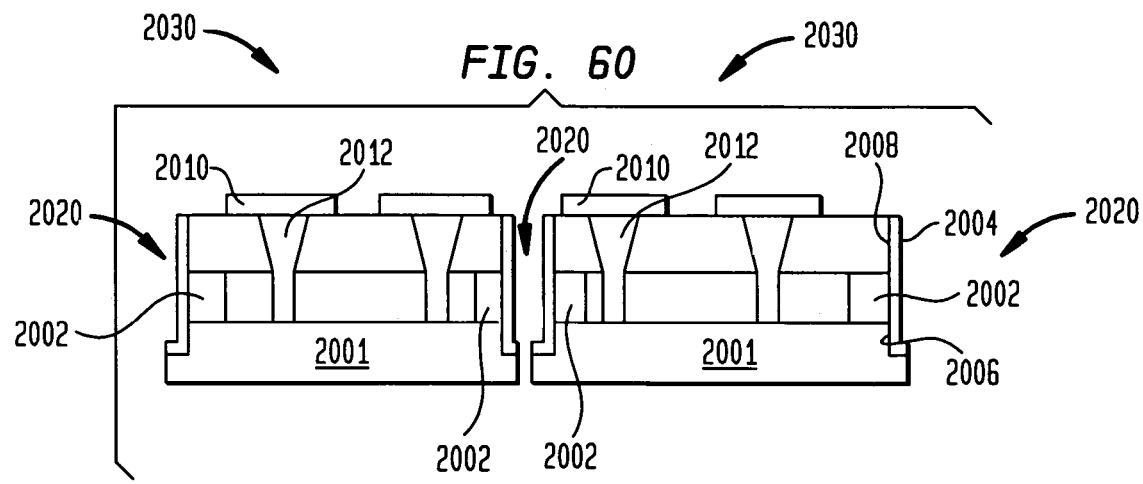

FIGS. 57–60 illustrate an embodiment of the invention in which an additional seal is formed to seal peripheral edges of units, i.e., capped or lidded chips, that are produced by one or the various embodiments of wafer-scale processes such as described above with reference to FIGS. 1–6B, FIGS. 18–28B, and FIGS. 30–32. FIG. 60 illustrates the structure of two such units 2030 that are provided according to this embodiment of the invention.

Among many alternatives discussed in the foregoing, an organic material is a preferred material for use in forming a "picture frame" seal 2002 to enclose the active region of a chip, due to the ability of at least some such materials to be applied and form bonds at an ambient temperature to only slightly elevated temperatures. Use of such materials helps to avoid the above-described CTE mismatch problems, particularly when the chip-containing wafer and the lid-containing wafer are of different materials. The use of such organic sealing material is particularly advantageous in conjunction with the low-temperature processes described above for forming interconnects, such as those in which stud bumps are mounted to the chips which remain in wafer form, and a lid or cap-containing wafer is then aligned and sealed with a conductive or nonconductive organic material to form interconnects (e.g., as shown and described above relative to FIGS. 29A and 30). Certain types of chips, particularly those containing SAW devices, are especially sensitive to strain. SAW devices typically operate to provide a narrow bandpass filter function in which the center frequency of the passband is subject to change due to a strain in the device. The low modulus of elasticity of organic materials helps the organic material to mitigate the effects of differential strain which occurs between the chip-containing wafer and the lid wafer due to CTE mismatch.

However, despite the foregoing benefits, an organic material may not provide a sufficiently hermetic seal for some devices. A tighter seal is generally achieved through inorganic materials such as a metal or glass rather than organic materials, but is subject to the above-described difficulties.

Hence, in the embodiment illustrated in FIG. 60, an additional layer 2004 is deposited and patterned to overlie peripheral edges 2020 of the unit, as an impermeable medium to seal edges 2006 of the chip 2001, the edges 2008 of the lid, as well as the organic seal material 2002. As also shown in FIG. 60, the same layer 2004, when provided of a conductive material, is also desirably patterned to form metal contacts 2010 connected to respective ones of the conductive interconnects 2012 on each chip 2001.

Figure 57:
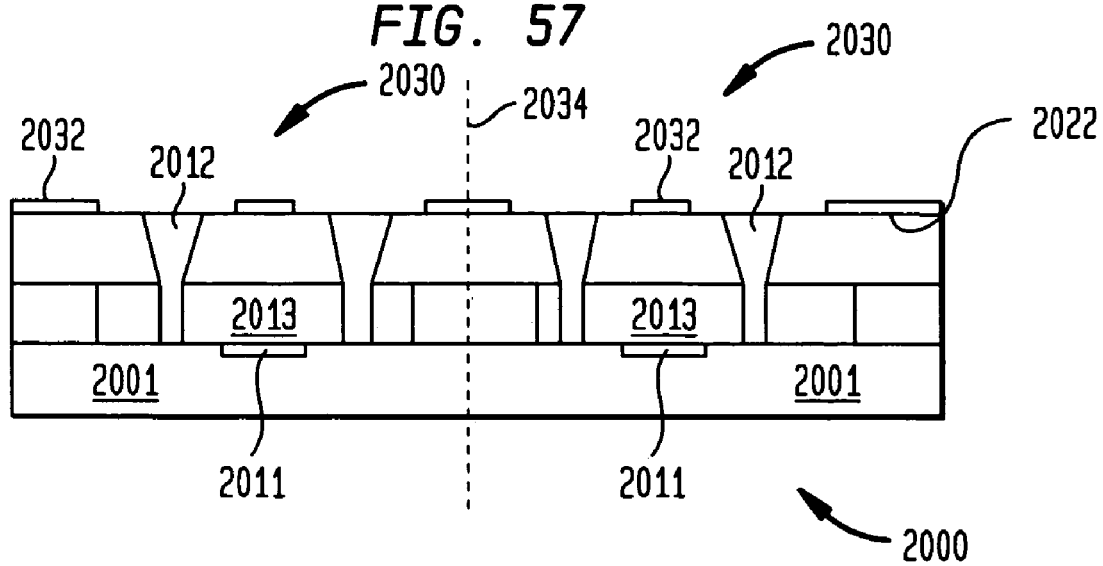
FIGS. 57–60 are sectional views illustrating stages in fabrication of microelectronic units in which an impermeable medium is used to seal the units.

FIGS. 57–59 show stages in an illustrative method of fabricating the units 2030 shown in FIG. 60. As shown in FIG. 57, a pair of units 2030 are shown, each remaining attached at boundary 2034 as portions of a wafer. For ease of reference, only two such units are shown. However, a substantial number of such units can be simultaneously processed in wafer form according to the method described herein. Each chip includes a device 2011, e.g., illustratively, a SAW or MEMs device, a void 2013 disposed above the device and conductive interconnects 2012 extending upwardly from the chips 2001.

A photosensitive resist film is patterned by photolithography to form resist patterns 2032 on the surface 2022 of the lid portion of the units. Illustratively, the resist film is a lift-off film, in that any material coating applied onto the resist film will also be removed when the resist film is subsequently removed. The resist patterns 2032 are formed as islands surrounding each of the pre-existing interconnects 2012, so as to maintain the interconnects isolated from each other upon the subsequent removal of the resist patterns with metal coating applied thereto.

Thereafter, as shown in FIG. 58, the individual units 2030 are partially severed along boundary 2034, which preferably coincides with the dicing lane of the chips, to produce the structure shown. In a further step illustrated in FIG. 59, one or more metals is deposited to produce the structure shown in which both the peripheral edges 2020 and the top surfaces 2022 of the units are covered by metal. The metal is preferably chosen for its qualities in functioning as a barrier to contaminants including moisture, and its ability to conduct electricity. Metals which do not corrode easily are preferred for this purpose. The metal layer 2004 should preferably be selected so as to form a coating which adheres strongly to the surfaces of the unit, as well as adhering to the sealing material 2002 and to provide good conductivity in both a direction across the major surface of the layer and the direction through its thickness. For these reasons, the metal layer 2004 is preferably formed of a stack of deposited metals, such as are used in the semiconductor and MEMs fabrication industries. Common examples of metals which may be used to form such stacks include combinations of titanium, platinum and gold, as well as combinations of chromium, copper and gold, combinations of zinc, nickel and palladium, as well as various permutations and combinations of the above-listed metals. Nickel can be included in the metal layer stack to increase the ability of the patterned metal to provide magnetic screening. The thickness of each patterned metal layer of the stack is illustratively on the order of about 0.1 μm when the metal layer is applied by vapor phase deposition and up to about 1 μm when the metal layer is applied by aqueous processing. A conductive non-metal, for example, a conductive nitride such as titanium nitride or other nitride of a metal, can be utilized as a portion or all of a coating in place of a metal, provided that the material provides a requisite barrier function to moisture or contamination and has sufficient conductivity.

Thereafter, referring again to FIG. 60, steps are performed to remove the resist patterns 2032 together with the unwanted portions of the metal layer, to produce the structure shown as described above. The units 2030 are also severed at this time into individual units along dicing lanes at the boundary 2034 (FIG. 58).

Figure 61:
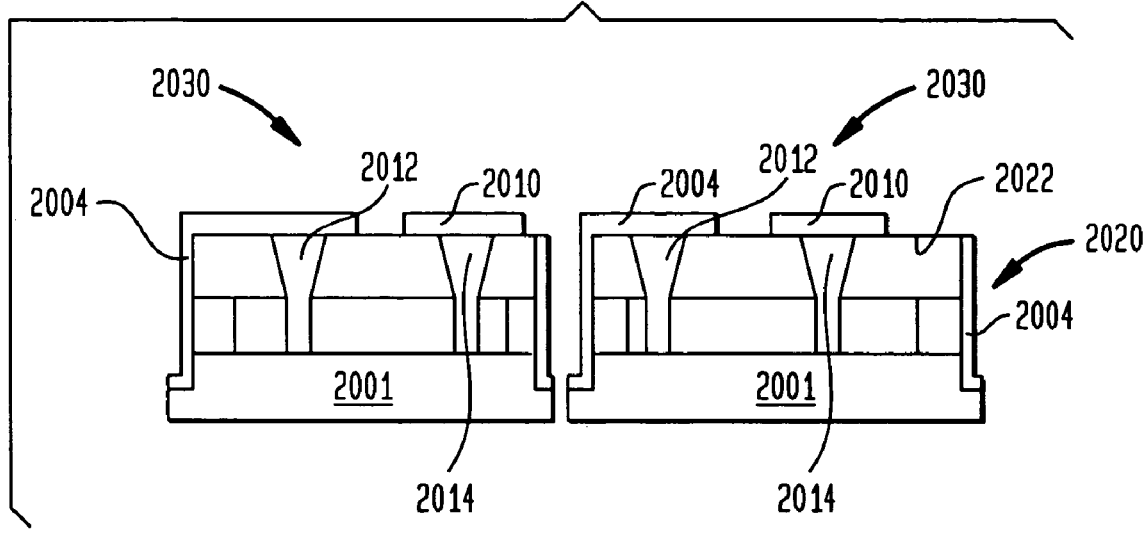
FIG. 61 is a sectional view illustrating an alternative embodiment of that shown in FIG. 60, in which the impermeable medium is conductive and is patterned to form conductive traces.

In addition to the foregoing described embodiment shown in FIG. 60, the above-described process can be modified to provide several alternative structures. FIG. 61 illustrates one such alternative structure. As shown therein, an electrical connection can be established between respective ones of the interconnects 2012 and a peripheral metal sealing layer 2004, to maintain the sealing layer and one interconnect of the chip at the same potential, such as to provide a ground contact. Other ones 2014 of the interconnects can connect to contacts 2010 patterned from the metal layer as described above. In such embodiment, the peripheral metal sealing layer 2004 preferably extends over most of the exterior peripheral 2020 and top surfaces 2022 of the unit 2030. In such case, the sealing layer 2004 can be used to provide an electromagnetic shielding function for the unit 2030.

With continued reference to FIG. 61, in a variation of the above embodiment, the metal layer 2004 is patterned to provide conductive traces which extend laterally over the top surface 2022 of the lid. Such conductive trace can be used for redistribution of contacts, e.g., in a manner similar to that described above with reference to FIGS. 4A–B and 7B, to convert, for example, between the pitch and lateral dimensions of the interconnects 2012 of the unit and those of an industry standard land grid array.

In a particular embodiment, the patterned metal layer 2004 can be used for additional functions, such as the provision of conductive elements on the surface 2022 of the unit for use as resistive, inductive or capacitive devices, e.g., for the purpose of providing impedance matching between the device of the chip 2001 and an external network to which the unit is attached in later assembly steps. To form certain ones of such conductive elements, prior to the final step of severing the chips, a dielectric layer can be deposited and patterned to overlie the patterned metal layer 2004, followed by the deposition and patterning of one or more additional patterned metal layers, as described above with reference to FIGS. 57–59.

As these and other variations and combinations of the features discussed above can be utilized without departing from the present invention as defined by the claims, the foregoing description of the preferred embodiments should be taken by way of illustration rather than by way of limitation of the invention as defined by the claims.

The invention claimed is:

1. A capped chip, comprising:
    a chip having a front surface and a plurality of bond pads exposed at said front surface;
    a cap member having a bottom surface facing said front surface of said chip and having a top surface opposite said front surface, said bottom surface spaced from said front surface to define a void between said chip and said cap member, said cap member further having a plurality of through holes extending from said bottom surface to said top surface; and
    a plurality of metallic interconnects extending from said bond pads at least partially through said through holes, said metallic interconnects including stud bumps joined to said bond pads, said metallic interconnects contacting and engaging at least one of (i) said top surface of said cap member surrounding said through holes and (ii) inner surfaces of said through holes.

2. A capped chip as claimed in claim 1, wherein said through holes do not have solderable metallizations.

3. A capped chip as claimed in claim 1, wherein said metallic interconnects include a seal medium having a different composition from said stud bumps, said seal medium sealing said stud bumps to said cap member.

4. A capped chip as claimed in claim 3, wherein said seal medium includes a conductive organic material.

5. An assembly including a capped chip as claimed in claim 1, and further comprising an interconnection element, said interconnection element including pressure contacts pressed against said stud bumps to electrically interconnect said interconnection element to said capped chip.

6. A capped chip as claimed in claim 1, wherein said metallic interconnects are coplanar with said top surface.

7. A capped chip as claimed in claim 6, wherein sidewalls of said through holes are oriented at an angle of about 90 degrees to said top surface.

8. An assembly including a capped chip as claimed in claim 1, further comprising a circuit panel having a plurality of terminals, wherein said metallic interconnects are joined to said terminals of said circuit panel.

9. A capped chip as claimed in claim 1, wherein said stud bumps consist essentially of at least one metal selected from the group consisting of gold and copper.

10. A capped chip as claimed in claim 1, further comprising wettable metal layers overlying inner walls of said through holes, said metallic interconnects including a fusible metallic material which wets said wettable metal layers and said stud bumps.

* * * * *